United States Patent
Kanaya

(10) Patent No.: US 11,895,925 B2
(45) Date of Patent: Feb. 6, 2024

(54) MAGNETIC MEMORY DEVICE HAVING AN ELECTRODE CONTINUOUSLY PROVIDED ON A WIRING

(71) Applicant: Kioxia Corporation, Tokyo (JP)

(72) Inventor: Hiroyuki Kanaya, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 279 days.

(21) Appl. No.: 17/196,772

(22) Filed: Mar. 9, 2021

(65) Prior Publication Data

US 2022/0085281 A1    Mar. 17, 2022

(30) Foreign Application Priority Data

Sep. 17, 2020  (JP) .................. 2020-156164

(51) Int. Cl.
   *H10N 50/10*    (2023.01)
   *H01L 23/00*    (2006.01)
   *H10B 61/00*    (2023.01)
   *H10N 50/80*    (2023.01)
   *H10N 50/85*    (2023.01)

(52) U.S. Cl.
   CPC ............. *H10N 50/10* (2023.02); *H01L 24/46* (2013.01); *H10B 61/00* (2023.02); *H10N 50/80* (2023.02); *H10N 50/85* (2023.02)

(58) Field of Classification Search
   CPC ....... H01L 43/08; H01L 24/46; H01L 27/222; H01L 43/02; H01L 43/10; H01L 43/12; H01L 27/224; H01L 24/42; H01L 24/47; H01L 24/49; H01L 2224/08145; G11C 5/06; G11C 5/063; G11C 5/14; H10N 50/10; H10N 50/80; H10N 50/85; H10N 50/01; H10B 61/00; H10B 61/10
   USPC .......................................................... 257/421
   See application file for complete search history.

(56) References Cited

U.S. PATENT DOCUMENTS

| 9,761,635 | B1 | 9/2017 | Jo |
| 10,043,852 | B2 | 8/2018 | Kanaya |
| 10,304,509 | B2 | 5/2019 | Yoshikawa et al. |
| 10,403,681 | B2 | 9/2019 | Ahn et al. |
| 2014/0131649 | A1 | 5/2014 | Daibou et al. |

(Continued)

FOREIGN PATENT DOCUMENTS

| JP | 2013069865 A | 4/2013 |
| JP | 2017516293 A | 6/2017 |

(Continued)

*Primary Examiner* — William C Trapanese
(74) *Attorney, Agent, or Firm* — Holtz, Holtz & Volek PC

(57) ABSTRACT

According to one embodiment, a magnetic memory device includes first and second wirings, and memory cells between the first and second wirings, and each including a switching element and a magnetoresistance effect element, the switching element being connected to a first wiring, and the magnetoresistance effect element being connected to a second wiring. The switching element includes a bottom electrode, a top electrode, and a switching material layer between the bottom and top electrodes, and the bottom electrode included in each of the memory cells adjacent to each other in a first direction is continuously provided on the first wiring connecting the memory cells adjacent to each other in the first direction.

14 Claims, 53 Drawing Sheets

(56) References Cited

U.S. PATENT DOCUMENTS

| | | | |
|---|---|---|---|
| 2015/0069630 A1* | 3/2015 | Sciarrillo | H01L 21/7684 |
| | | | 257/776 |
| 2015/0263069 A1 | 9/2015 | Jo | |
| 2018/0261270 A1* | 9/2018 | Yoshikawa | H10N 50/80 |
| 2018/0277595 A1* | 9/2018 | Miyakawa | G11C 11/1673 |
| 2019/0214430 A1 | 7/2019 | Kim et al. | |
| 2019/0288183 A1 | 9/2019 | Kanaya | |
| 2020/0006422 A1* | 1/2020 | Yang | H10B 61/10 |
| 2020/0083285 A1 | 3/2020 | Nagase et al. | |
| 2020/0083288 A1 | 3/2020 | Kanaya | |
| 2020/0303627 A1* | 9/2020 | Kumura | H10N 50/01 |

FOREIGN PATENT DOCUMENTS

| | | | |
|---|---|---|---|
| JP | 2018152432 A | 9/2018 | |
| JP | 2018164085 A | 10/2018 | |
| JP | 2020043131 A | 3/2020 | |

* cited by examiner

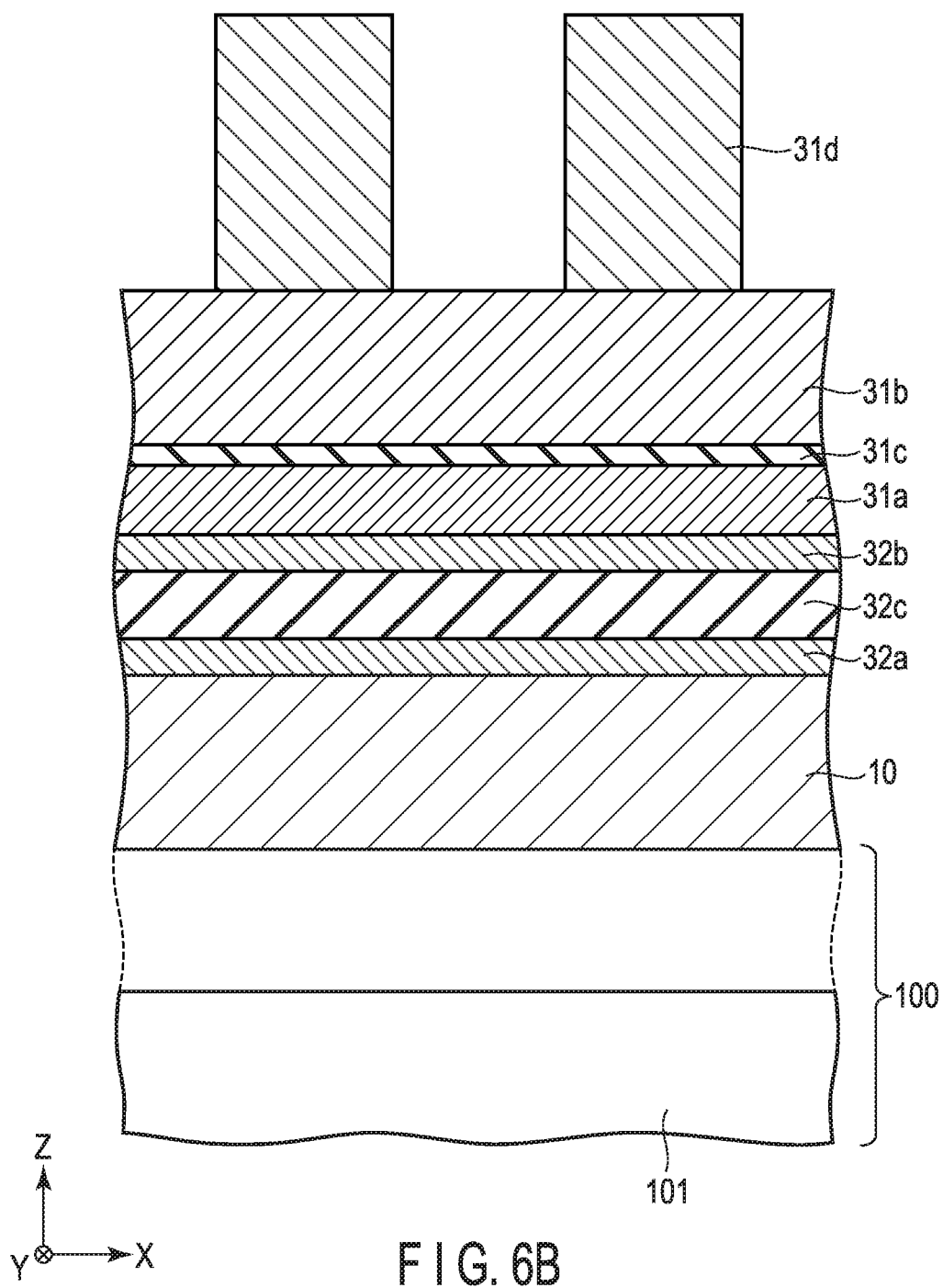
F I G. 6B

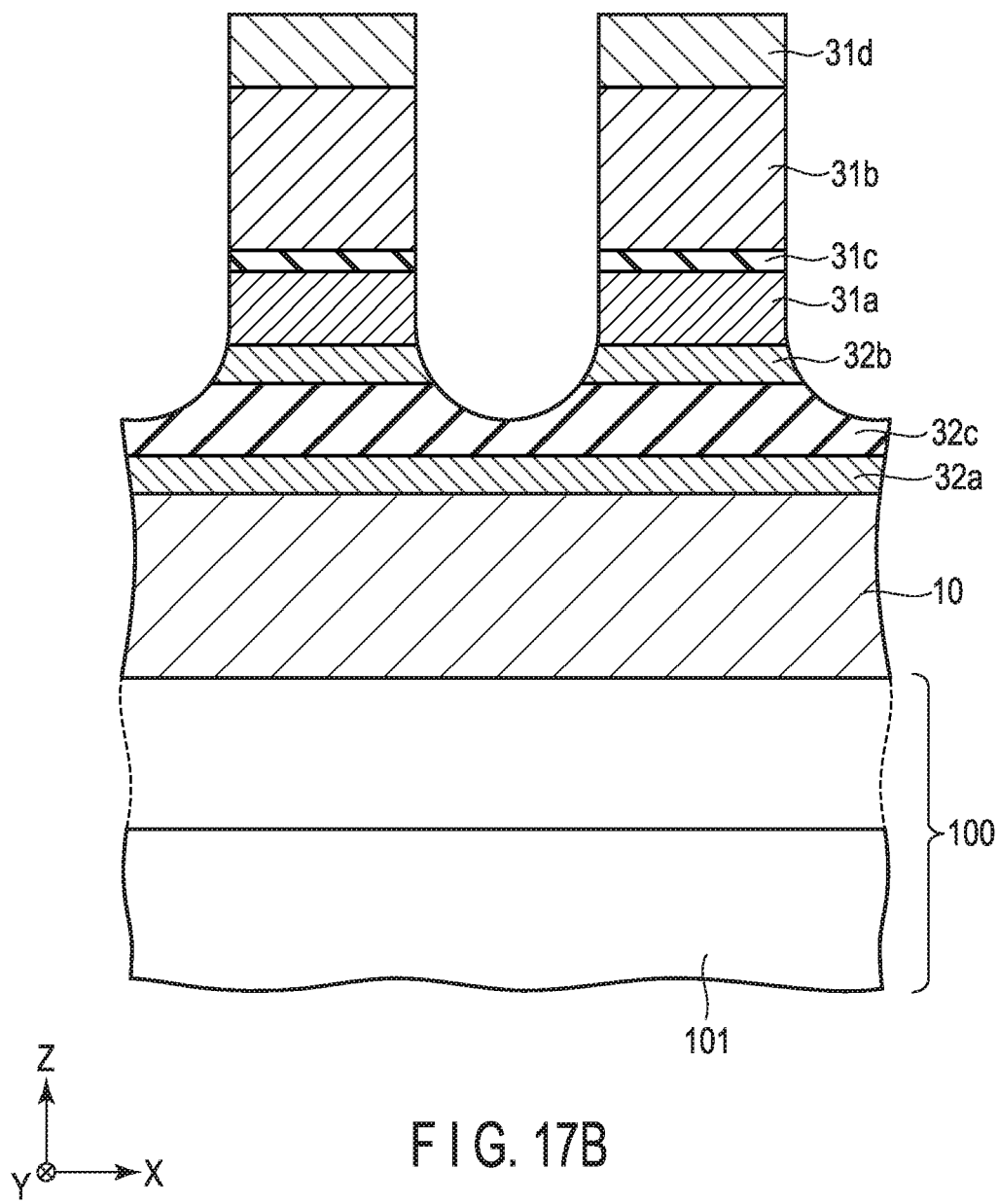
F I G. 17B

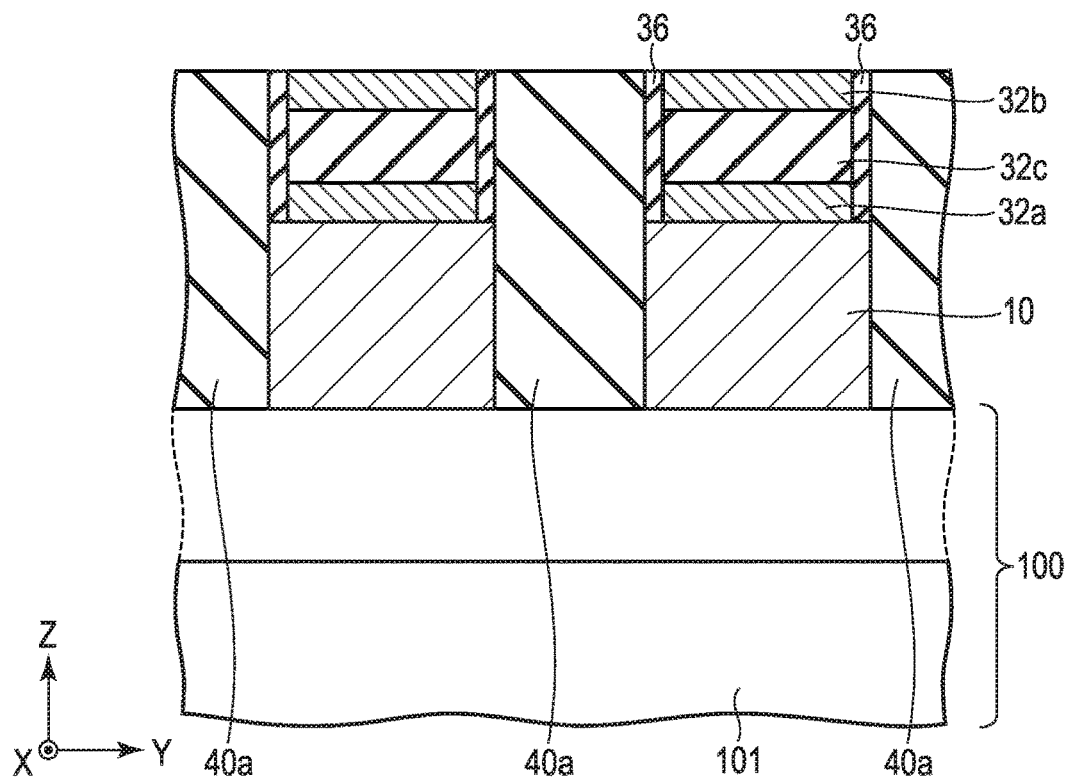
F I G. 25A
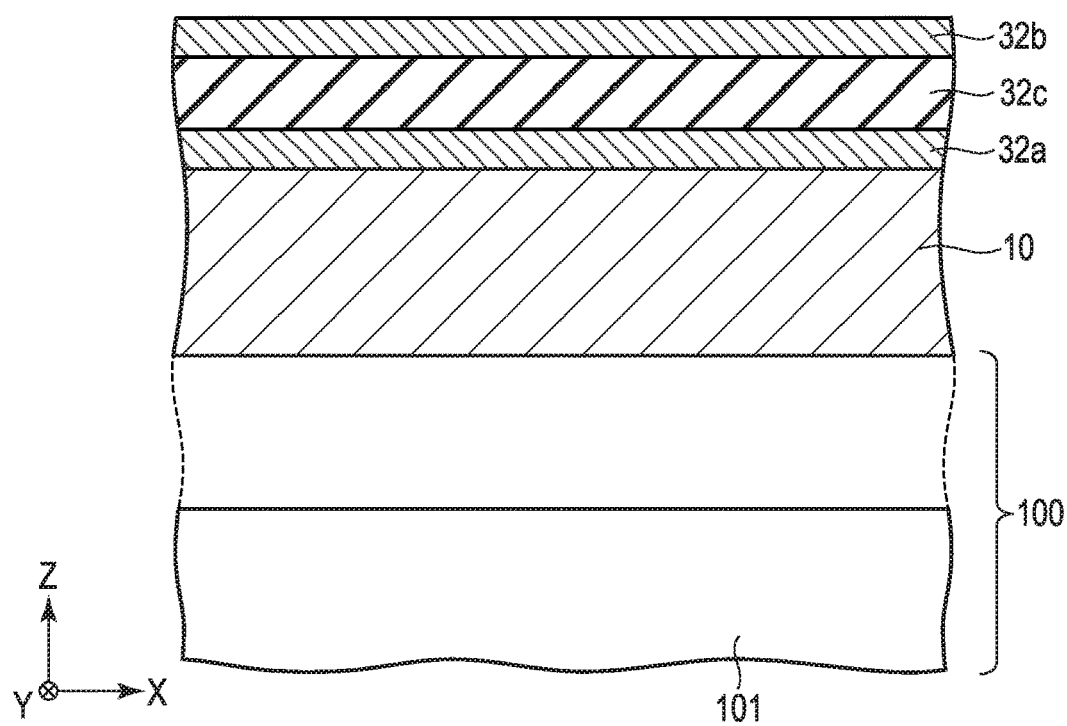
F I G. 25B

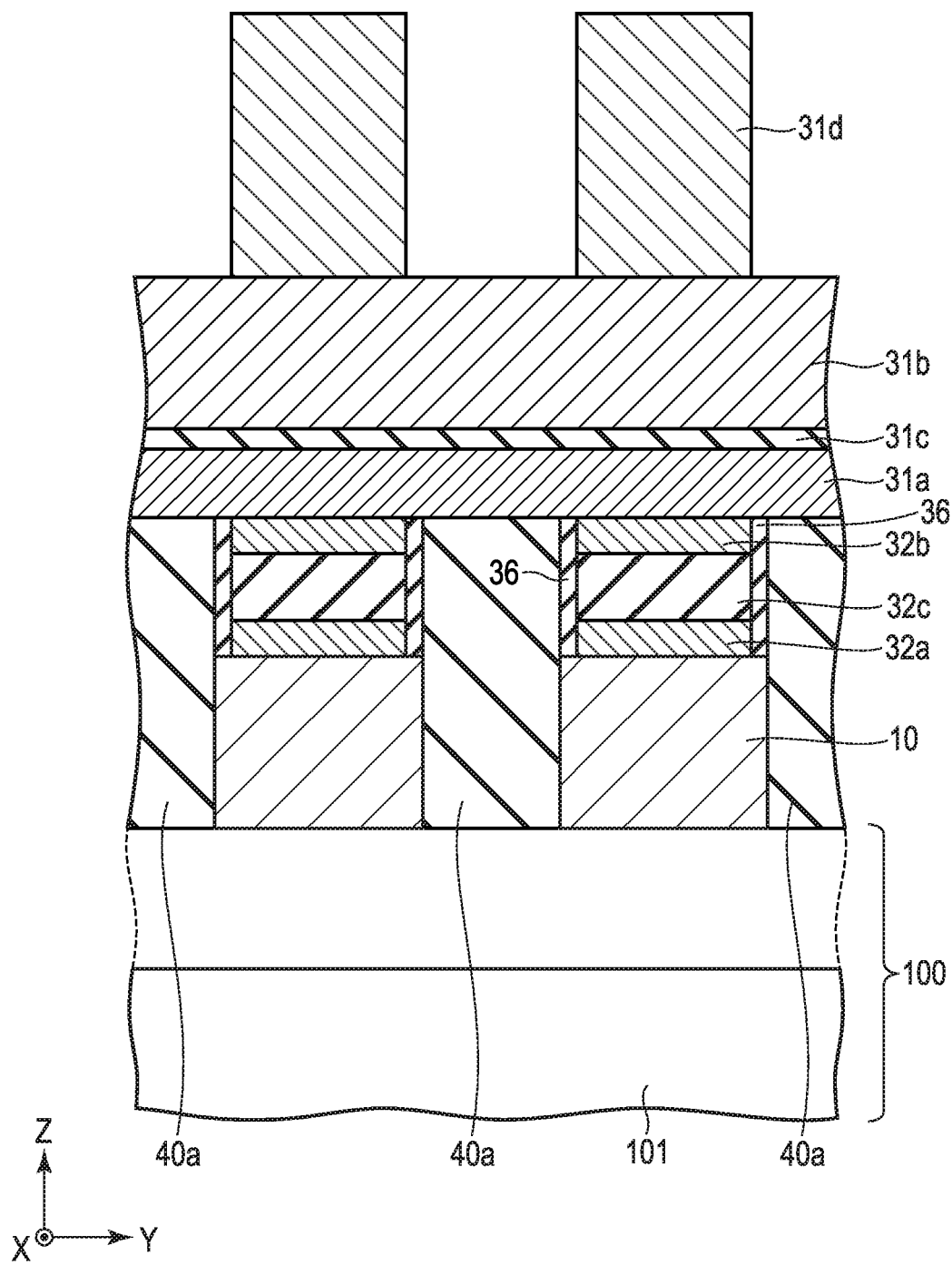
F I G. 26A

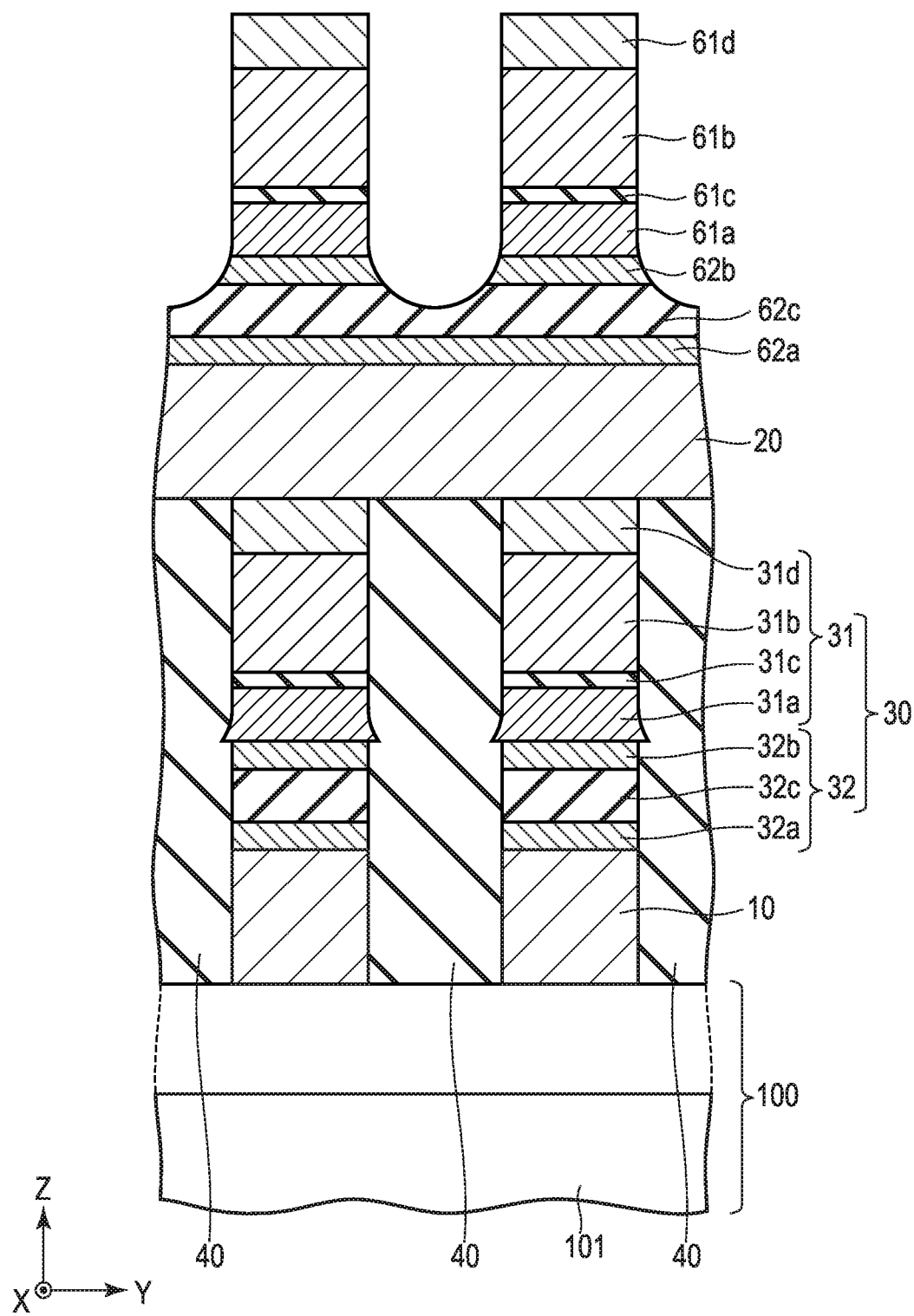
F I G. 33A

MAGNETIC MEMORY DEVICE HAVING AN ELECTRODE CONTINUOUSLY PROVIDED ON A WIRING

CROSS-REFERENCE TO RELATED APPLICATIONS

This application is based upon and claims the benefit of priority from Japanese Patent Application No. 2020-156164, filed Sep. 17, 2020, the entire contents of which are incorporated herein by reference.

FIELD

Embodiments described herein relate generally to a magnetic memory device.

BACKGROUND

A magnetic memory device in which each of memory cells constituted of a magnetoresistance effect element and switching element is integrated on a semiconductor substrate is proposed.

However, concomitantly with the advance in microminiaturization of an element, processing of a memory cell has become difficult. Under these circumstances, a magnetoresistance effect element having due reliability in terms of the element characteristics is required.

BRIEF DESCRIPTION OF THE DRAWINGS

Each of FIG. 2A

Each of FIG. 4A

Each of FIG. 5A

Figure 6A:
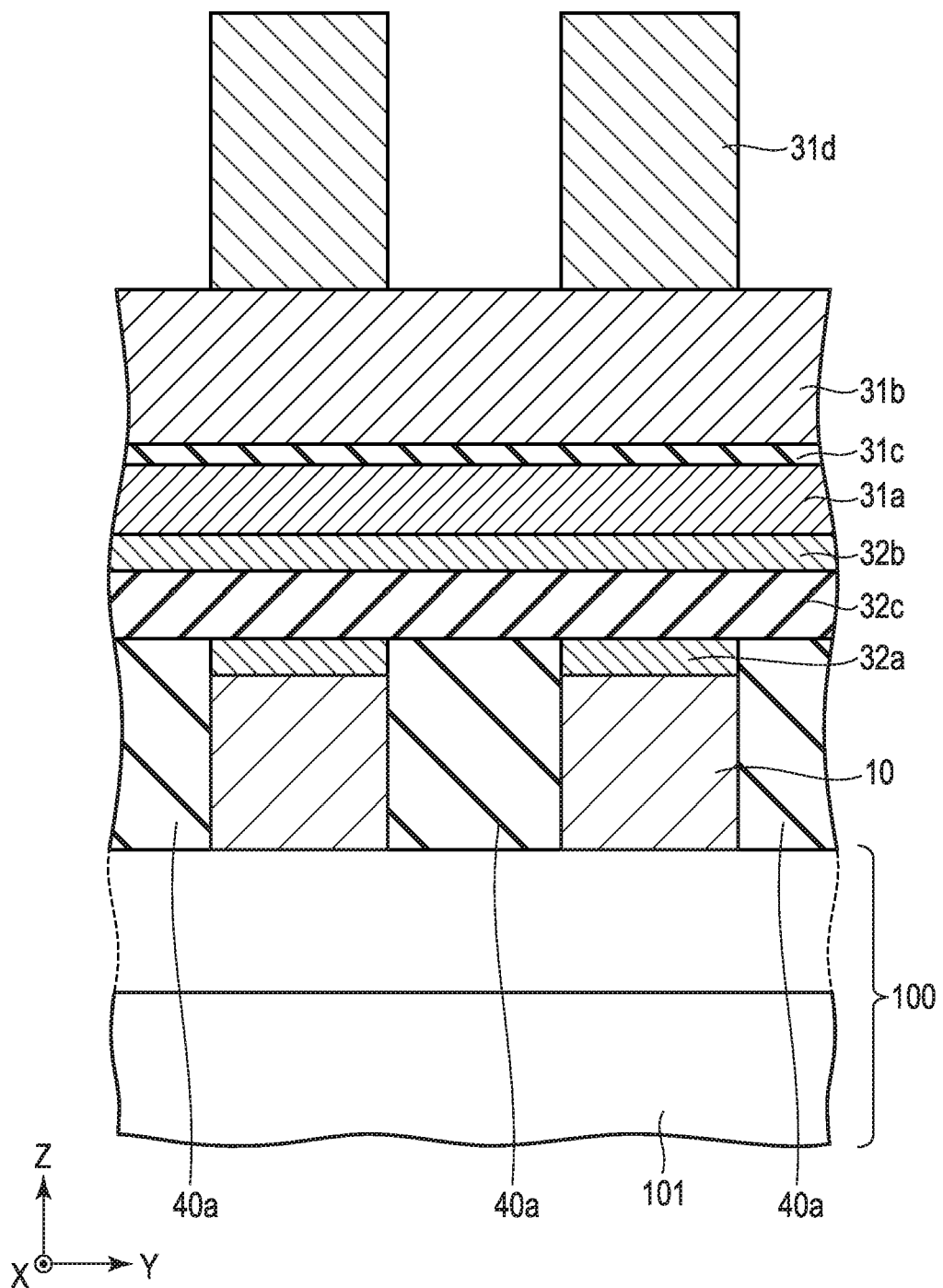

Each of FIGS. 6A and 6B is a cross-sectional view schematically showing part of the manufacturing method of the magnetic memory device according to the first embodiment.

Figure 7A:
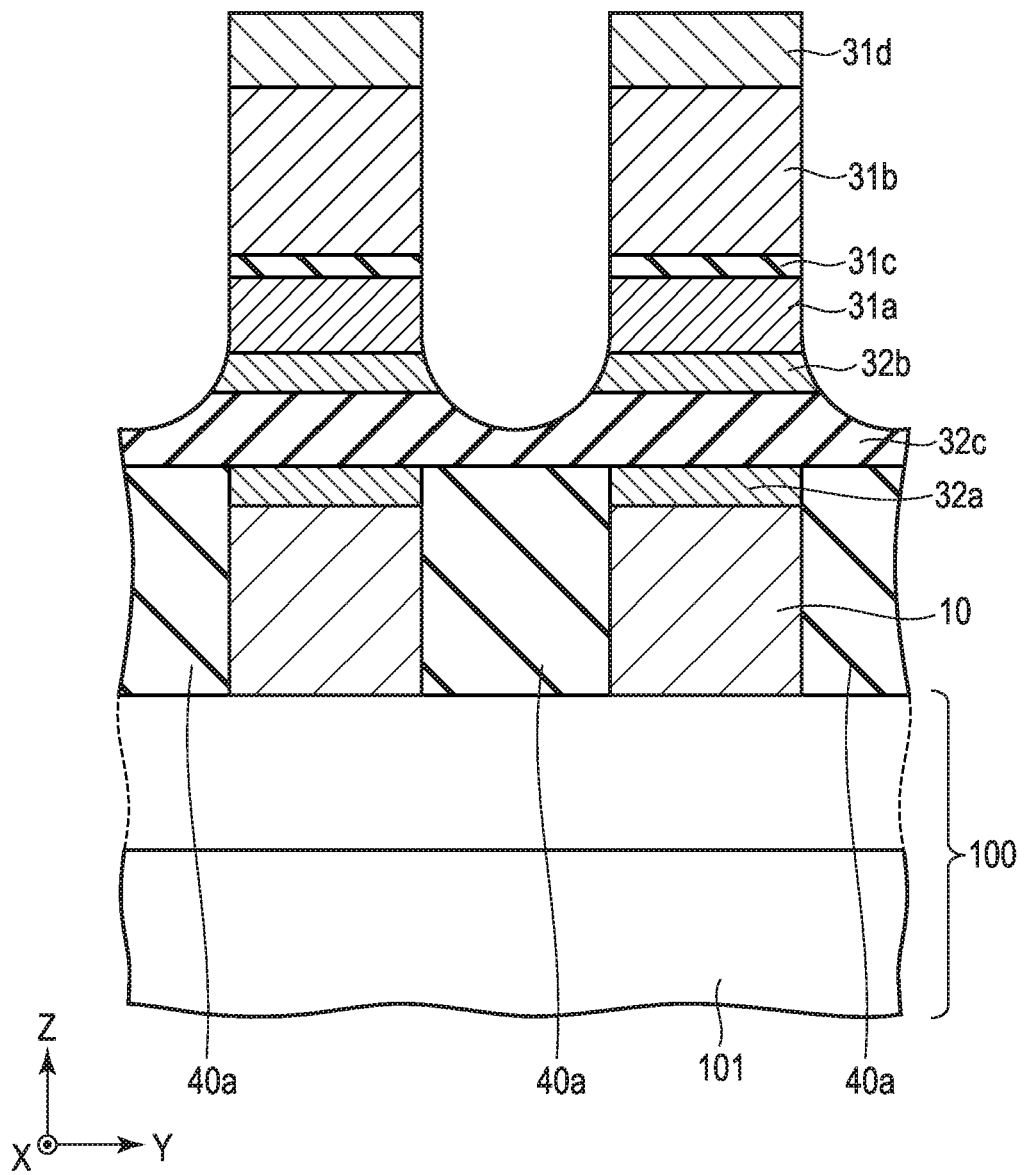
Figure 7B:
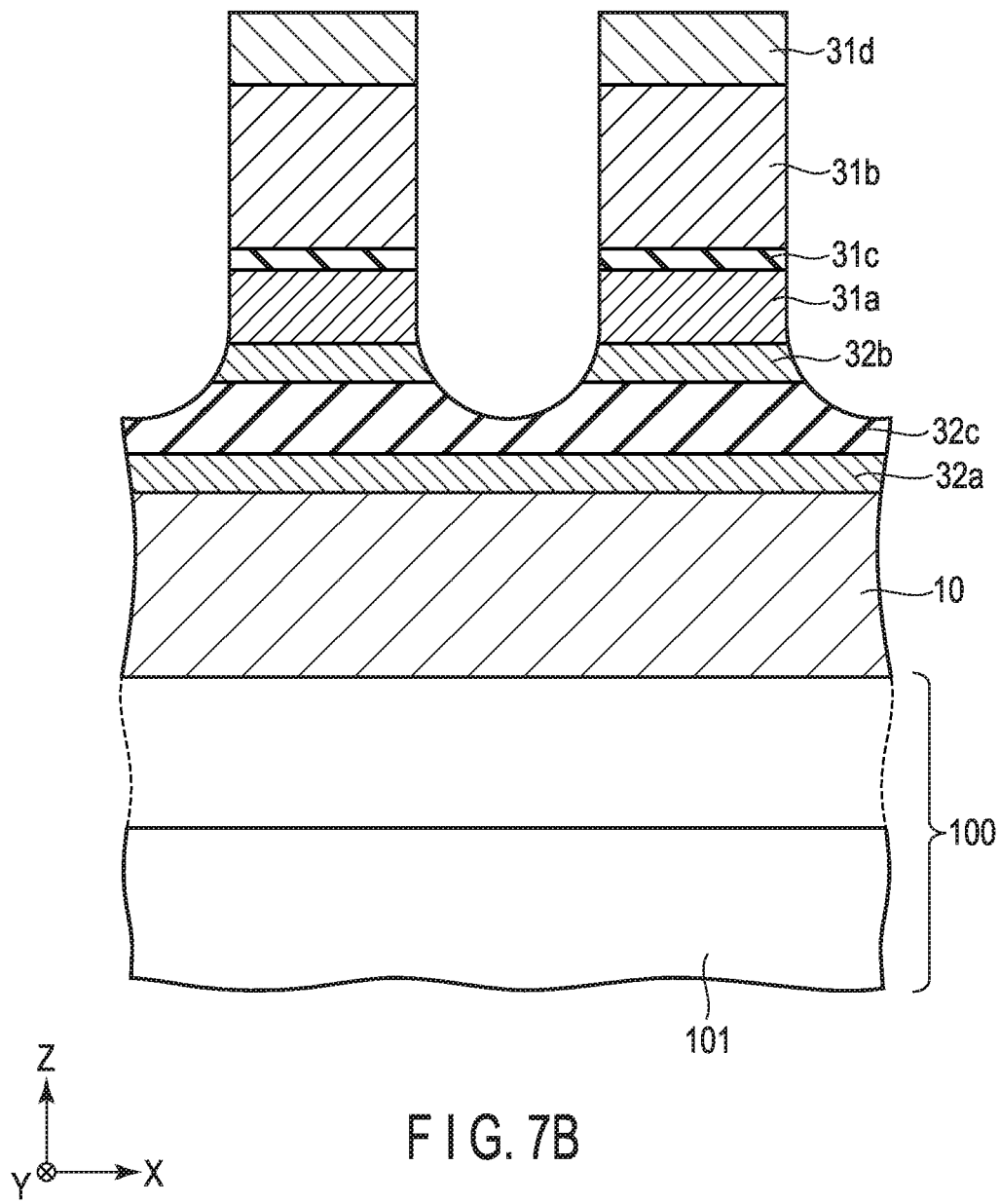

Each of FIGS. 7A and 7B is a cross-sectional view schematically showing part of the manufacturing method of the magnetic memory device according to the first embodiment.

Figure 8A:
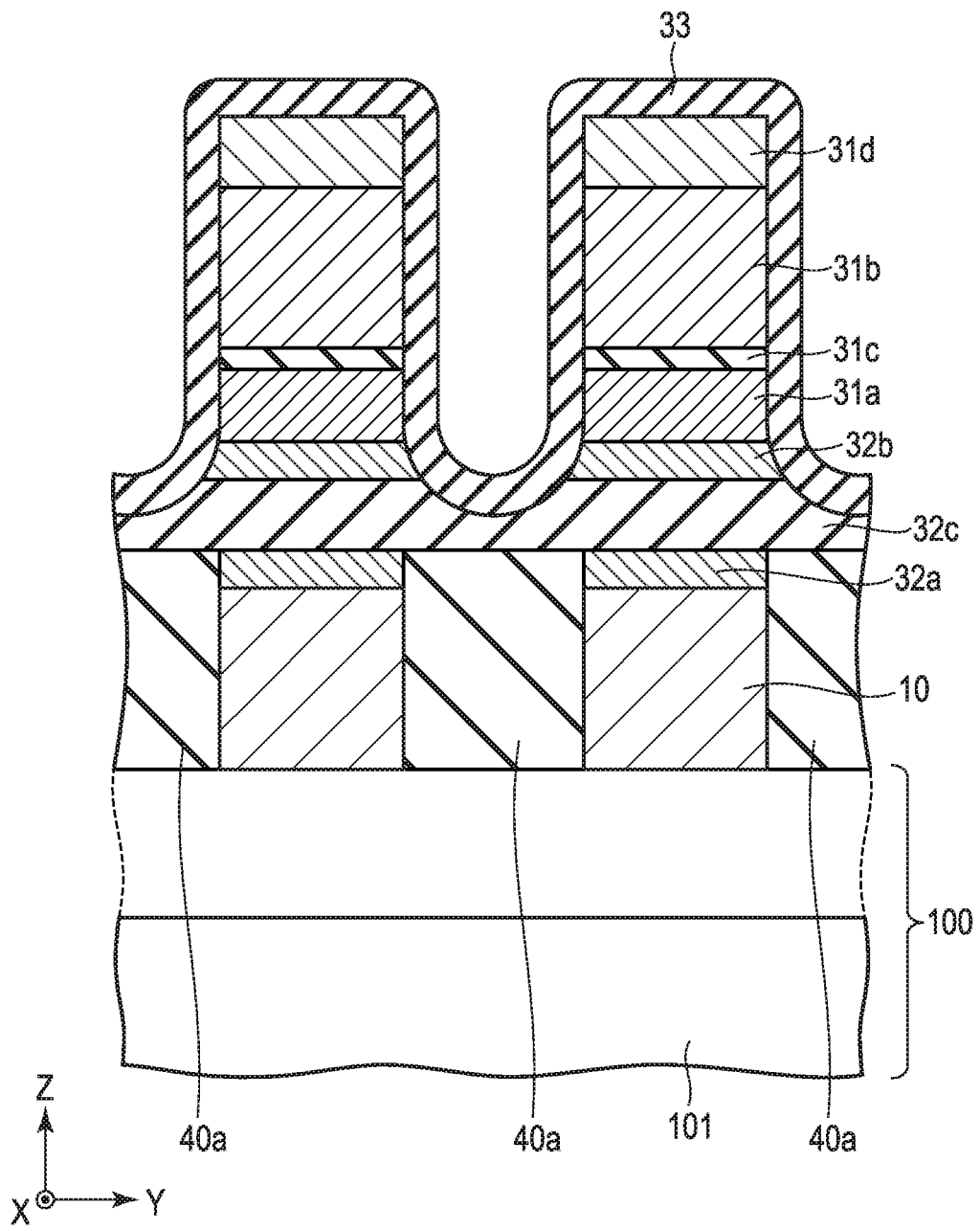
Figure 8B:
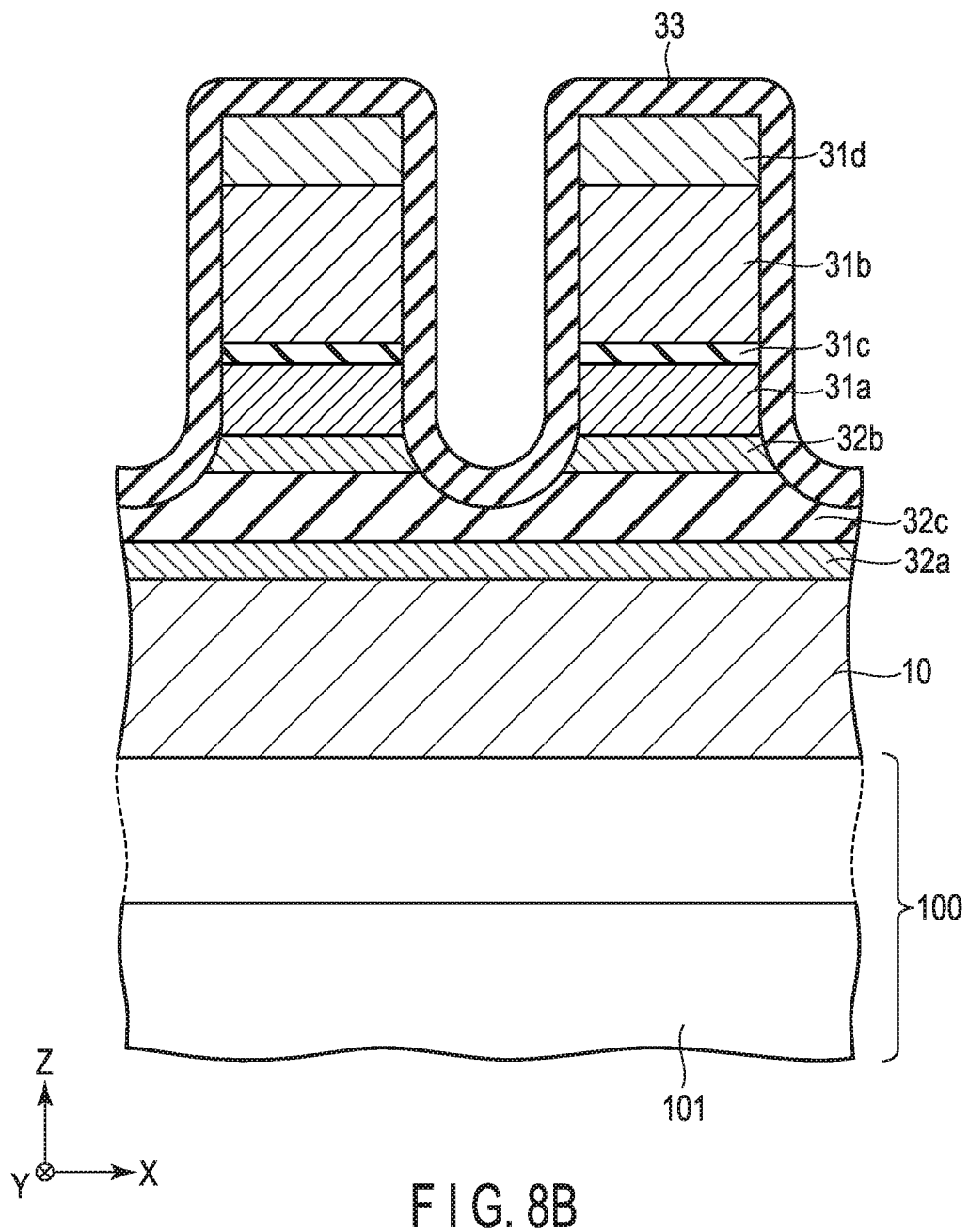

Each of FIGS. 8A and 8B is a cross-sectional view schematically showing part of the manufacturing method of the magnetic memory device according to the first embodiment.

Figure 9A:
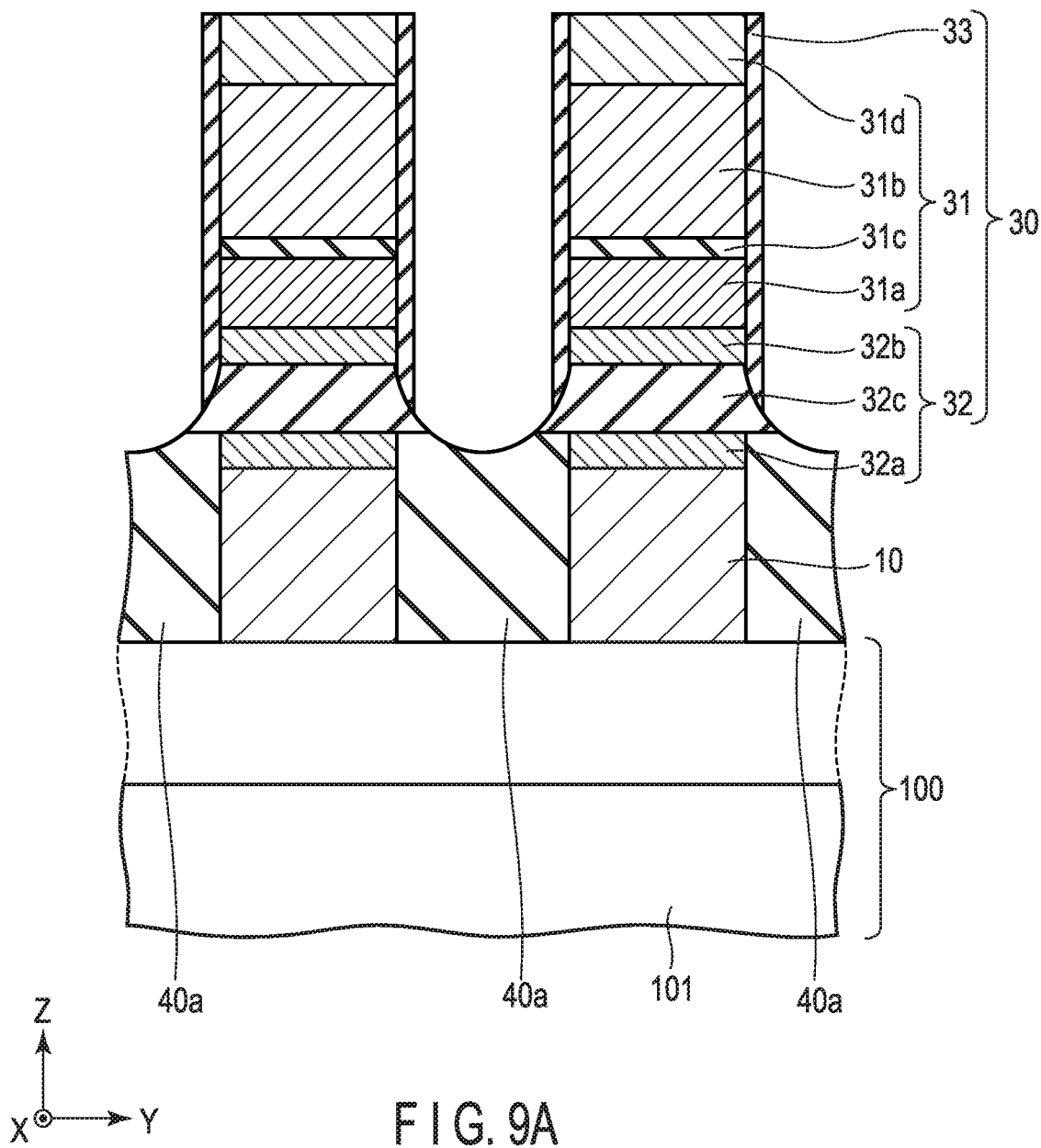
Figure 9B:
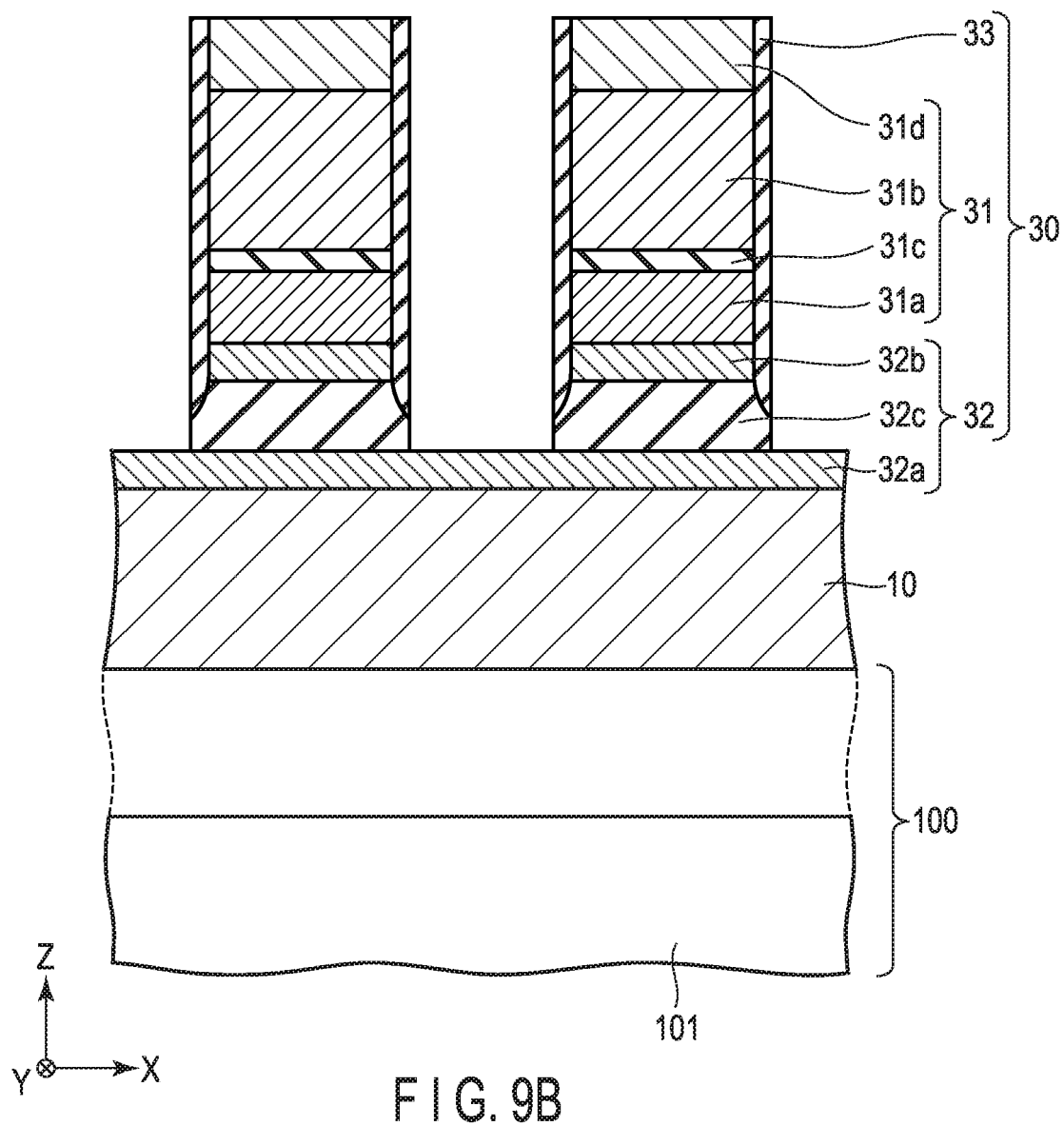

Each of FIGS. 9A and 9B is a cross-sectional view schematically showing part of the manufacturing method of the magnetic memory device according to the first embodiment.

Figure 10:
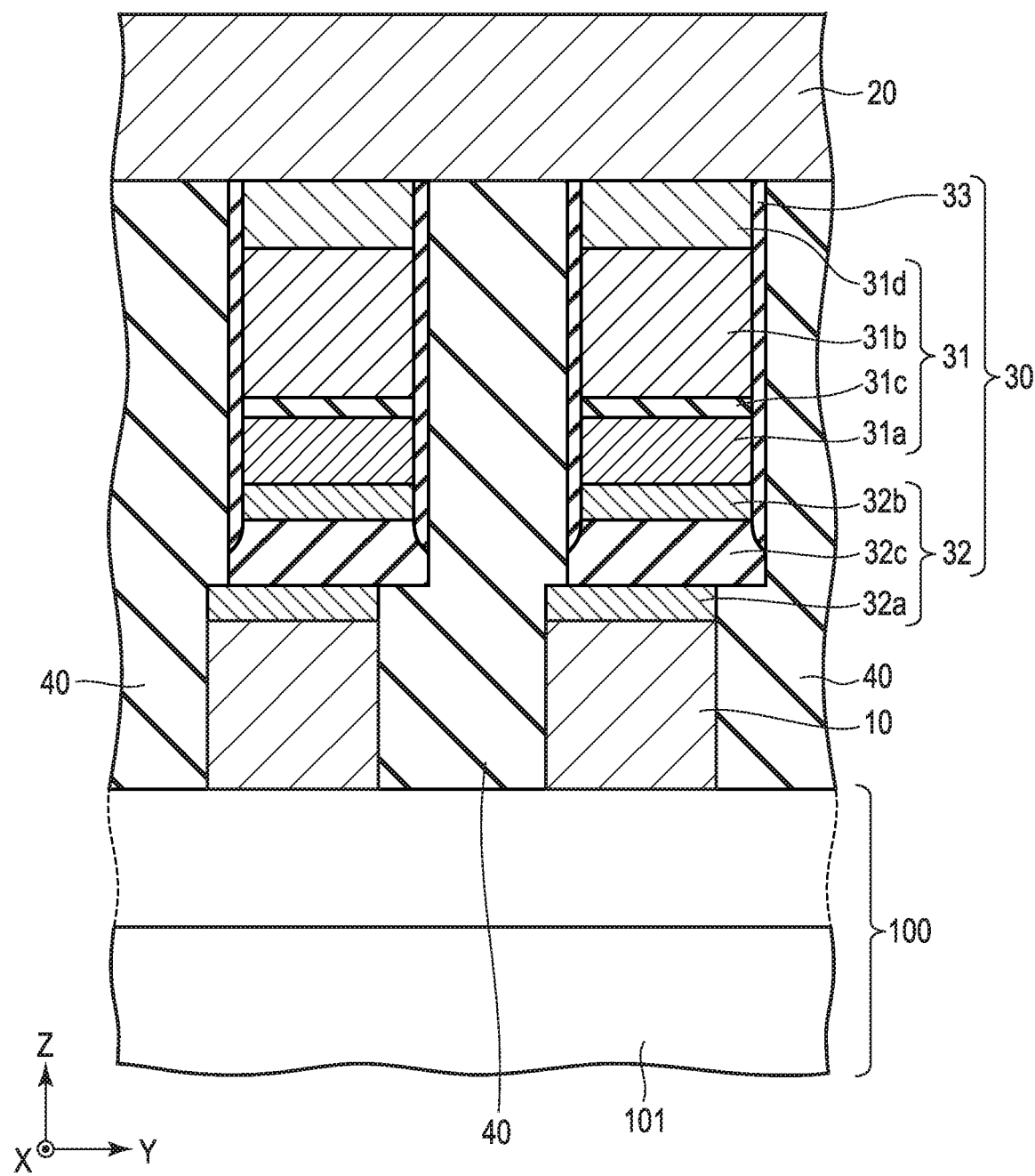

FIG. 10 is a cross-sectional view schematically showing the configuration of the magnetic memory device according to the first embodiment of a case of an occurrence of misalignment.

Figure 11A:
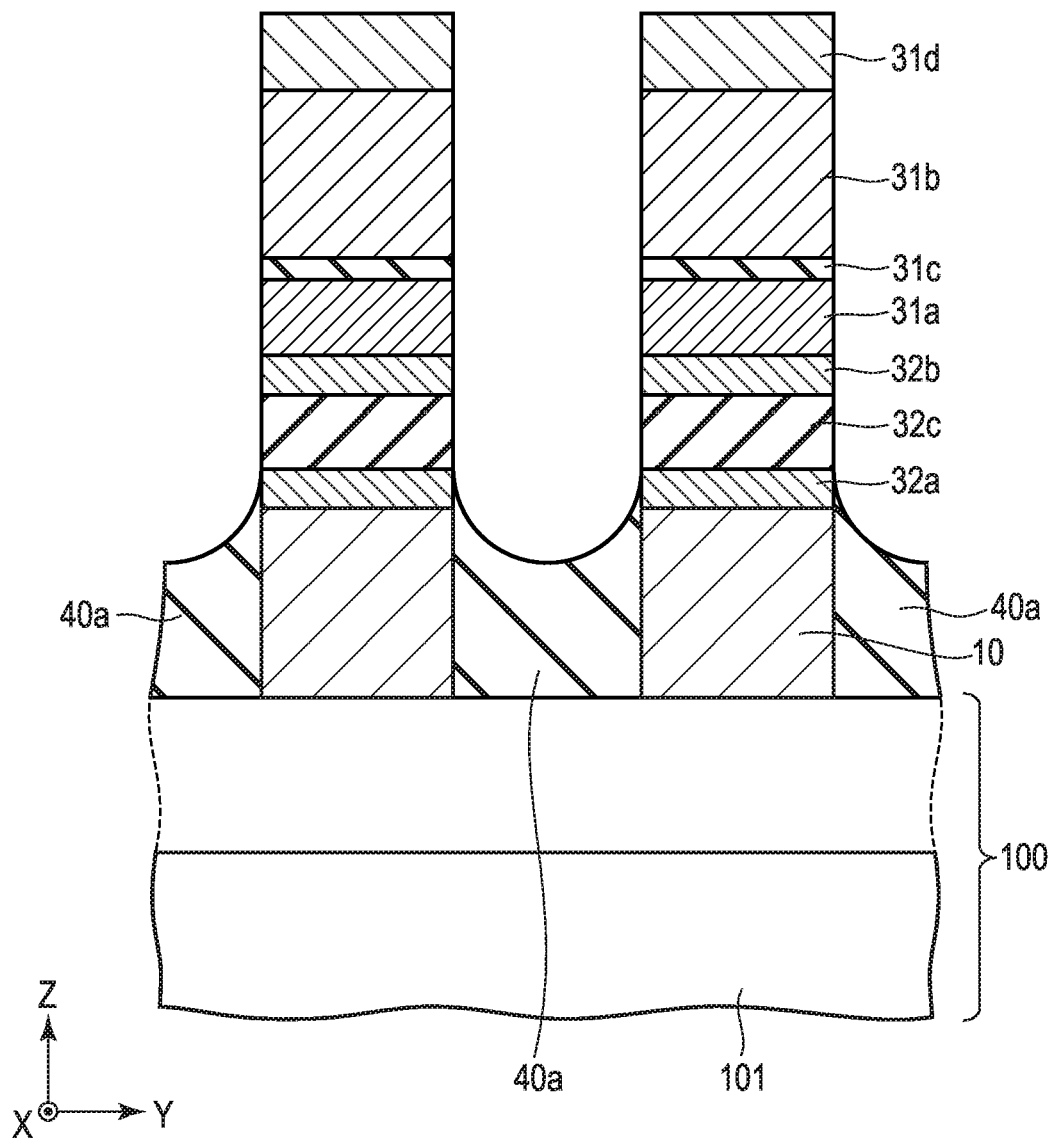
Figure 11B:
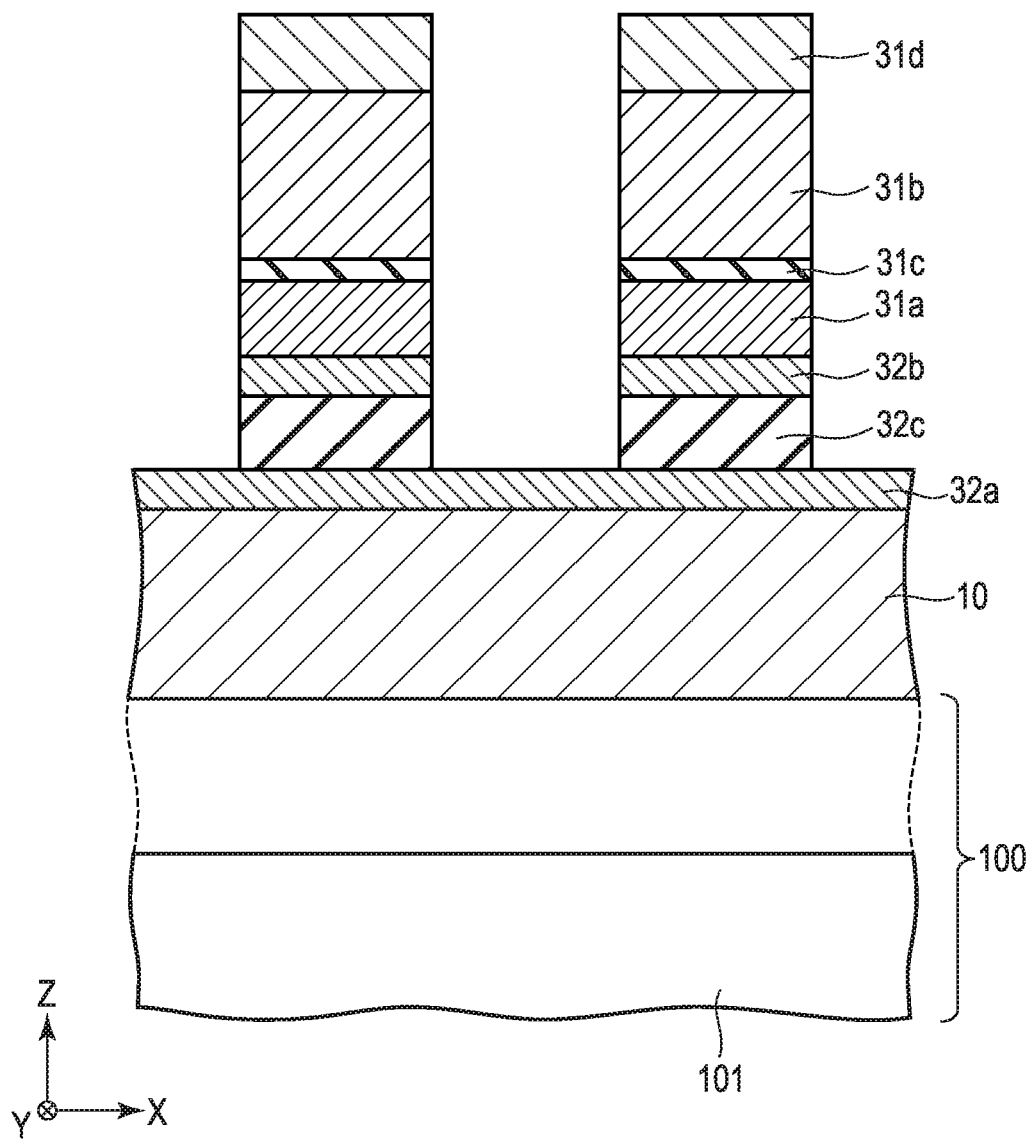

Each of FIGS. 11A and 11B is a cross-sectional view schematically showing part of a manufacturing method of a magnetic memory device according to a modification example of the first embodiment.

Figure 12A:
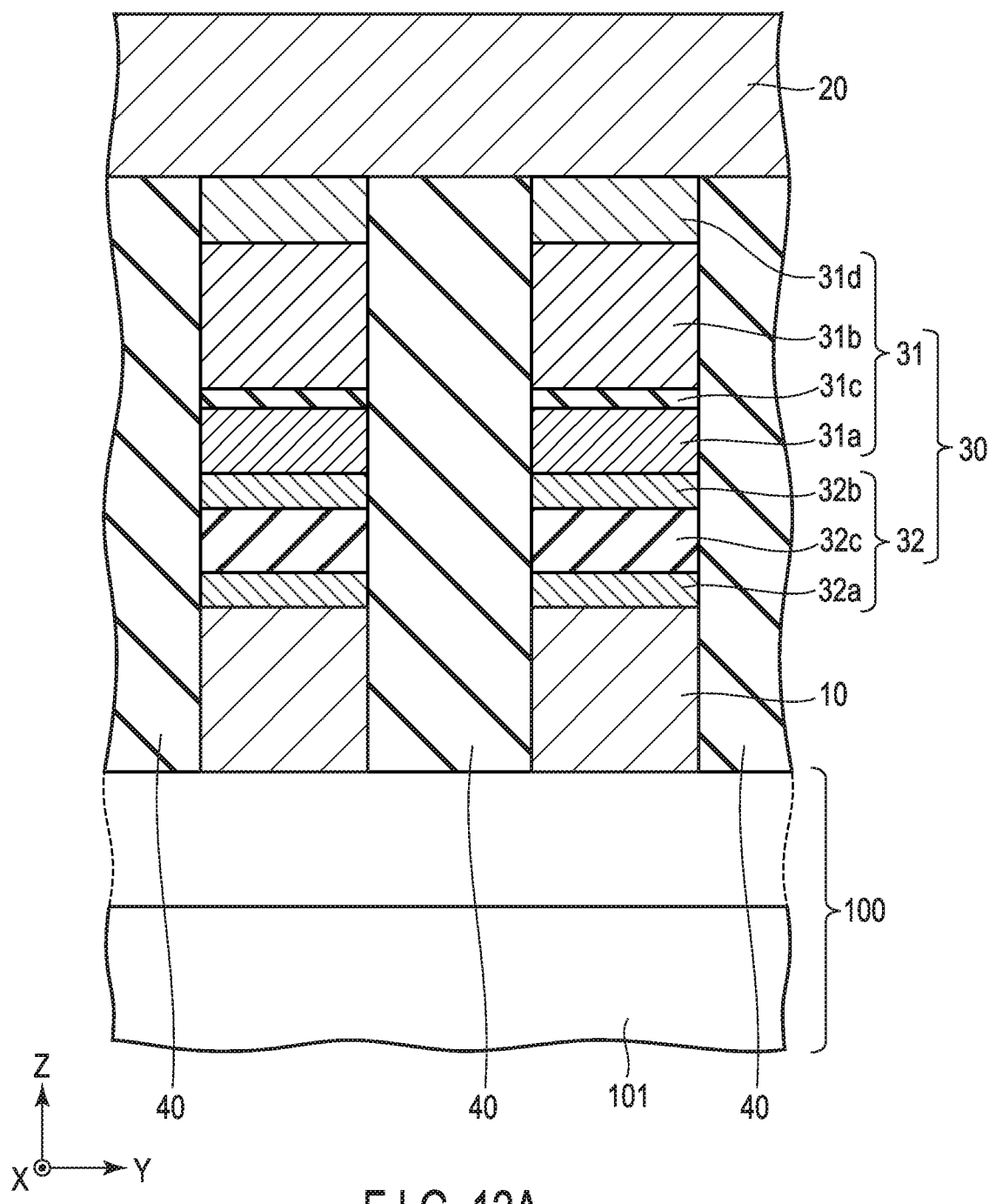
Figure 12B:
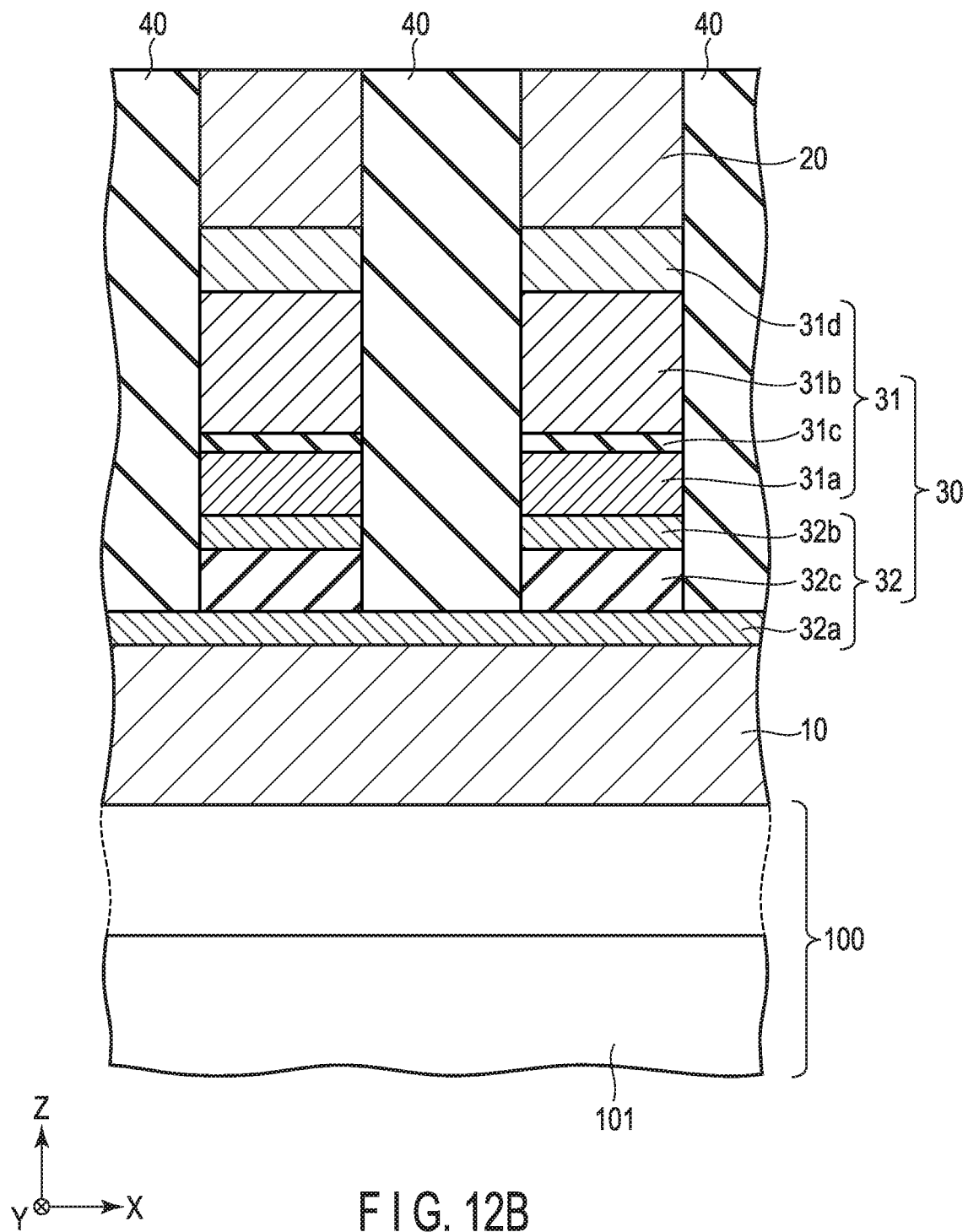

Each of FIGS. 12A and 12B is a cross-sectional view schematically showing part of the manufacturing method of the magnetic memory device according to the modification example of the first embodiment.

Figure 13A:
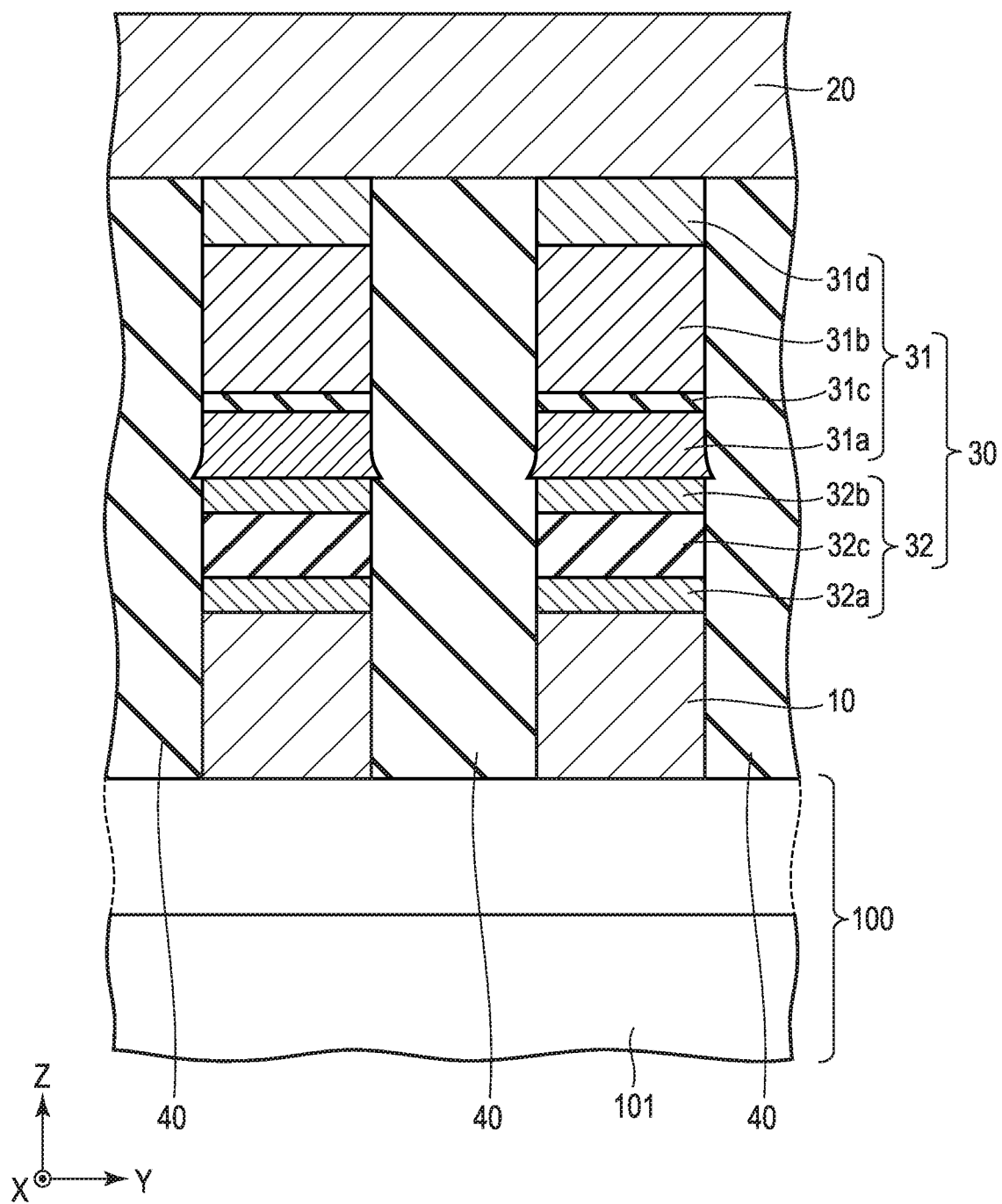
Figure 13B:
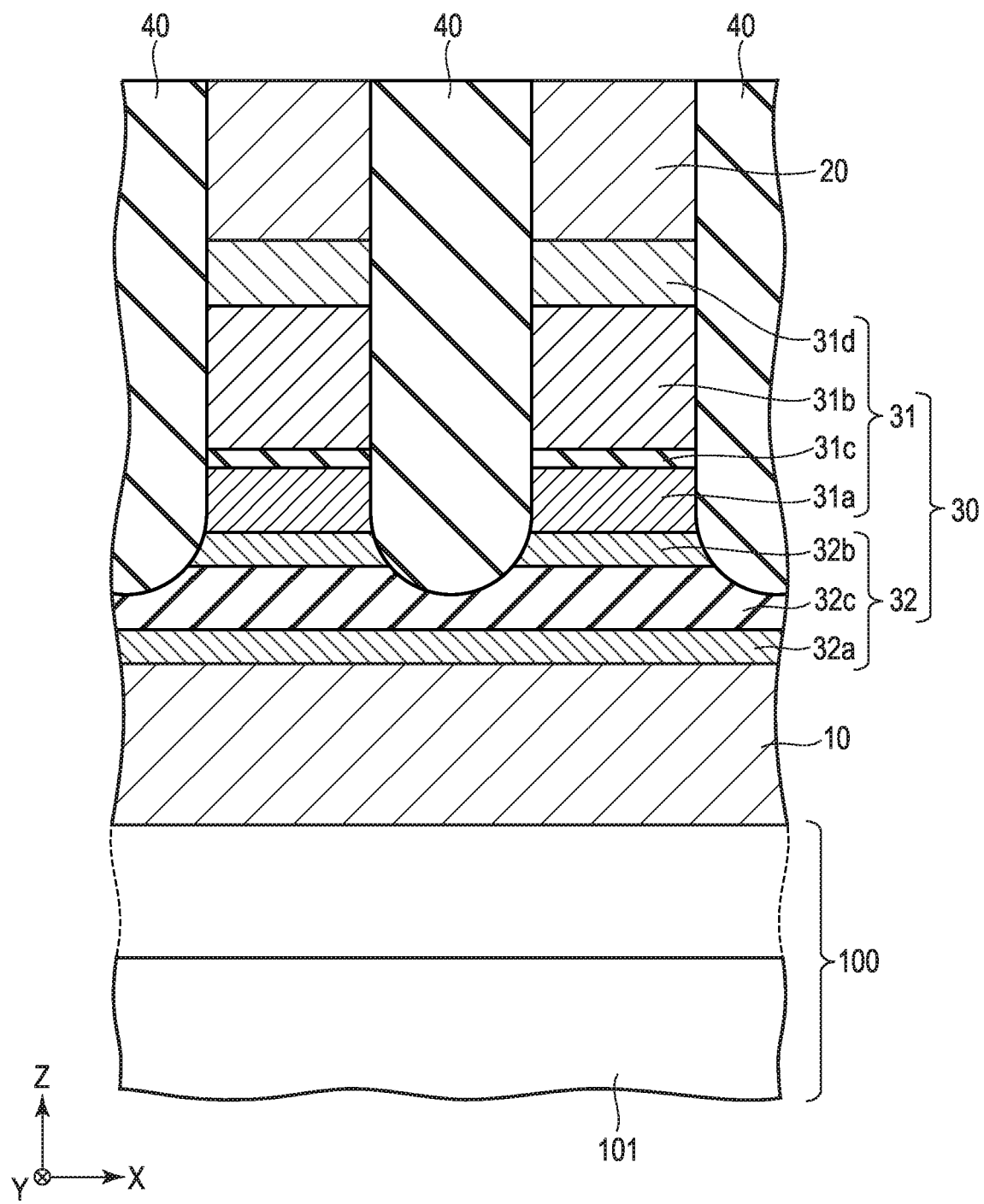

Each of FIG. 13A and FIG. 13B is a cross-sectional view schematically showing the configuration of a magnetic memory device according to a second embodiment.

Figure 14A:
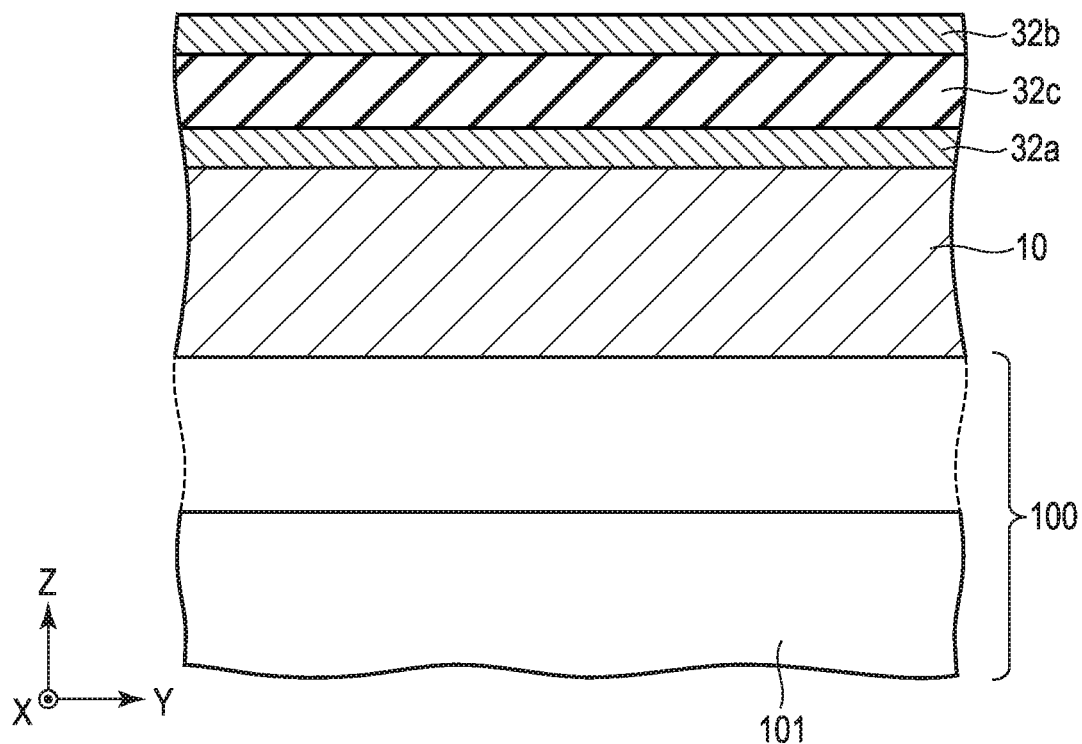
Figure 14B:
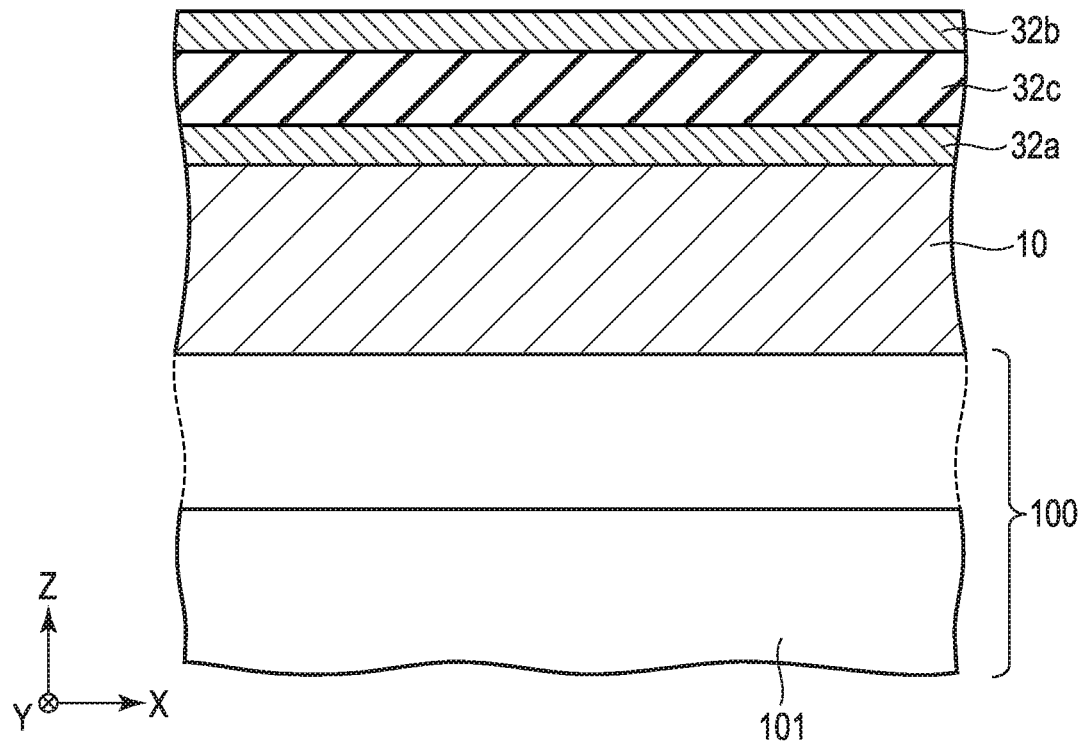

Each of FIGS. 14A and 14B is a cross-sectional view schematically showing part of a manufacturing method of the magnetic memory device according to the second embodiment.

Figure 15A:
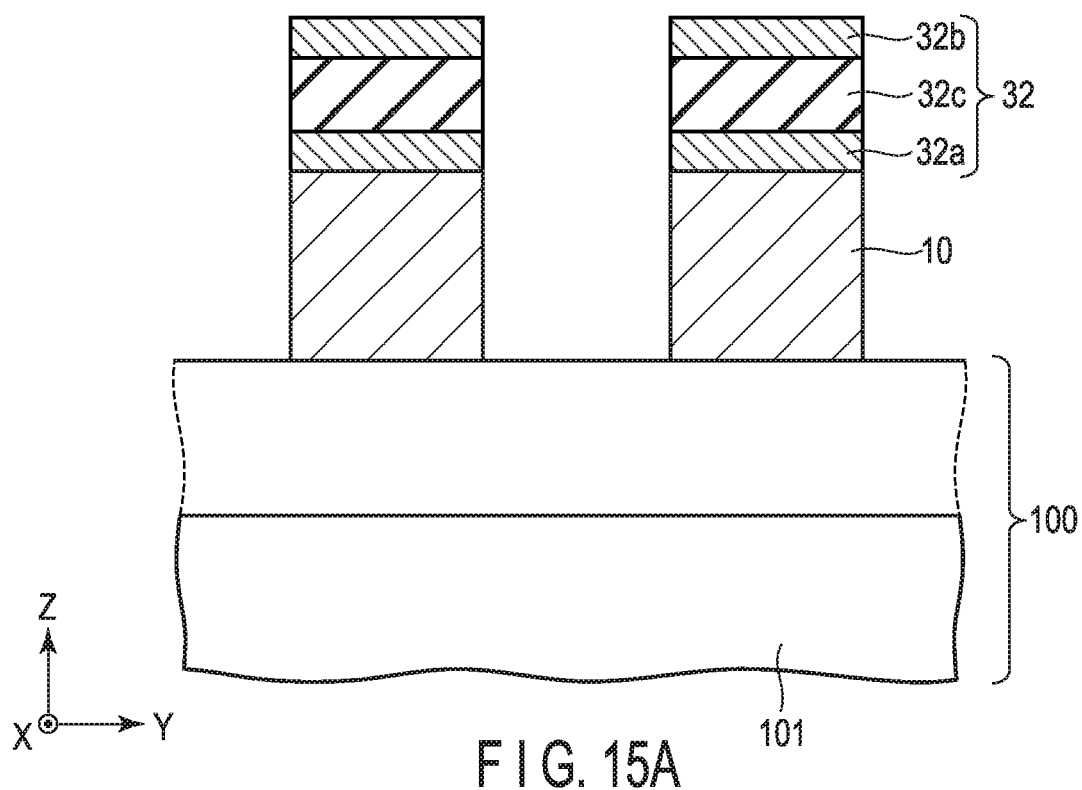
Figure 15B:
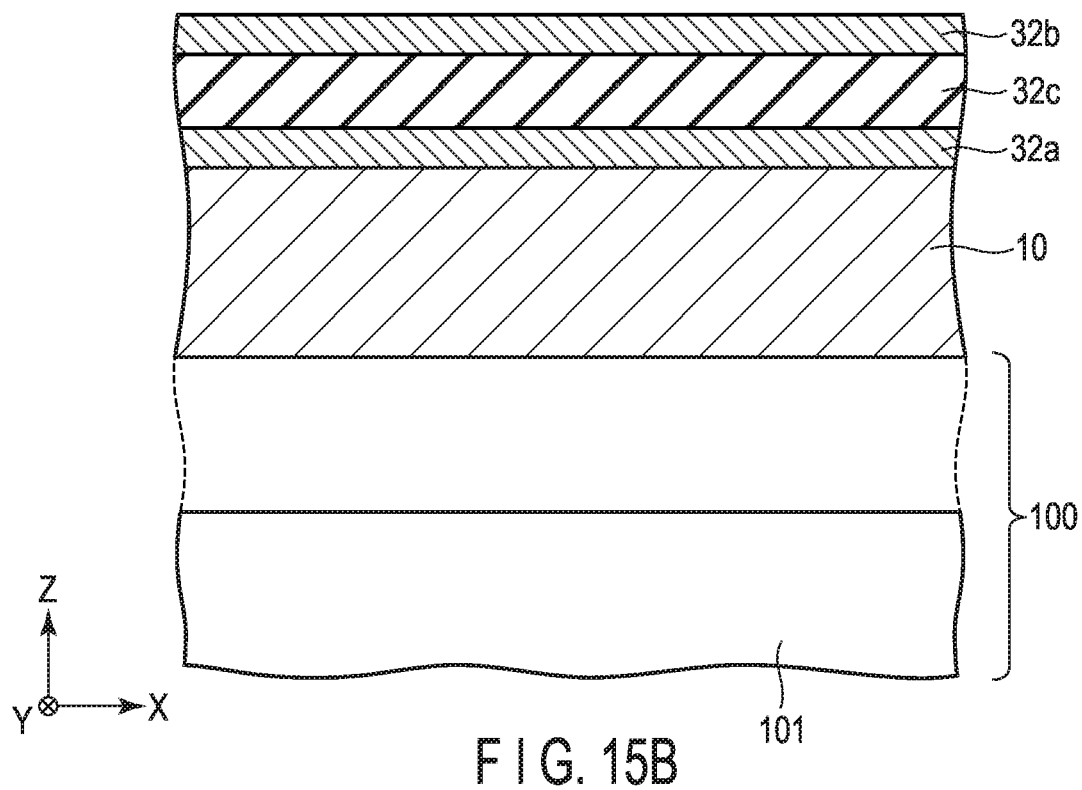

Each of FIGS. 15A and 15B is a cross-sectional view schematically showing part of the manufacturing method of the magnetic memory device according to the second embodiment.

Figure 16A:
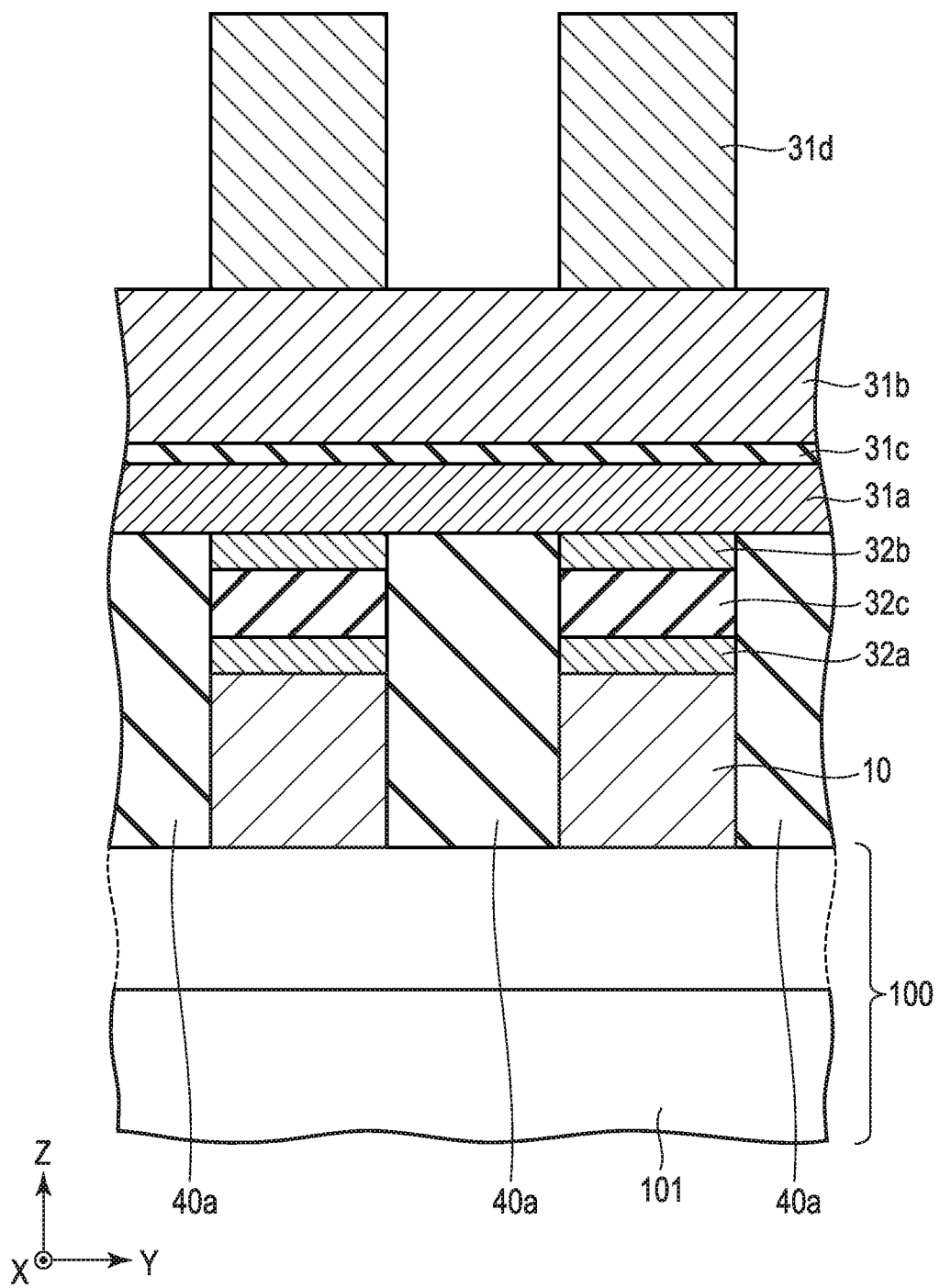
Figure 16B:
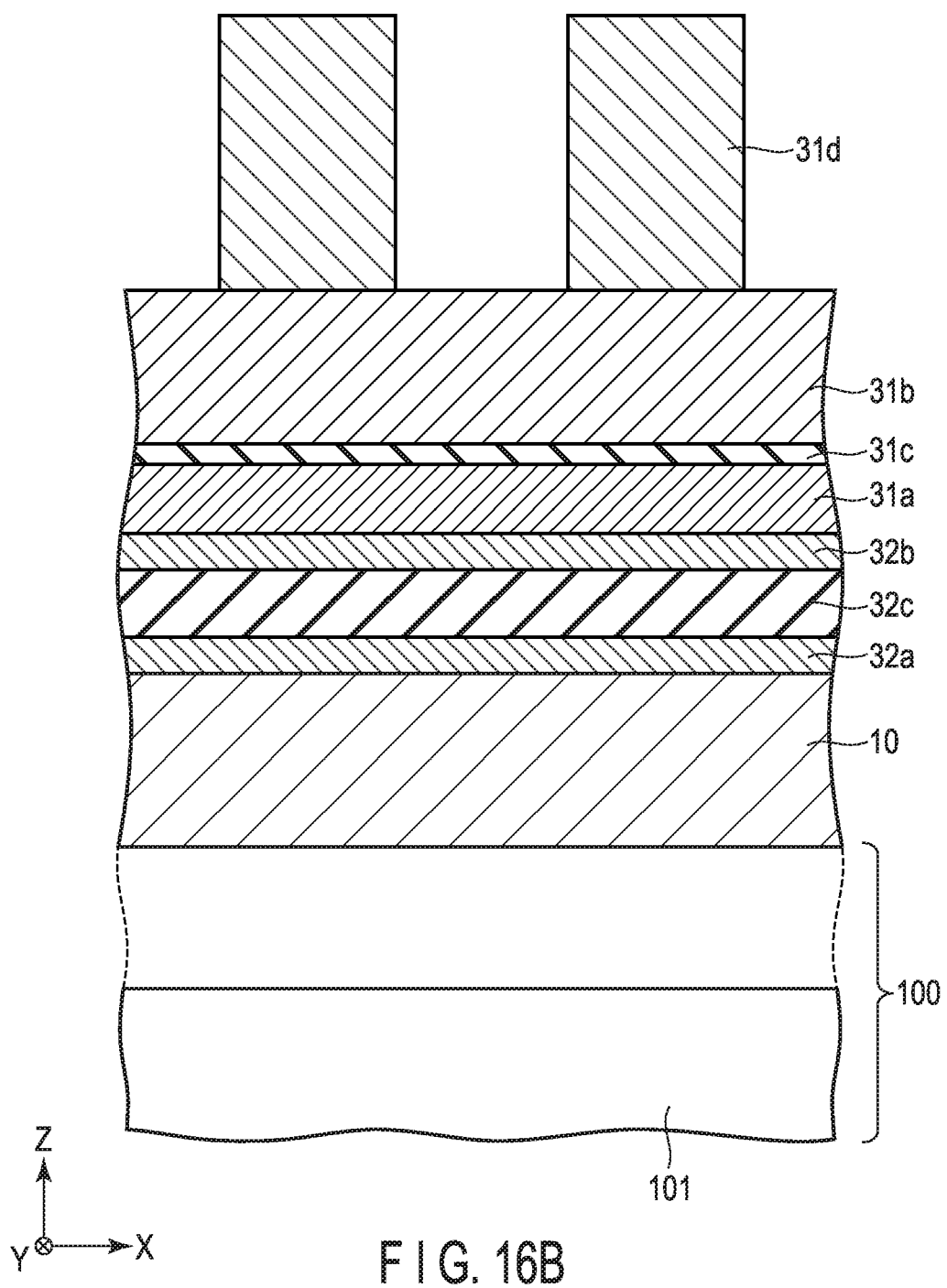

Each of FIGS. 16A and 16B is a cross-sectional view schematically showing part of the manufacturing method of the magnetic memory device according to the second embodiment.

Figure 17A:
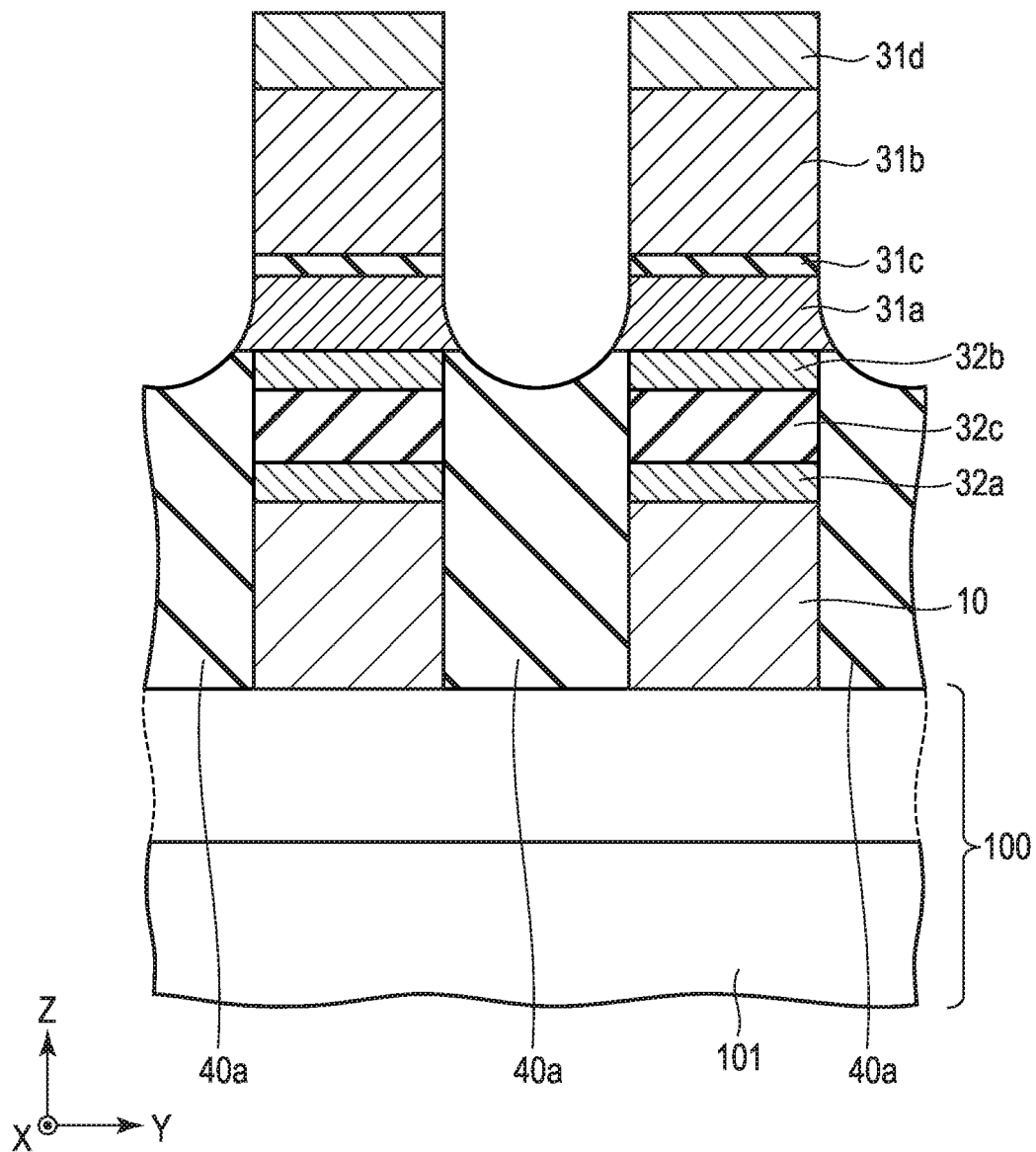

Each of FIGS. 17A and 17B is a cross-sectional view schematically showing part of the manufacturing method of the magnetic memory device according to the second embodiment.

Figure 18:
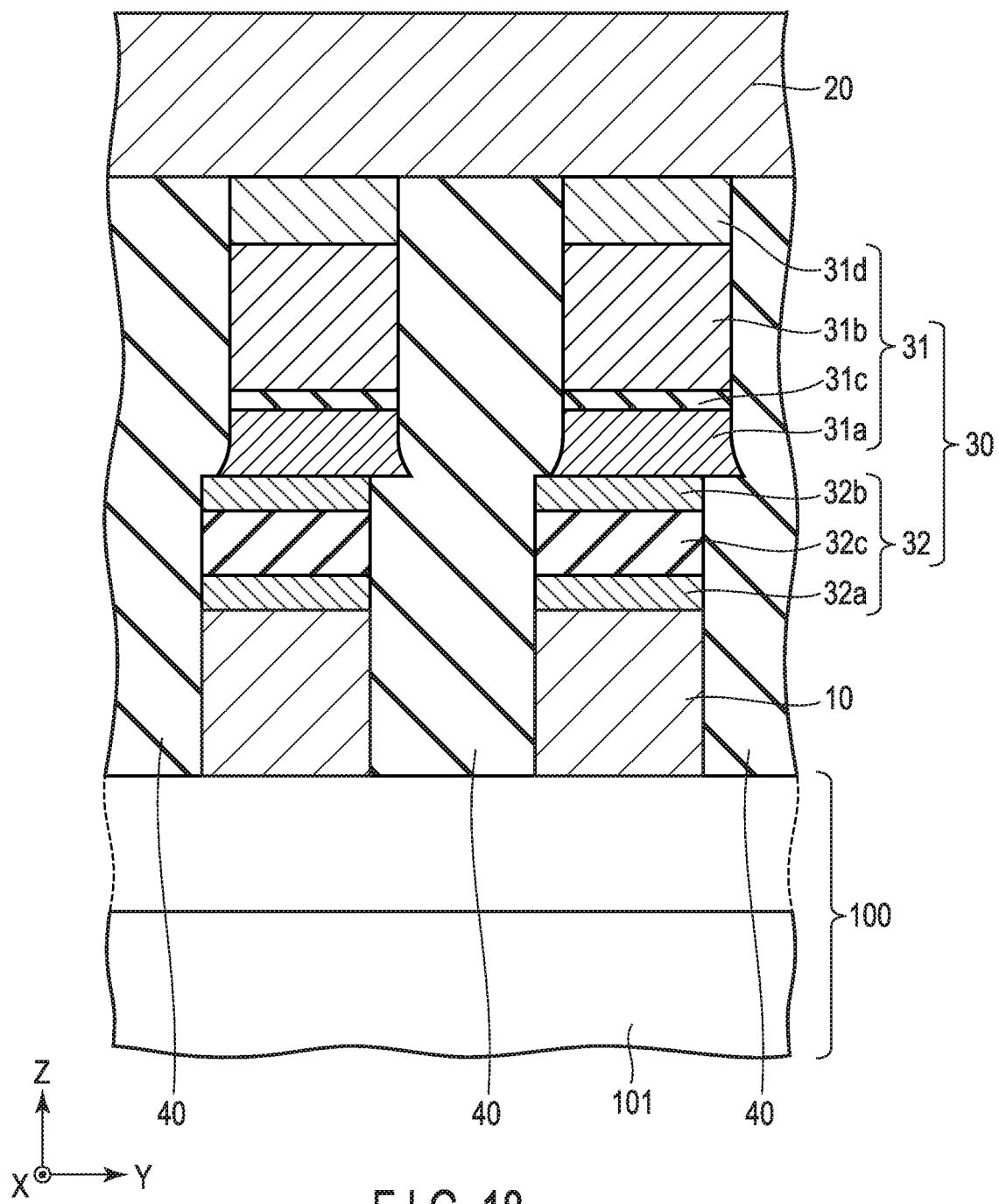

FIG. 18 is a cross-sectional view schematically showing the configuration of the magnetic memory device according to the second embodiment of a case of an occurrence of misalignment.

Figure 19:
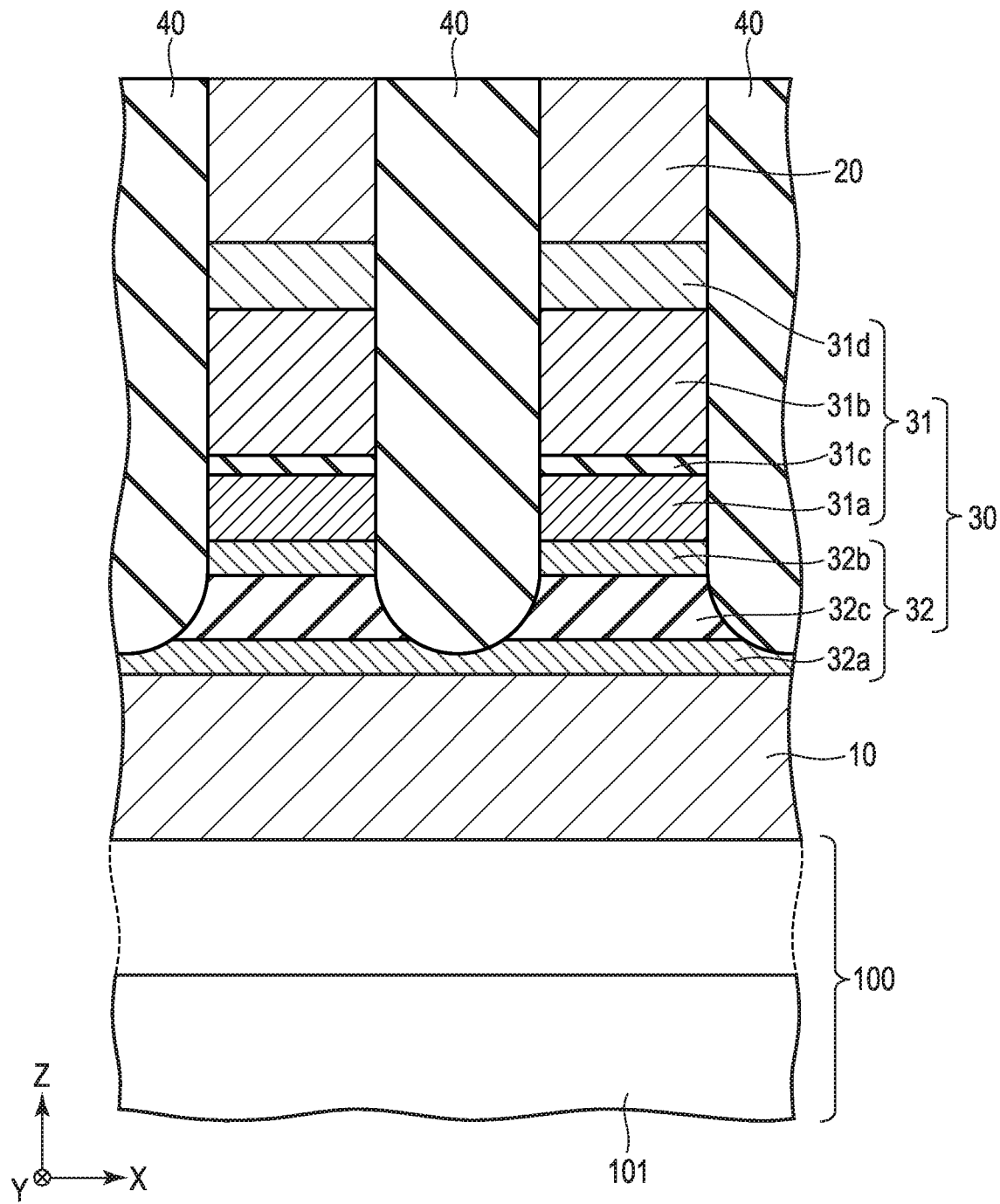

FIG. 19 is a cross-sectional view schematically showing the configuration of a magnetic memory device according to a first modification example of the second embodiment.

Figure 20:
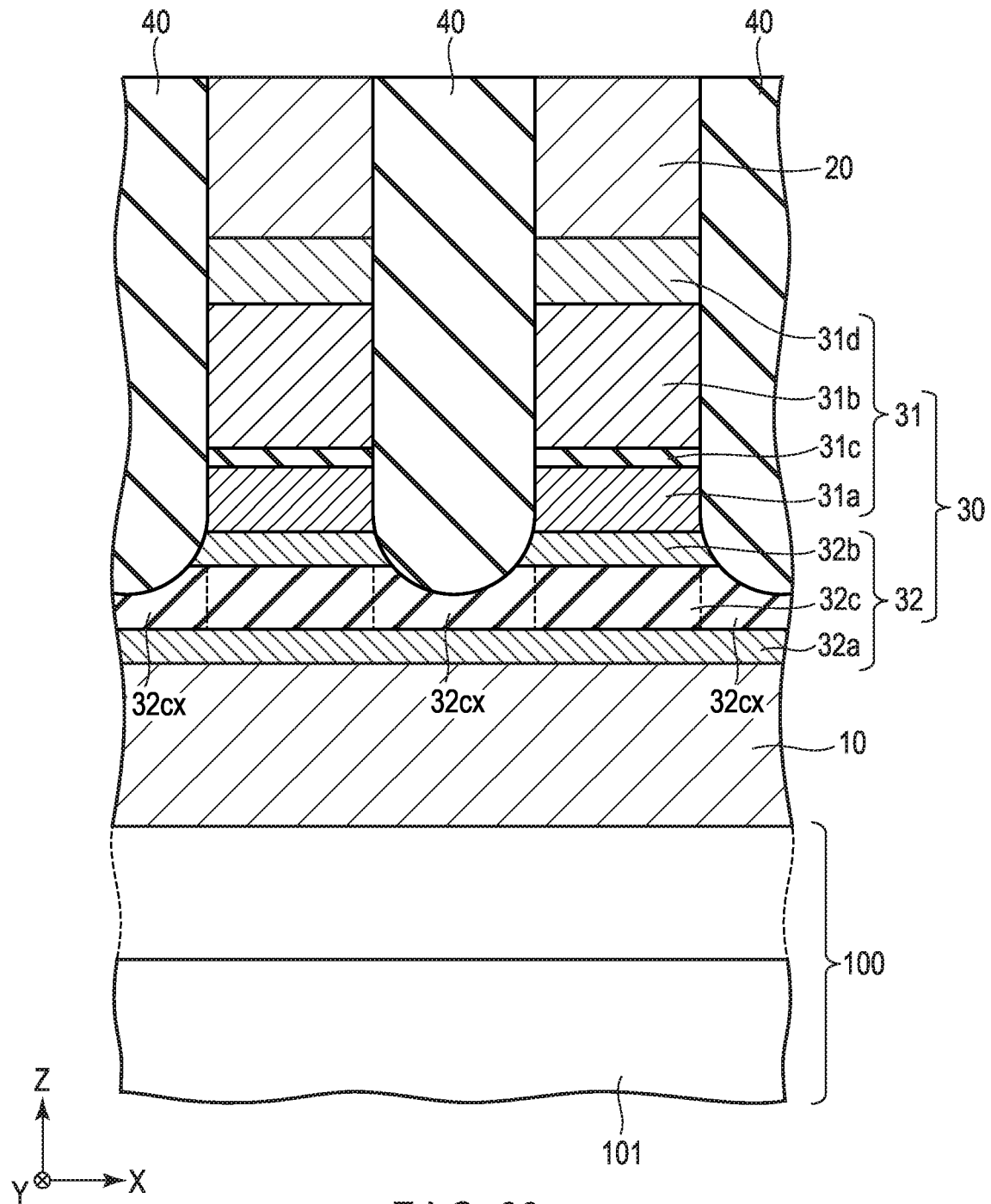

FIG. 20 is a cross-sectional view schematically showing the configuration of a magnetic memory device according to a second modification example of the second embodiment.

Figure 21A:
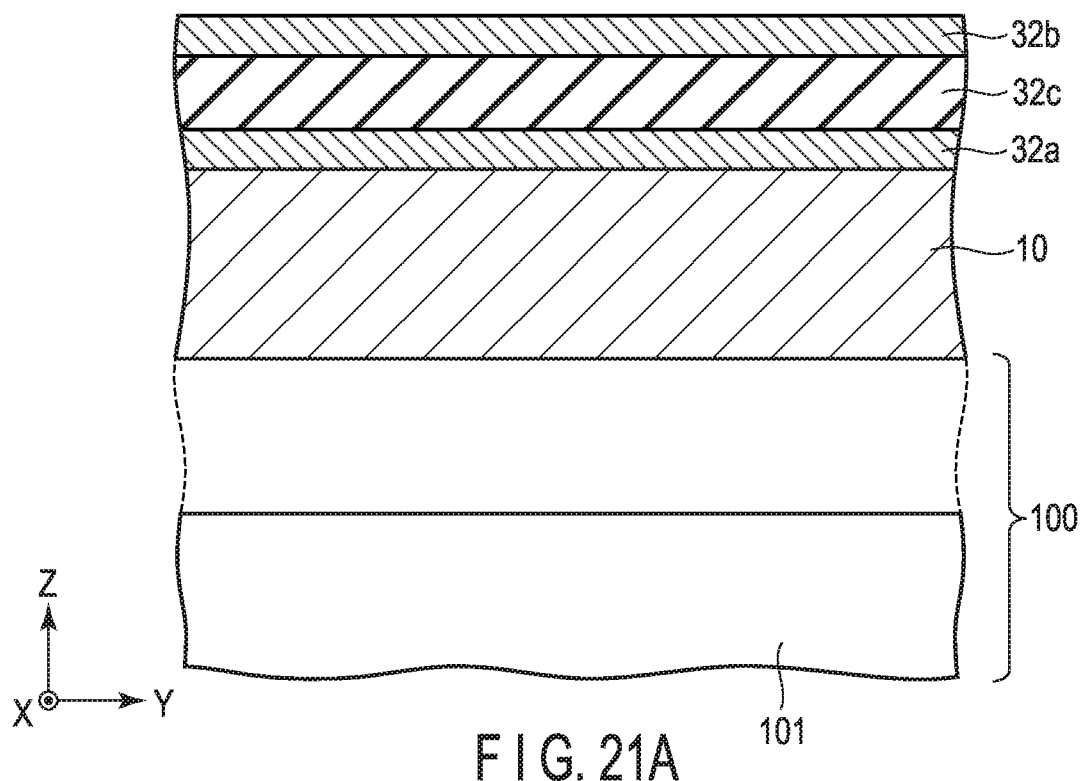
Figure 21B:
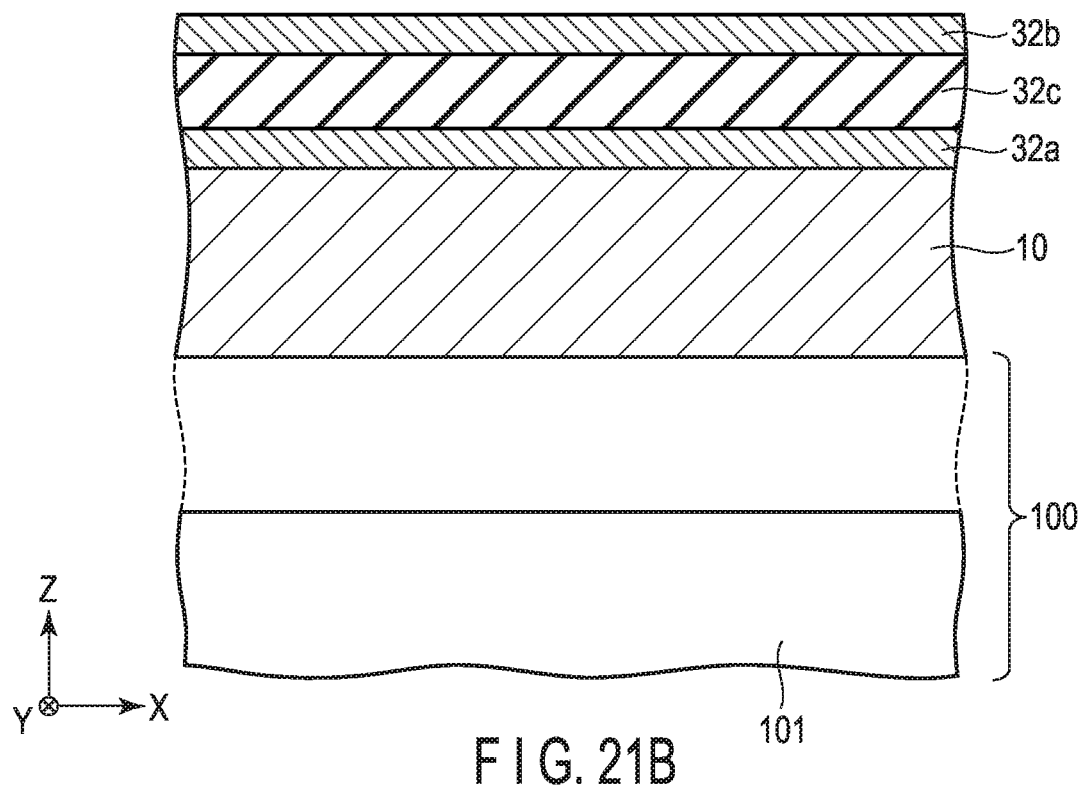

Each of FIG. 21A and FIG. 21B is a cross-sectional view schematically showing part of a manufacturing method of a magnetic memory device according to a third modification example of the second embodiment.

Figure 22A:
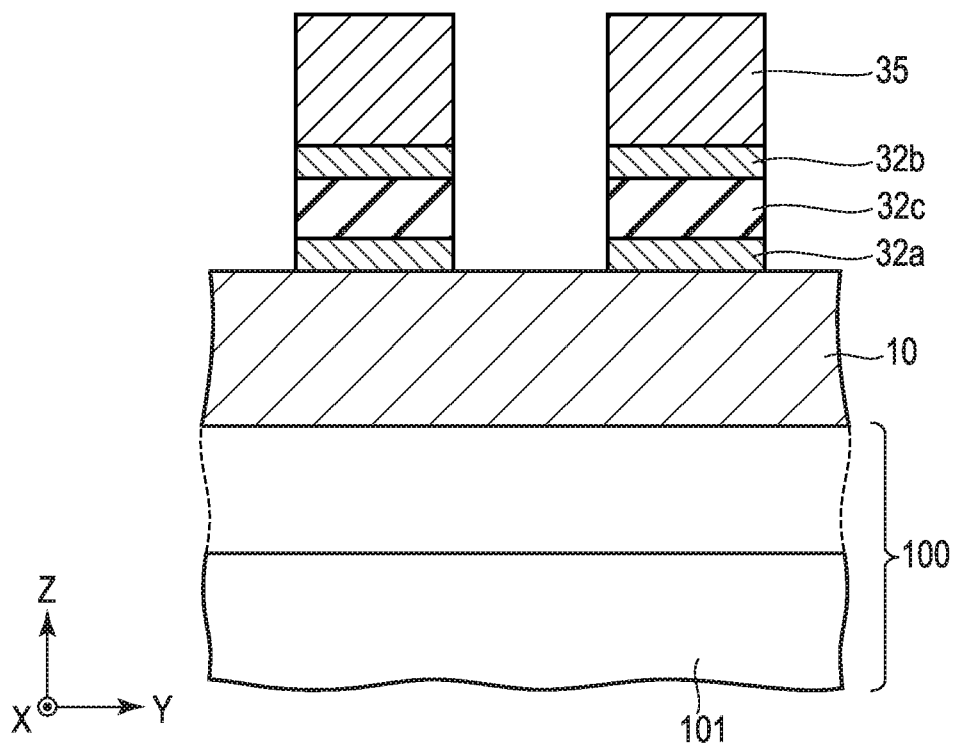
Figure 22B:
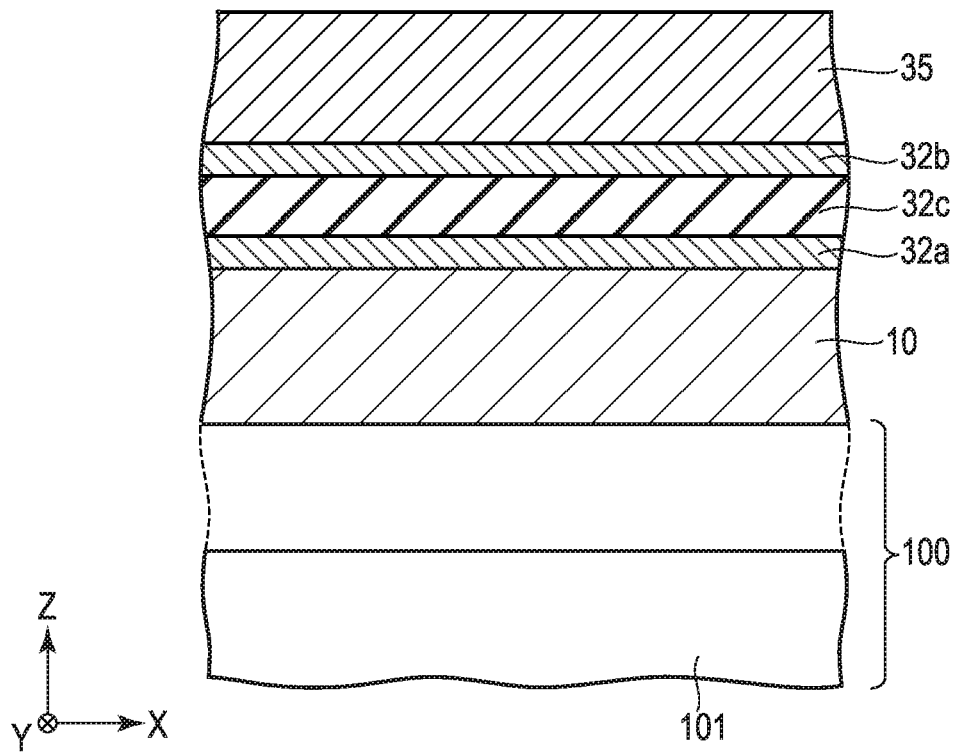

Each of FIG. 22A and FIG. 22B is a cross-sectional view schematically showing part of the manufacturing method of the magnetic memory device according to the third modification example of the second embodiment.

Figure 23A:
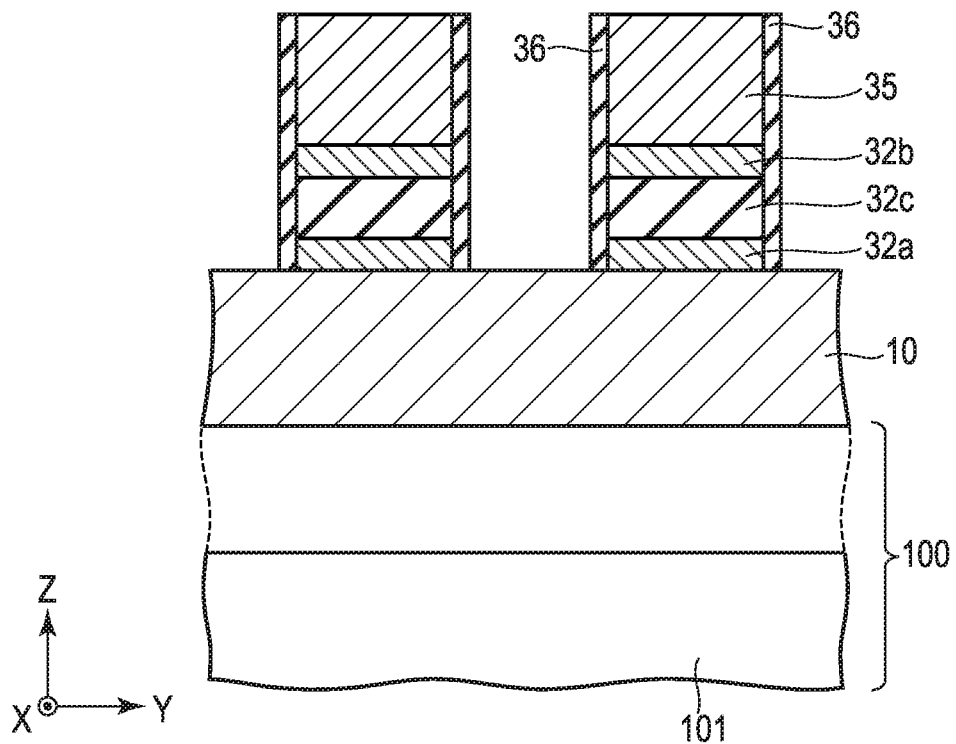
Figure 23B:
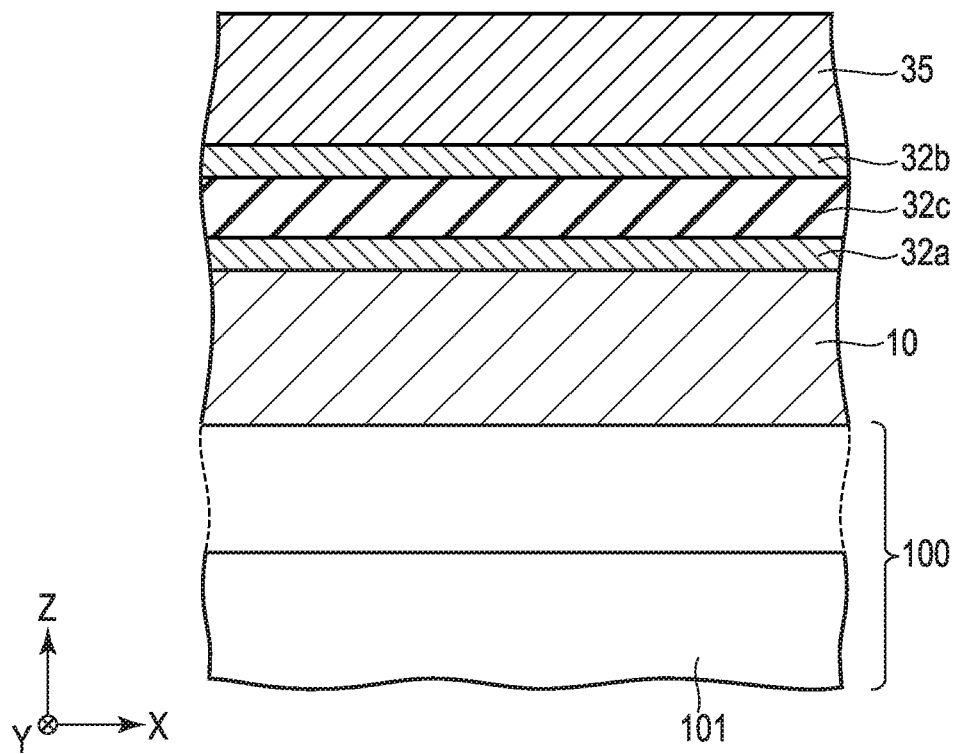

Each of FIG. 23A and FIG. 23B is a cross-sectional view schematically showing part of the manufacturing method of the magnetic memory device according to the third modification example of the second embodiment.

Figure 24A:
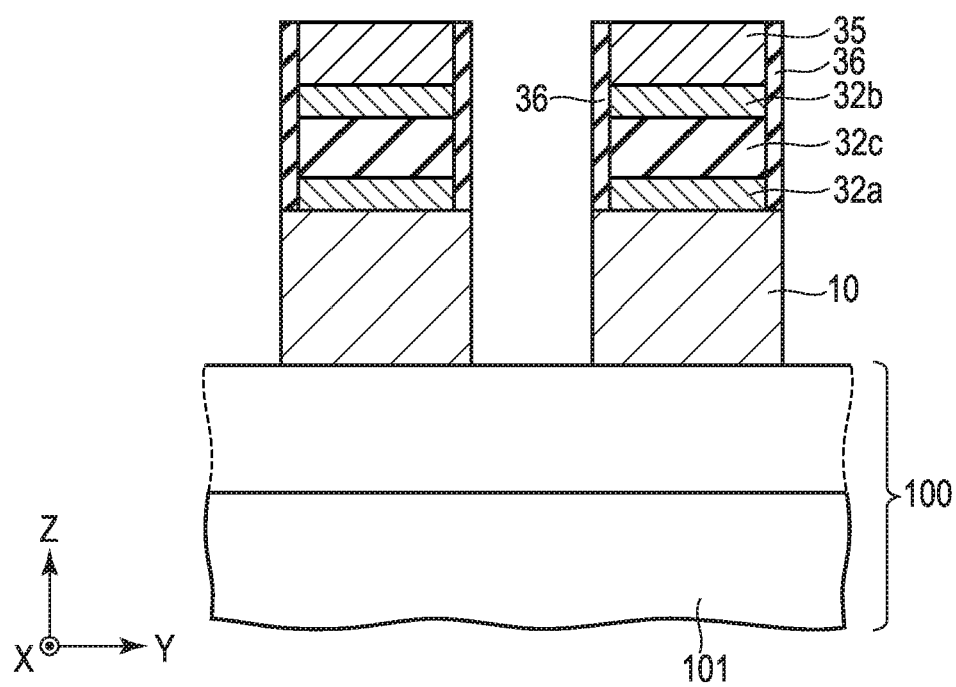
Figure 24B:
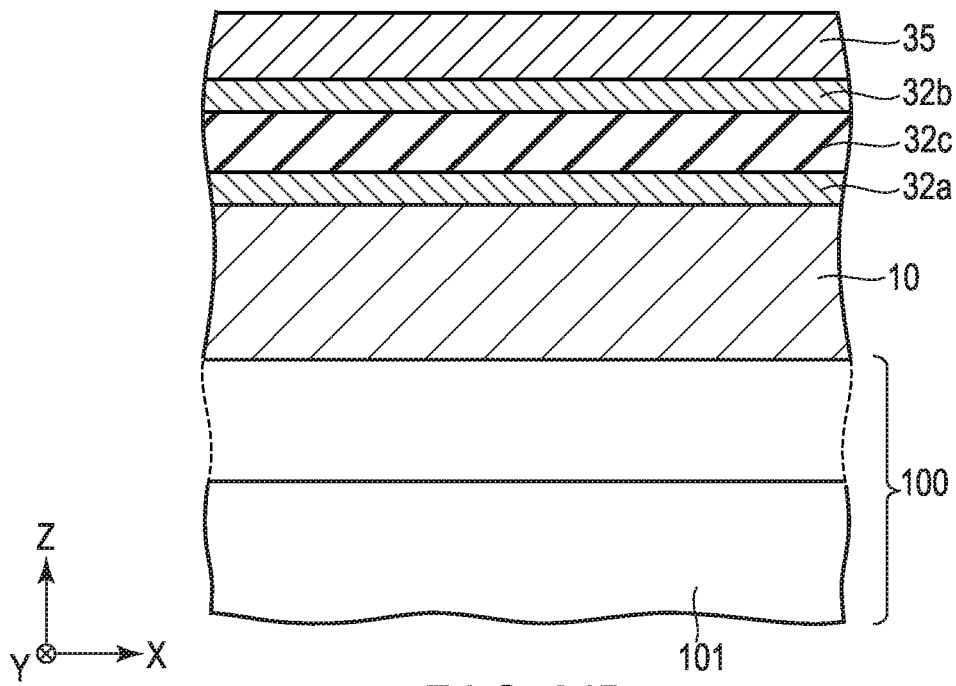

Each of FIG. 24A and FIG. 24B is a cross-sectional view schematically showing part of the manufacturing method of the magnetic memory device according to the third modification example of the second embodiment.

Each of FIG. 25A and FIG. 25B is a cross-sectional view schematically showing part of the manufacturing method of the magnetic memory device according to the third modification example of the second embodiment.

Figure 26B:
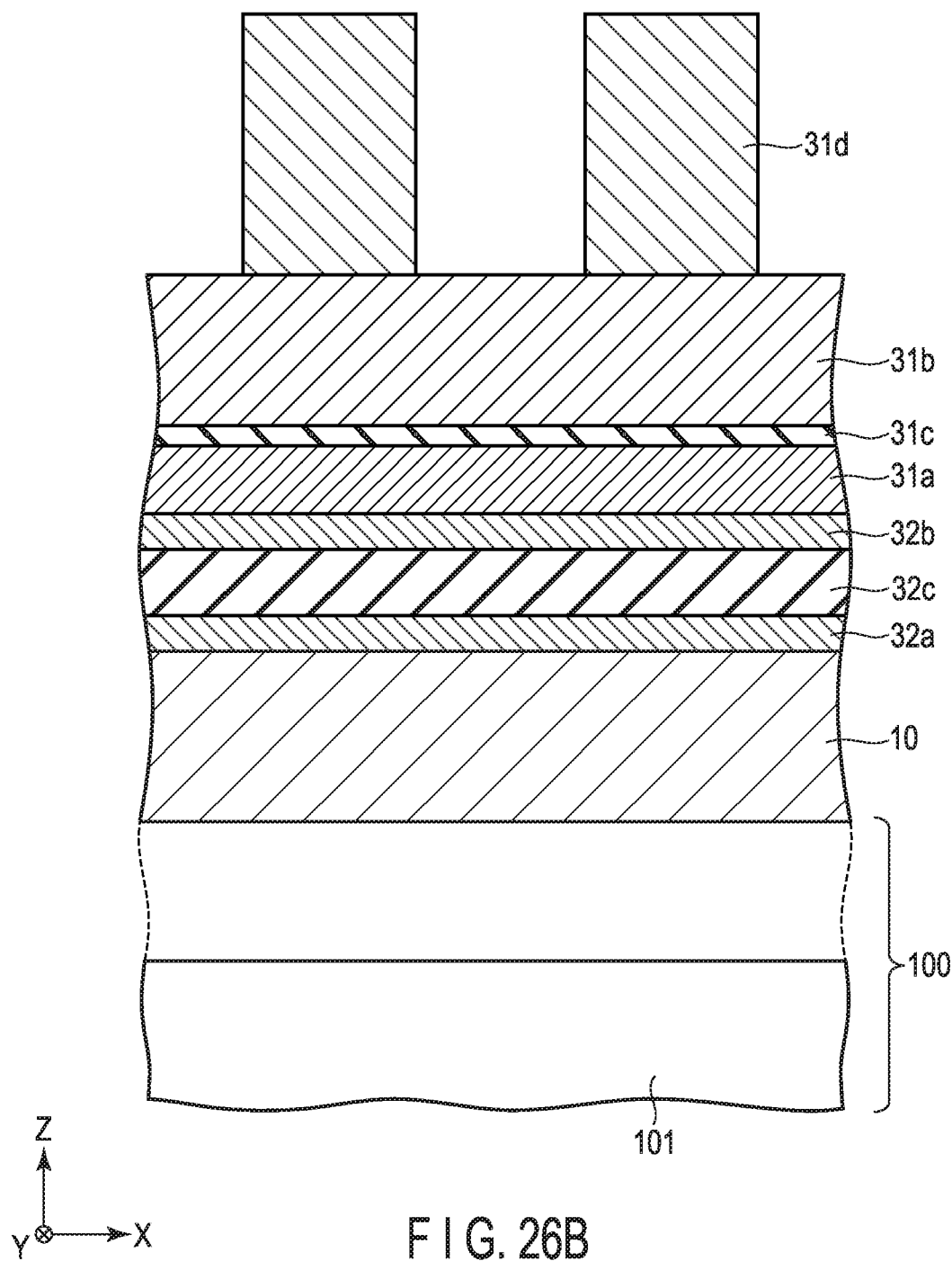

Each of FIG. 26A and FIG. 26B is a cross-sectional view schematically showing part of the manufacturing method of the magnetic memory device according to the third modification example of the second embodiment.

Figure 27A:
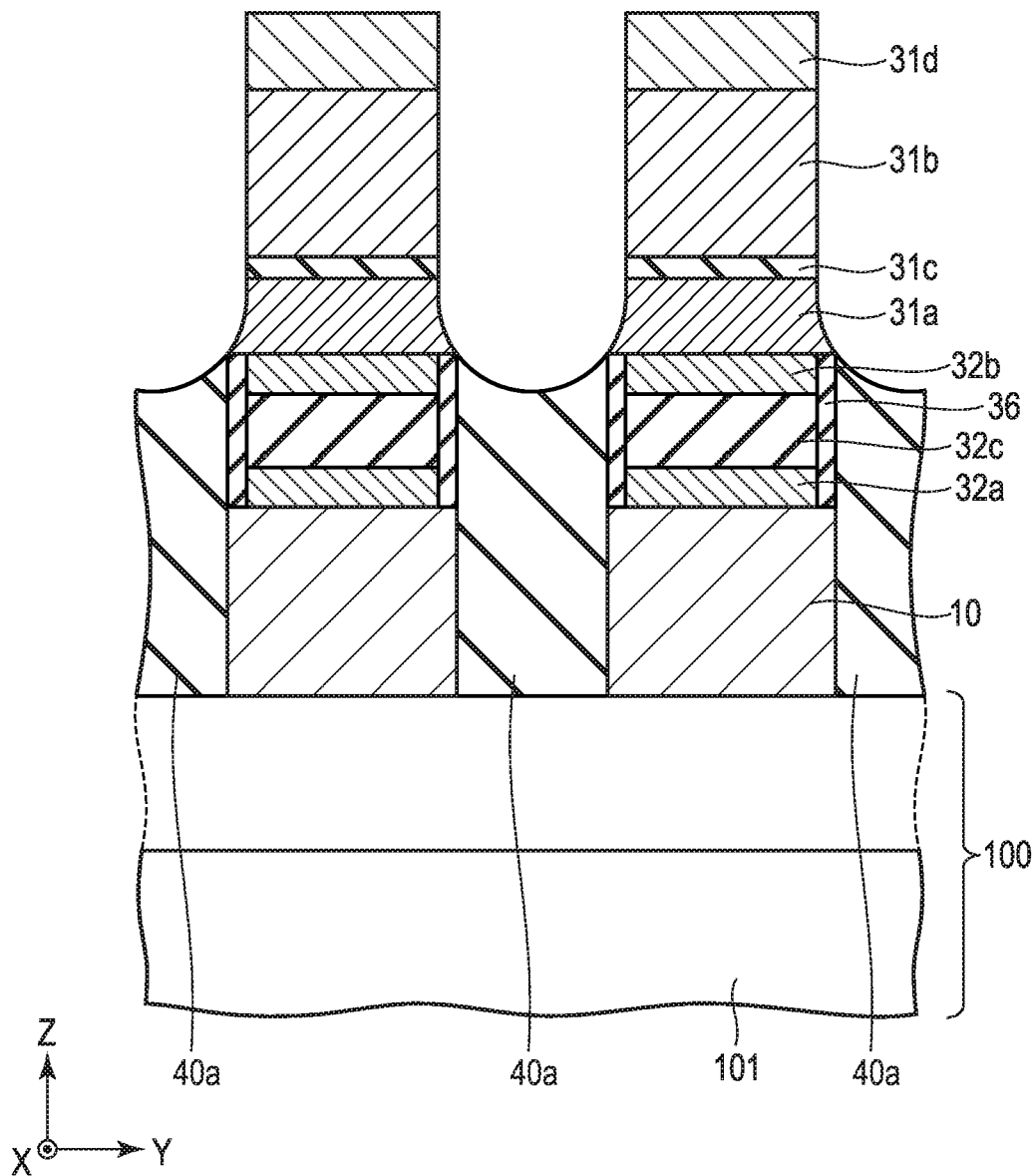
Figure 27B:
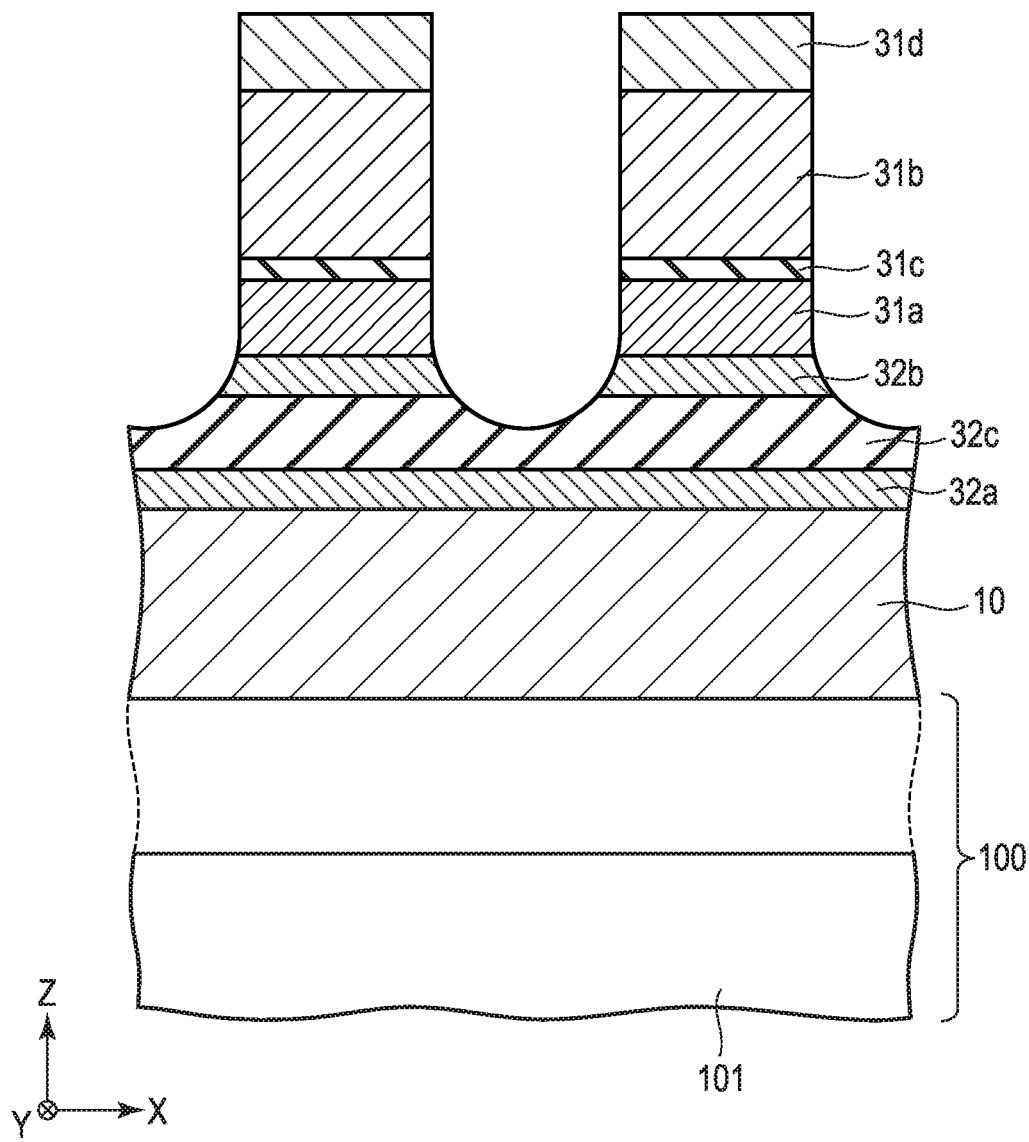

Each of FIG. 27A and FIG. 27B is a cross-sectional view schematically showing part of the manufacturing method of the magnetic memory device according to the third modification example of the second embodiment.

Figure 28A:
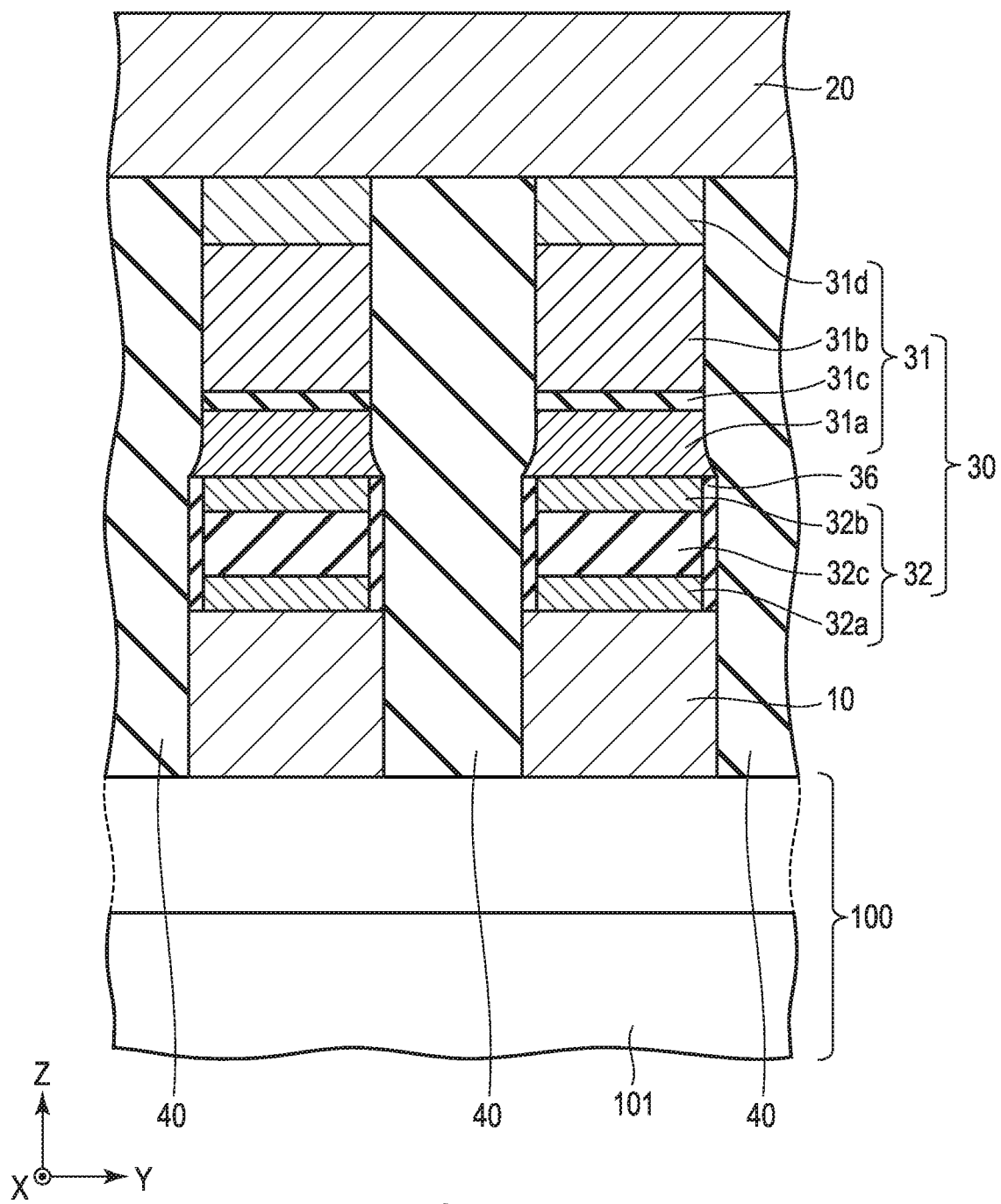
Figure 28B:
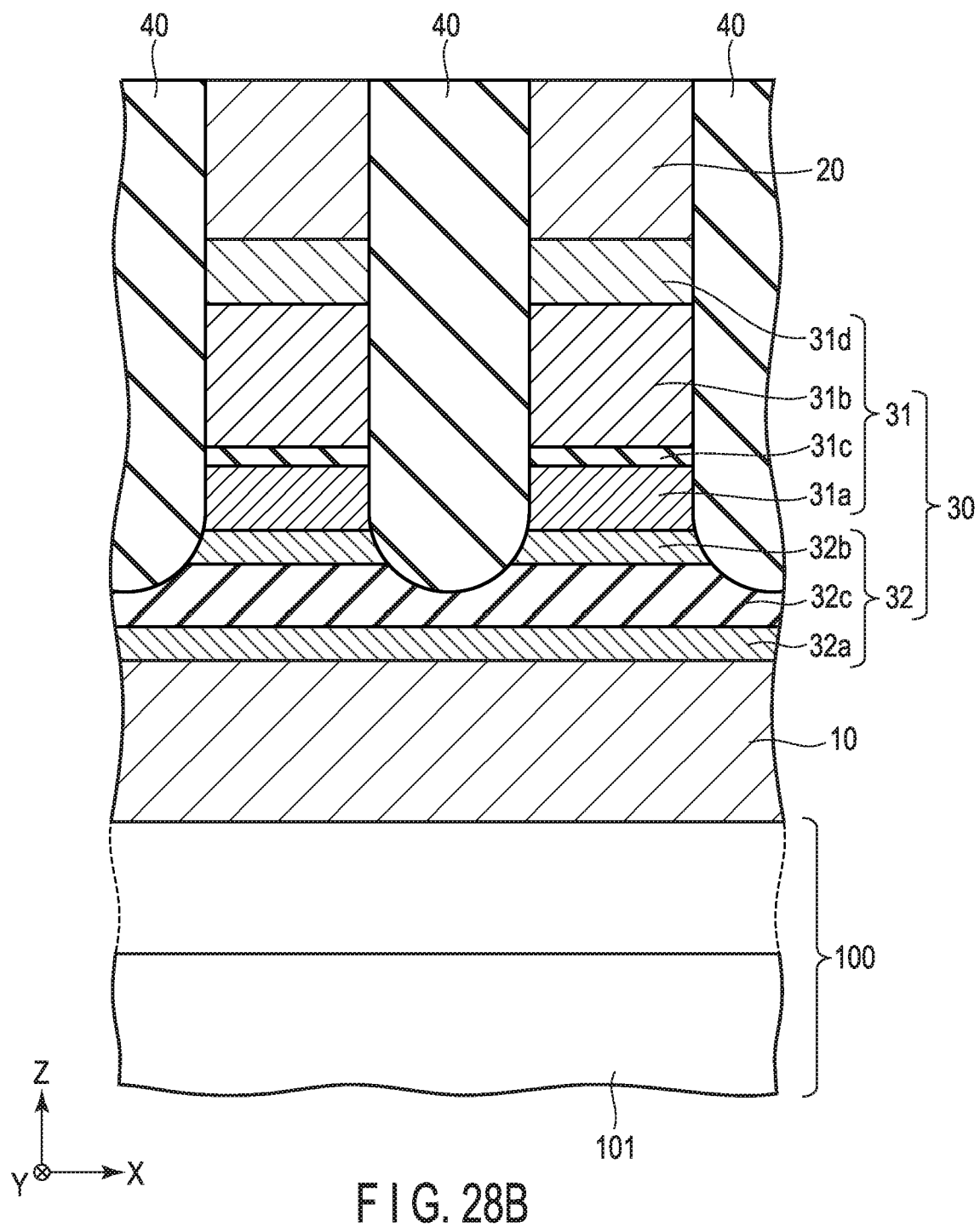

Each of FIG. 28A and FIG. 28B is a cross-sectional view schematically showing part of the manufacturing method of the magnetic memory device according to the third modification example of the second embodiment.

Figure 29A:
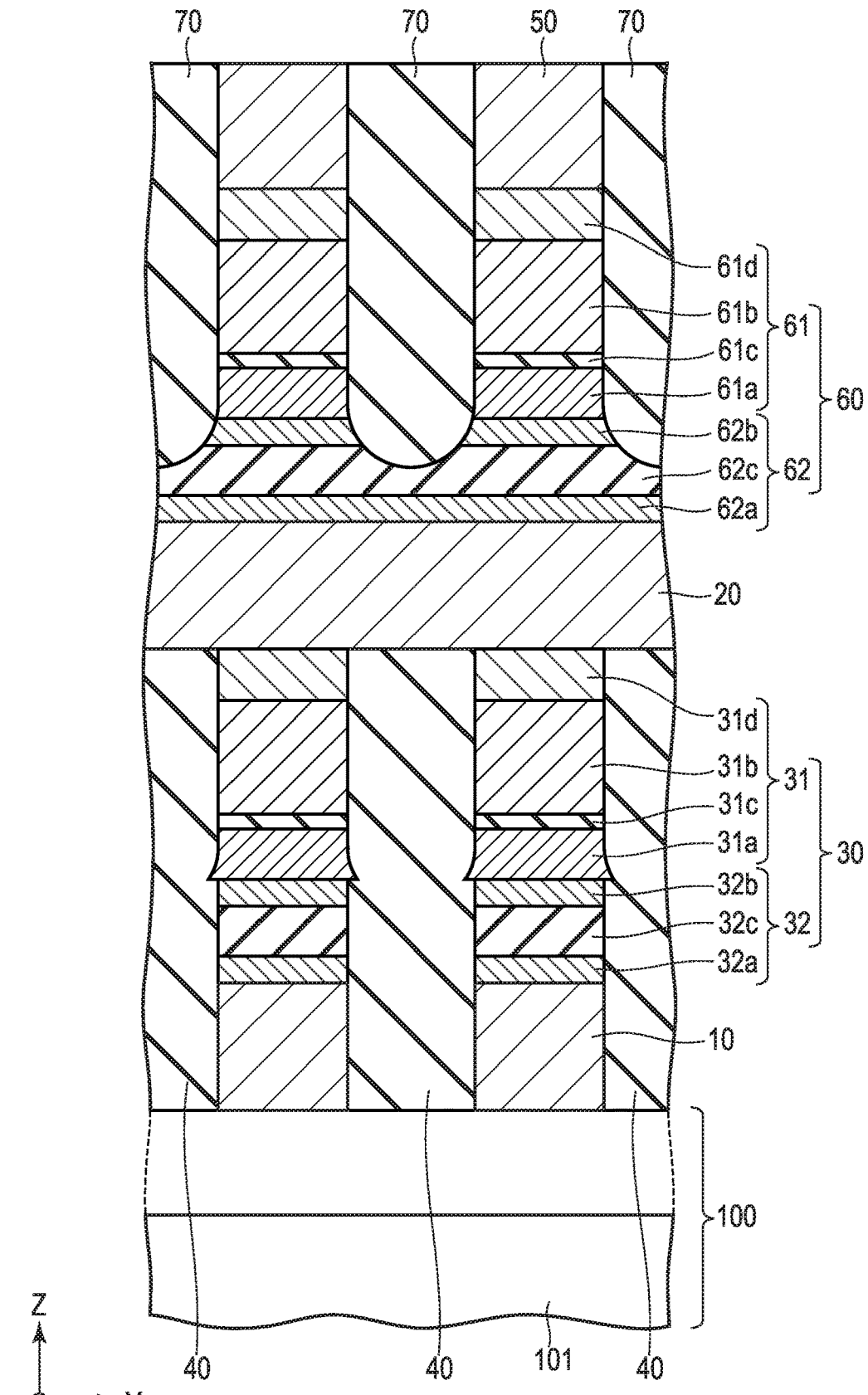
Figure 29B:
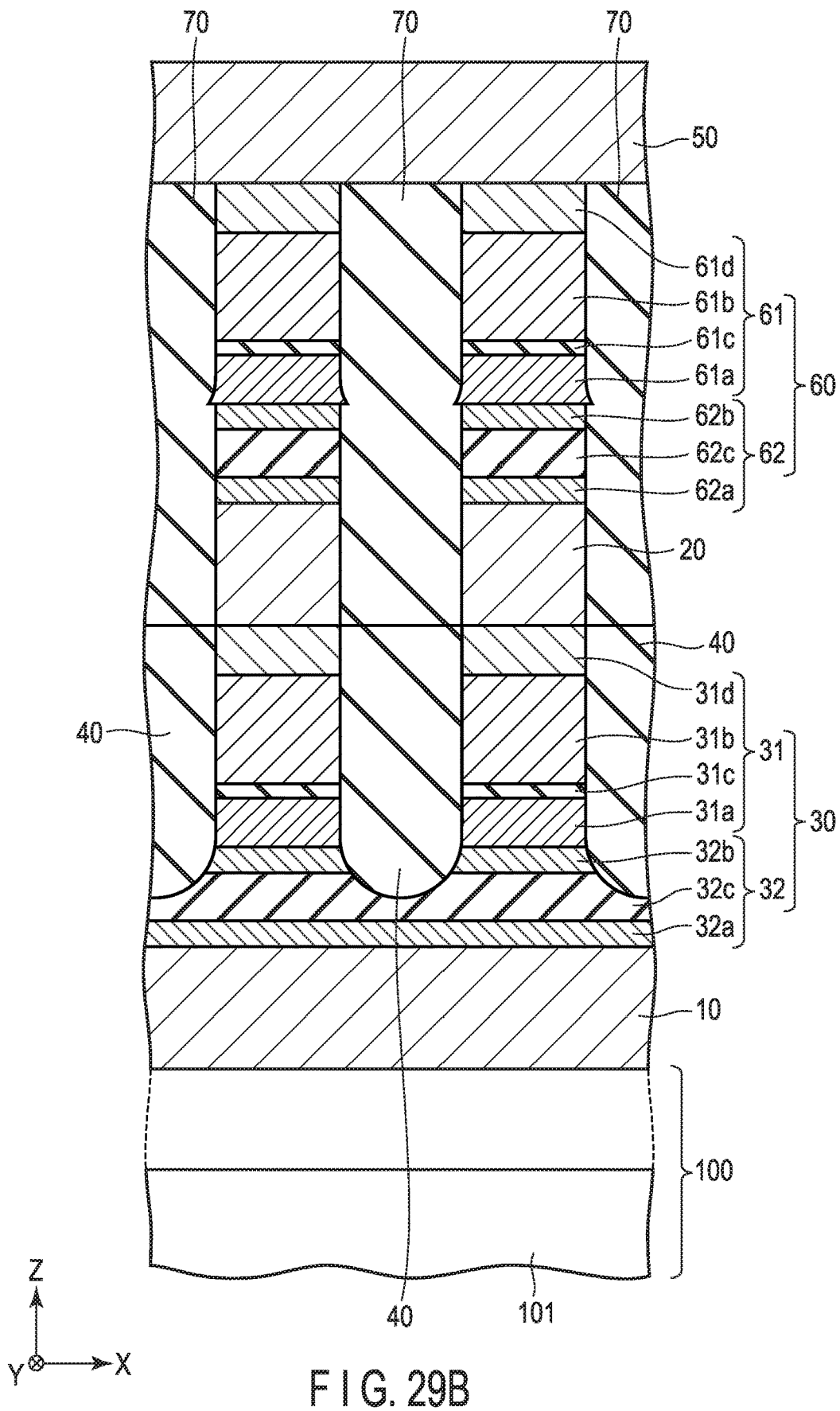

Each of FIG. 29A and FIG. 29B is a cross-sectional view schematically showing the configuration of a magnetic memory device according to a third embodiment.

Figure 30A:
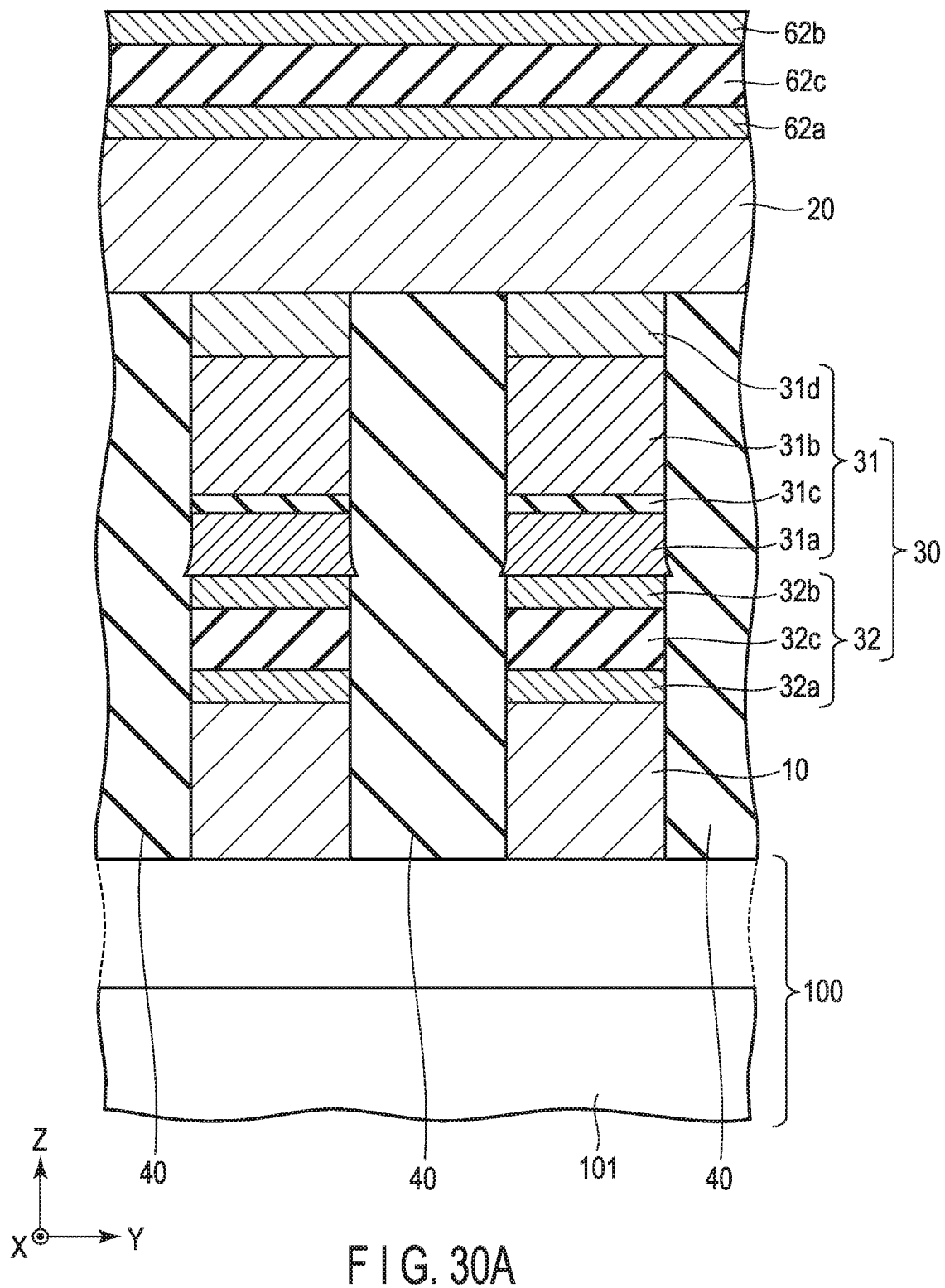
Figure 30B:
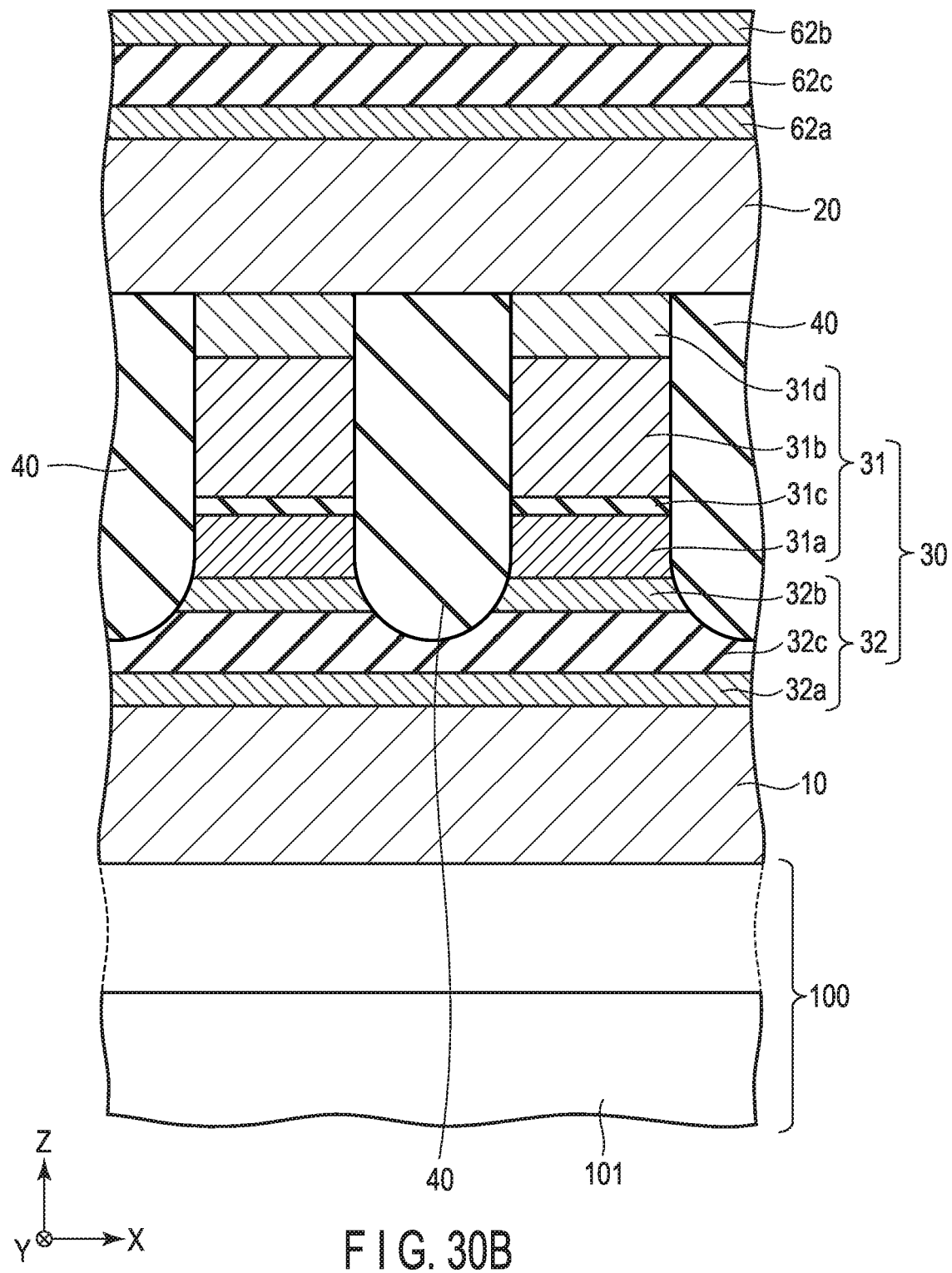

Each of FIG. 30A and FIG. 30B is a cross-sectional view schematically showing part of a manufacturing method of the magnetic memory device according to the third embodiment.

Figure 31A:
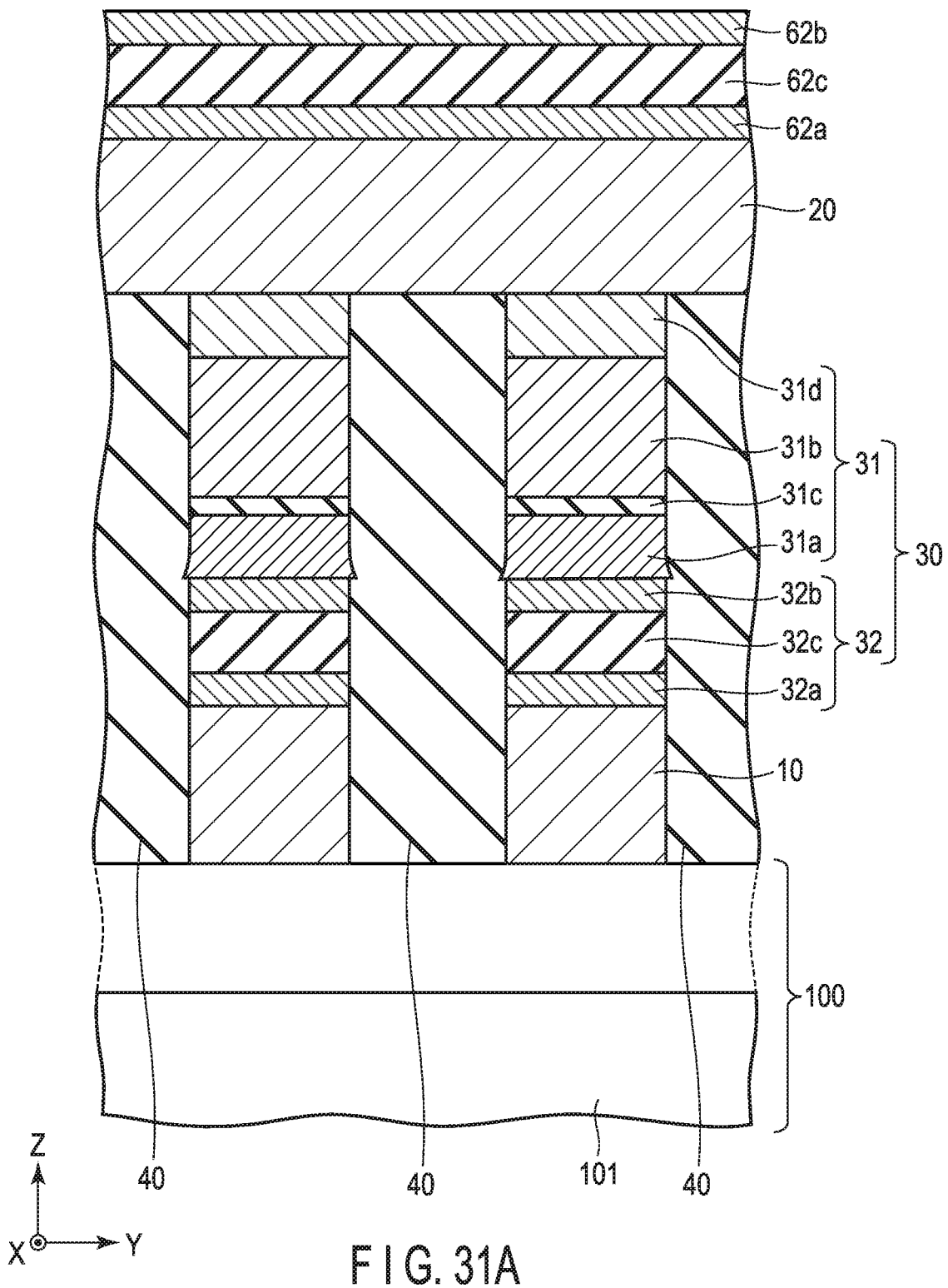
Figure 31B:
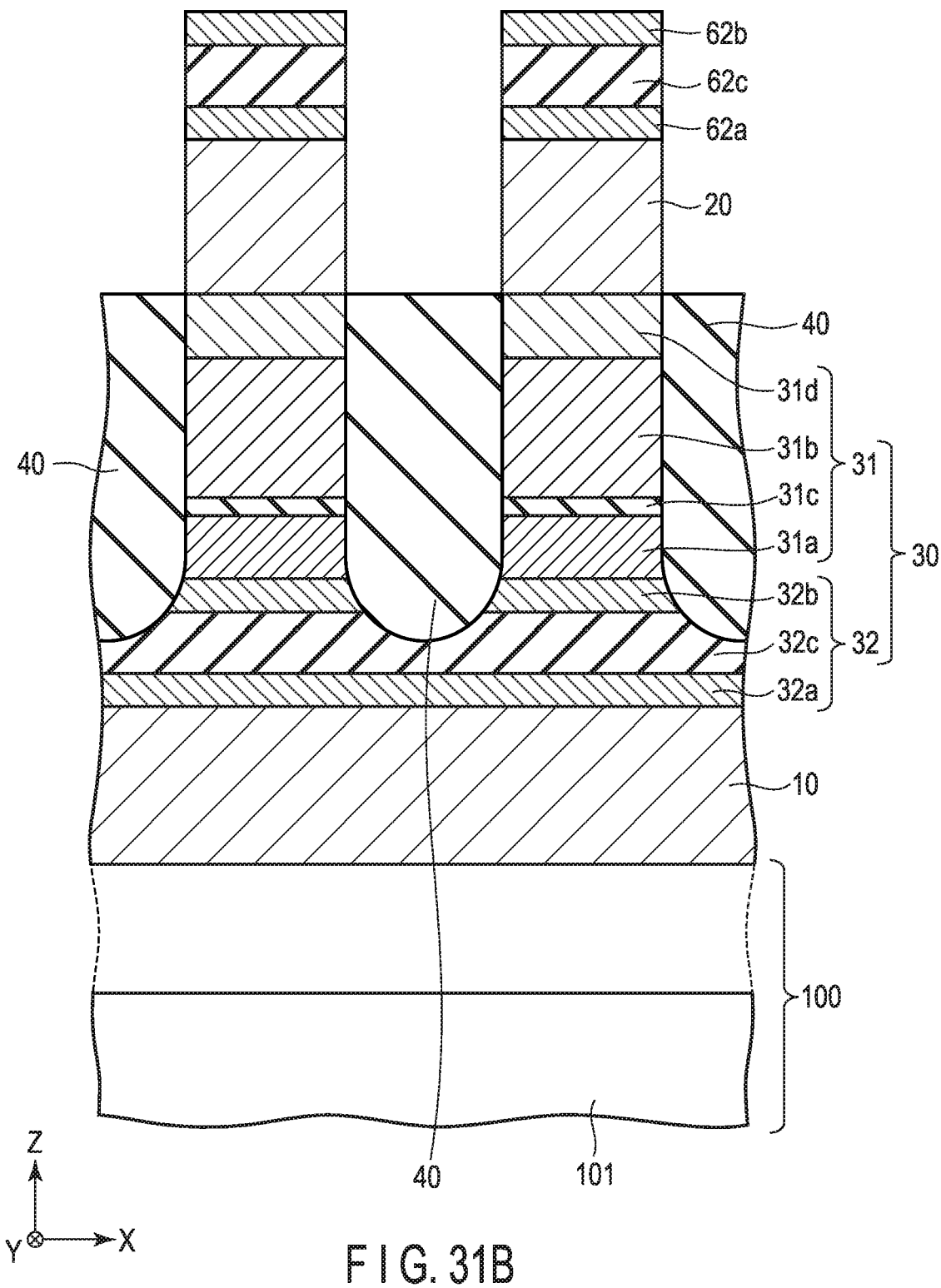

Each of FIG. 31A and FIG. 31B is a cross-sectional view schematically showing part of the manufacturing method of the magnetic memory device according to the third embodiment.

Figure 32A:
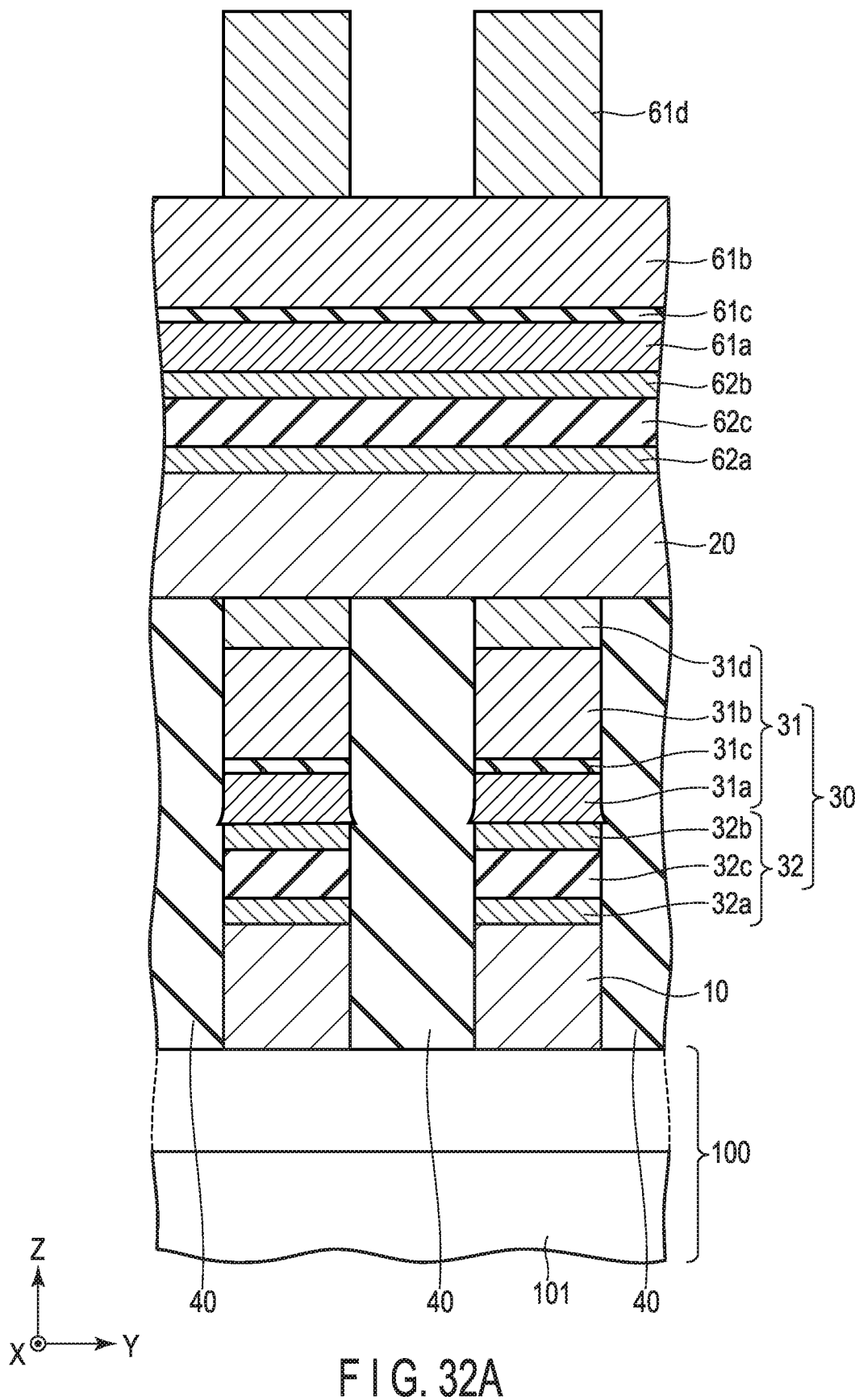
Figure 32B:
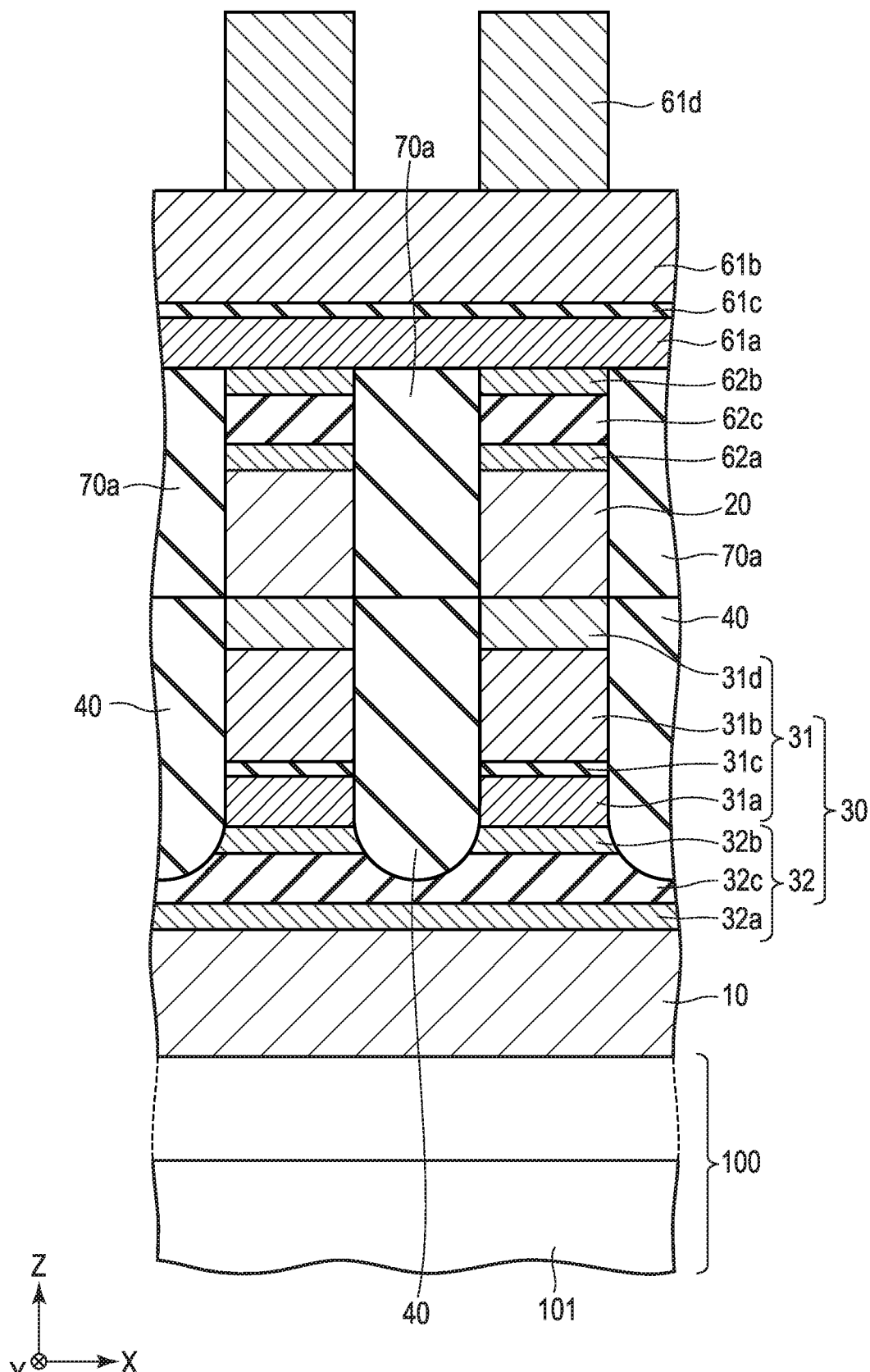

Each of FIG. 32A and FIG. 32B is a cross-sectional view schematically showing part of the manufacturing method of the magnetic memory device according to the third embodiment.

Figure 33B:
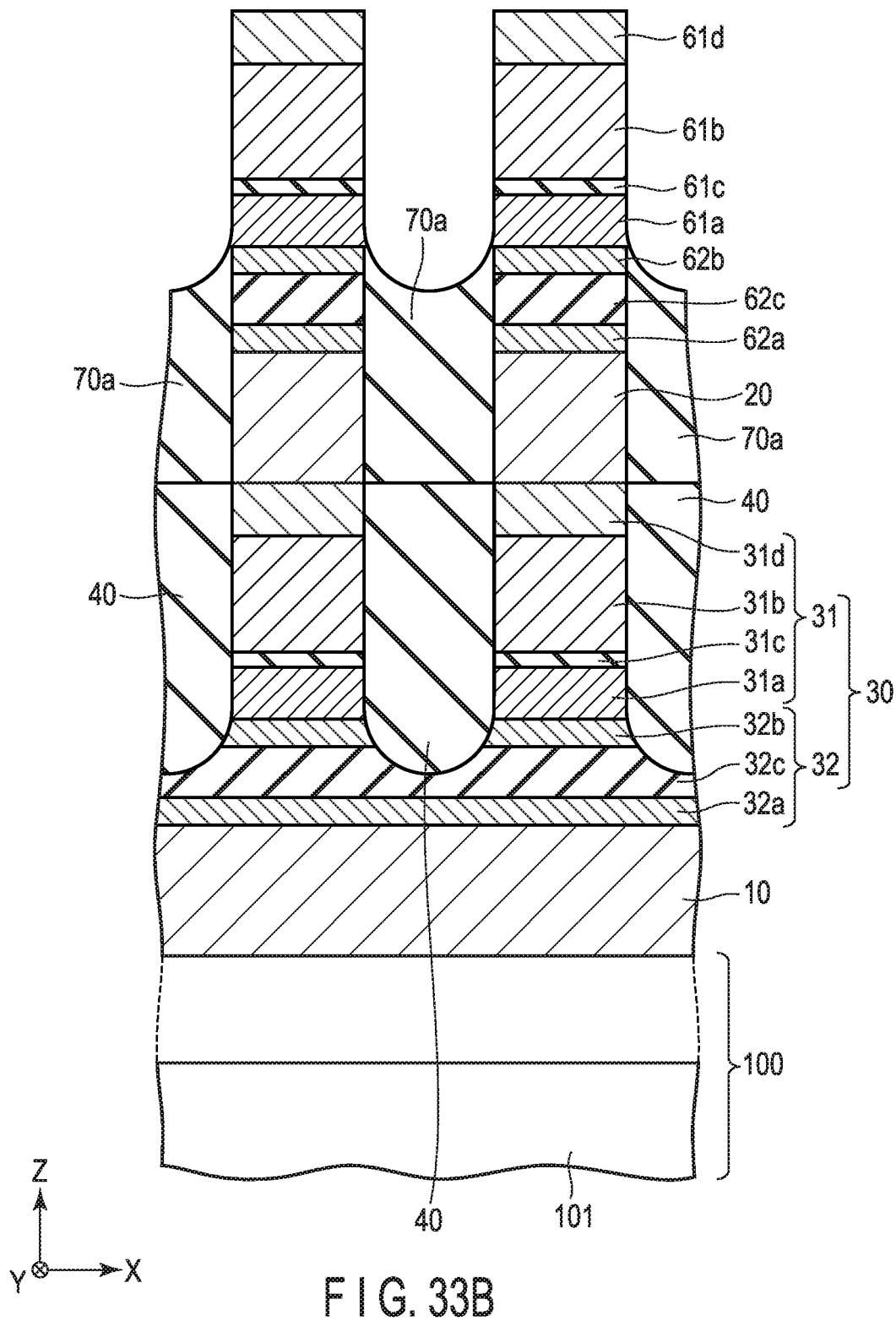

Each of FIG. 33A and FIG. 33B is a cross-sectional view schematically showing part of the manufacturing method of the magnetic memory device according to the third embodiment.

Figure 34A:
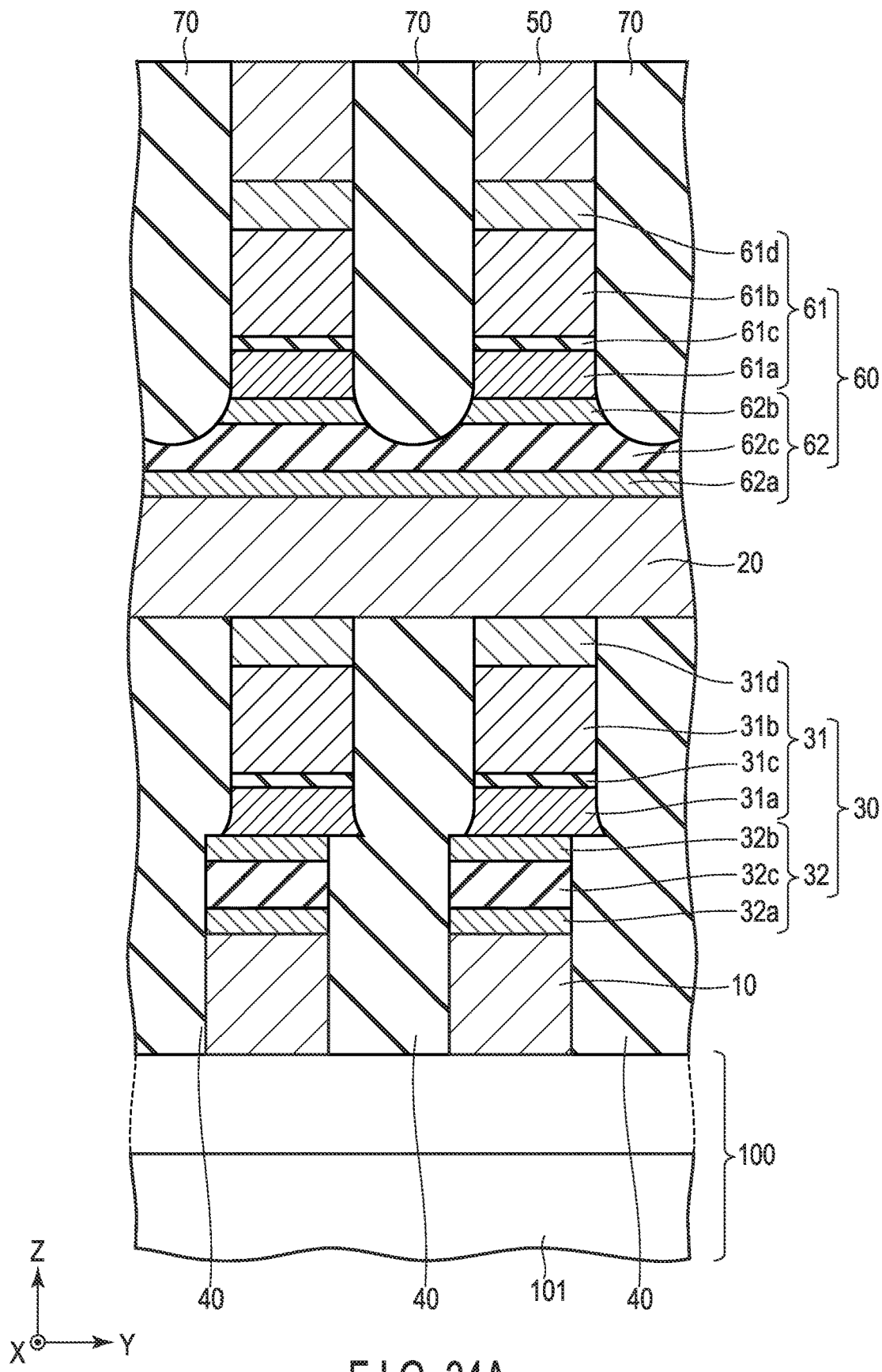
Figure 34B:
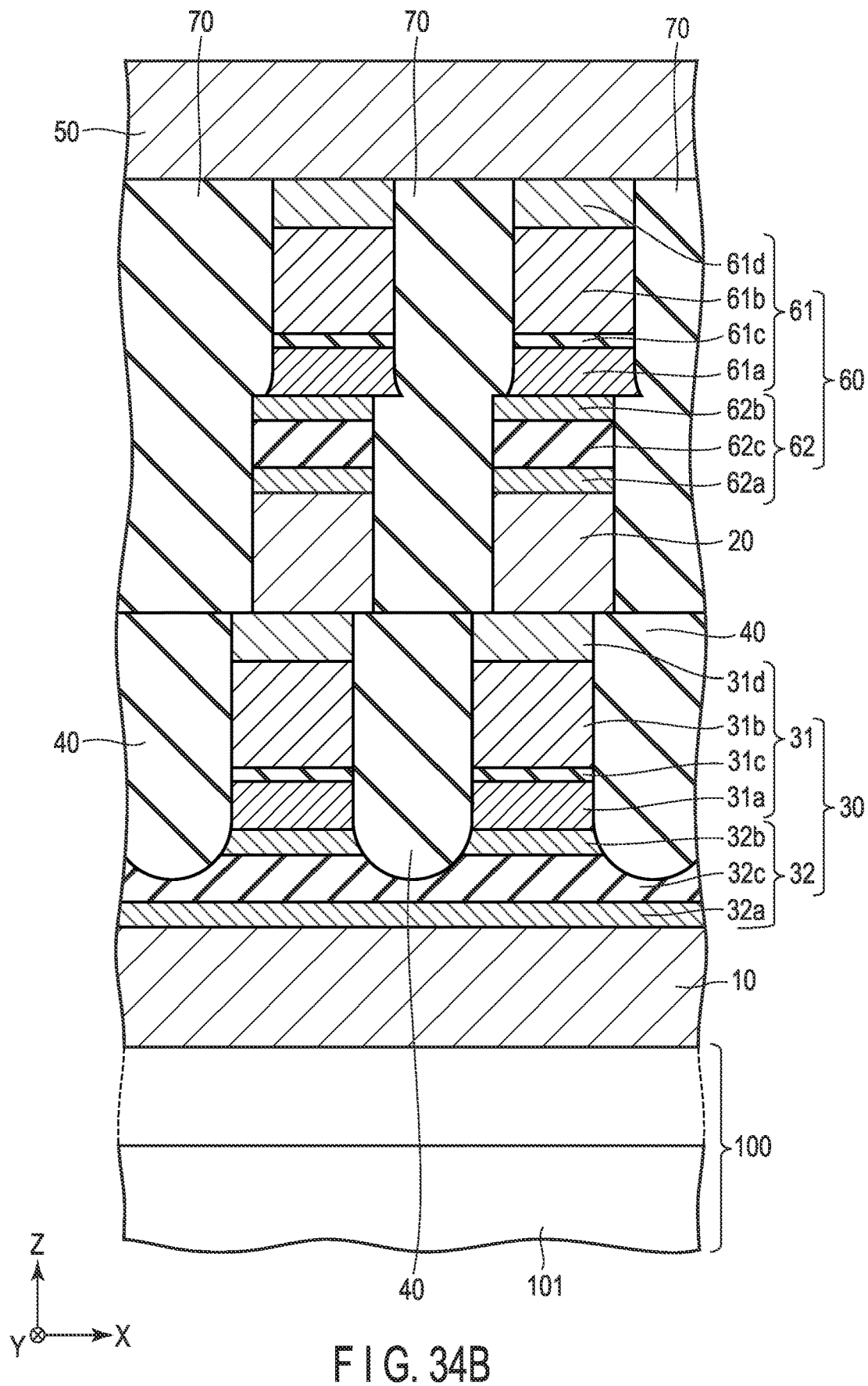

Each of FIG. 34A and FIG. 34B is a cross-sectional view schematically showing the configuration of the magnetic memory device according to the third embodiment of a case of an occurrence of misalignment.

DETAILED DESCRIPTION

In general, according to one embodiment, a magnetic memory device includes: a plurality of first wirings each extending in a first direction; a plurality of second wirings each extending in a second direction intersecting the first direction; and a plurality of first memory cells provided between the plurality of first wirings and the plurality of second wirings, and each including a first switching element and a first magnetoresistance effect element connected in series to each other, the first switching element being connected to a corresponding first wiring, and the first magnetoresistance effect element being connected to a corresponding second wiring, wherein the first switching element includes a first bottom electrode provided on the first wiring side, a first top electrode provided on the first magnetoresistance effect element side, and a first switching material layer provided between the first bottom electrode and the first top electrode, and the first bottom electrode included in each of the first memory cells adjacent to each other in the first direction is continuously provided on the first wiring connecting the first memory cells adjacent to each other in the first direction.

Embodiments will be described hereinafter with reference to the accompanying drawings.

Embodiment 1

Figure 1:
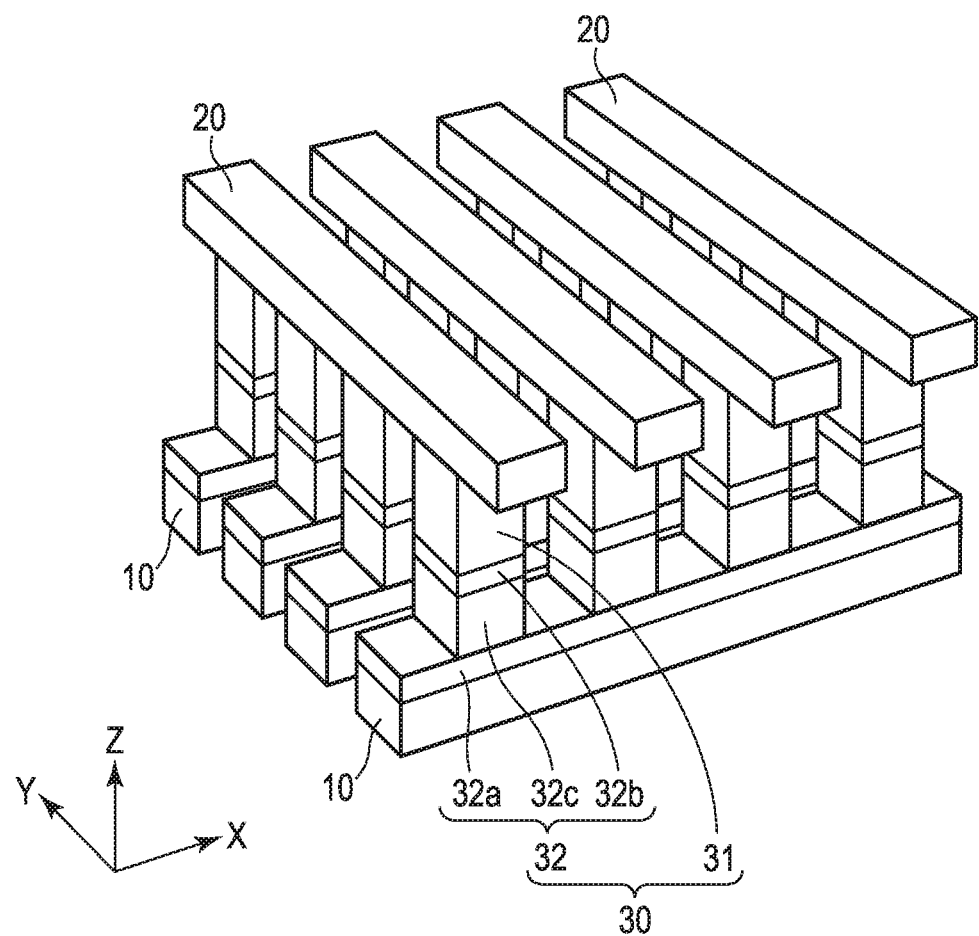
FIG. 1 is a perspective view schematically showing the fundamental configuration of a magnetic memory device according to a first embodiment.
Figure 2A:
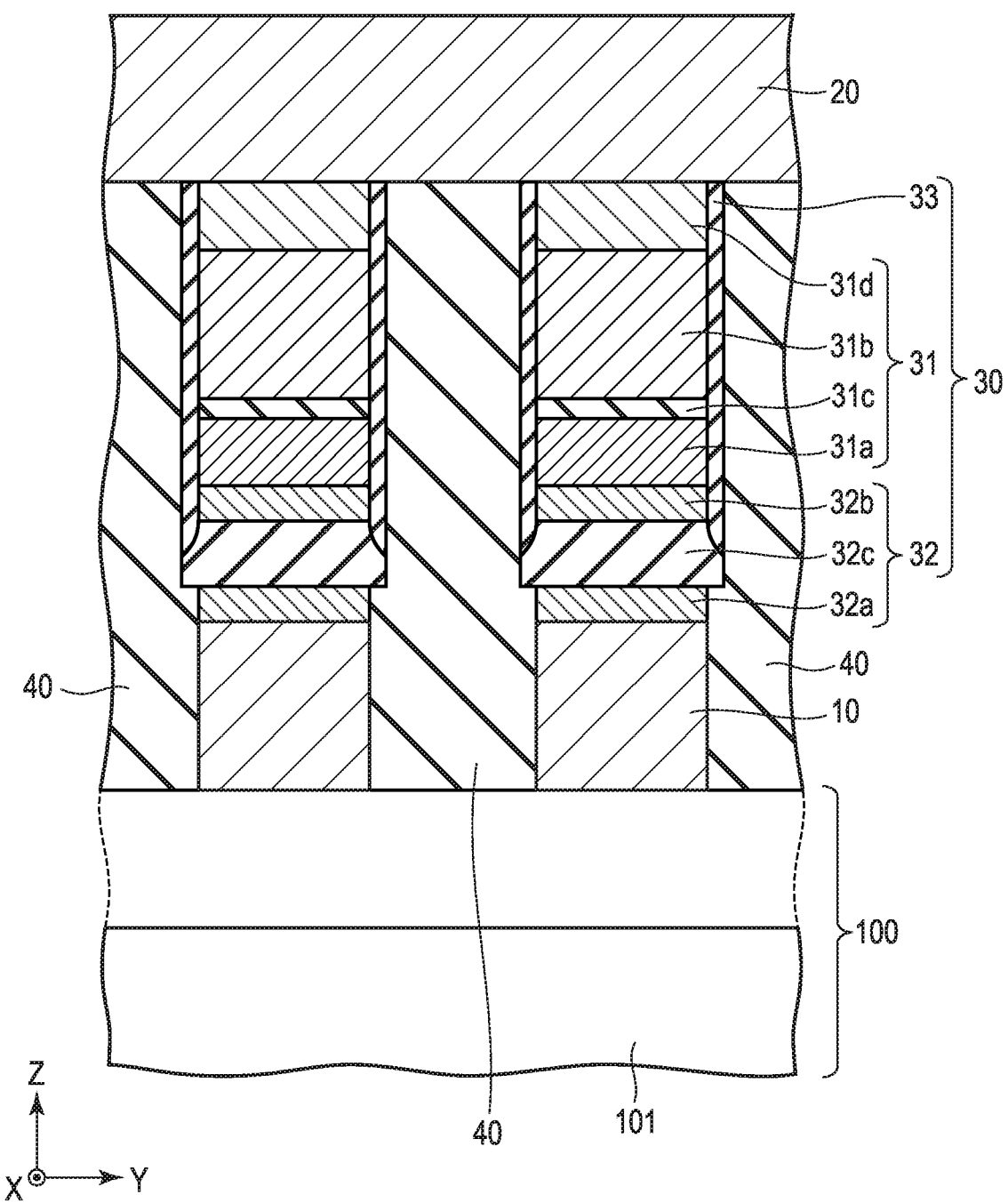
FIG. 2B is a cross-sectional view schematically showing the configuration of the magnetic memory device according to the first embodiment.
Figure 2B:
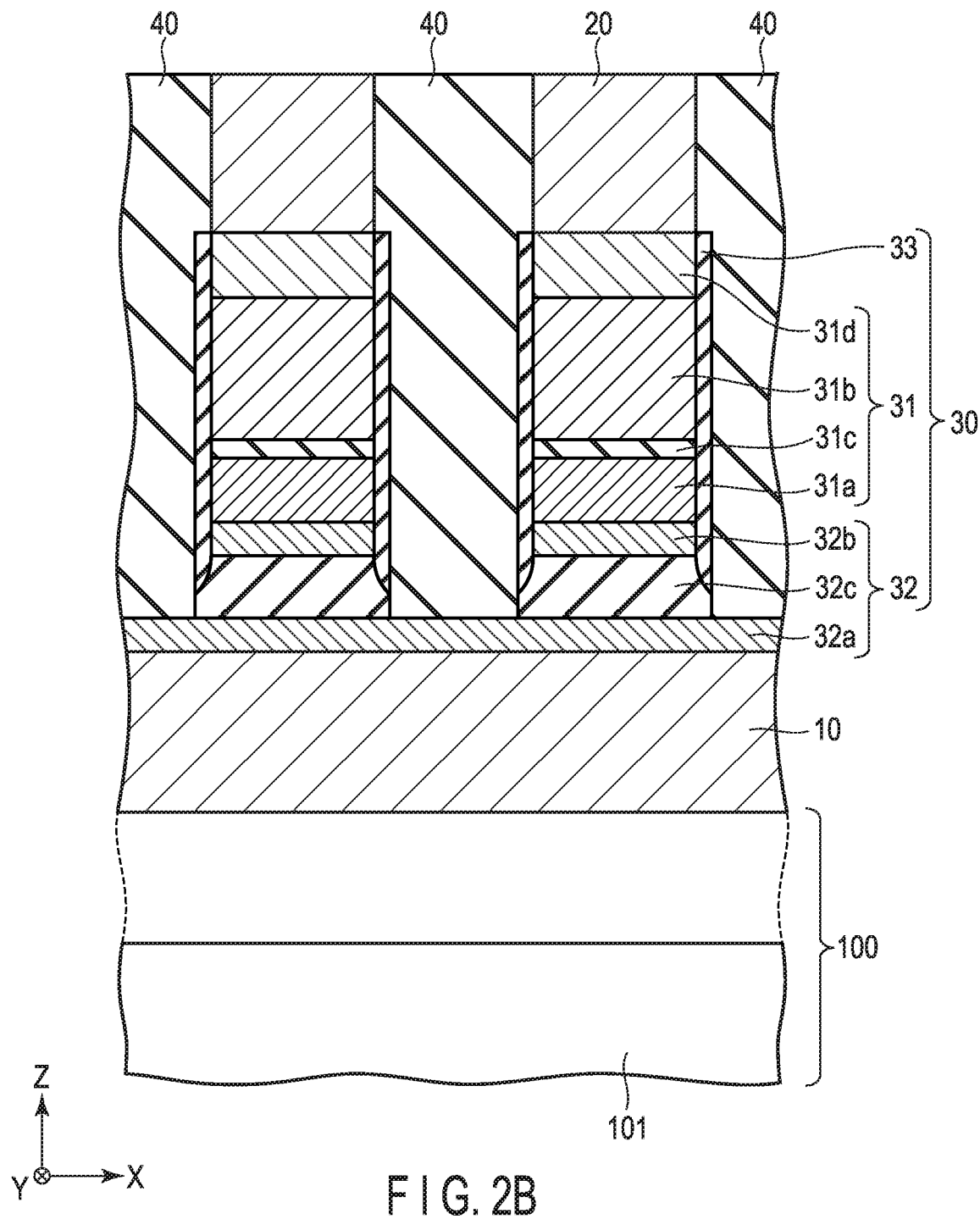

FIG. 1 is a perspective view schematically showing the fundamental configuration of a nonvolatile magnetic memory device according to a first embodiment. FIG. 2A is a cross-sectional view (cross-sectional view in the Y direction) schematically showing the configuration of the nonvolatile magnetic memory device according to the first embodiment. FIG. 2B is a cross-sectional view (cross-sectional view in the X direction) schematically showing the configuration of the nonvolatile magnetic memory device according to the first embodiment. It should be noted that in each of FIGS. 1, 2A, and 2B, the X direction (first direction), Y direction (second direction), and Z direction (third direction) intersect each other. More specifically, the X direction (first direction), Y direction (second direction), and Z direction (third direction) are perpendicular to each other.

The magnetic memory device of this embodiment is provided with a plurality of first wirings 10 each extending in the X direction, a plurality of second wirings 20 each extending in the Y direction, and a plurality of memory cells 30 arranged between the plurality of first wirings 10 and the plurality of second wirings 20. These first wirings 10, second wirings 20, and memory cells 30 are surrounded with an interlayer insulating film 40. These first wirings 10, second wirings 20, memory cells 30, and interlayer insulating film 40 are provided on a foundation area 100 including a semiconductor substrate 101.

The first wiring 10 and second wiring 20 are each formed of a metal such as tungsten (W), molybdenum (Mo) or the like. One of the first wiring 10 and second wiring 20 functions as a word line, and the other of the first wiring 10 and second wiring 20 functions as a bit line.

Each memory cell 30 includes a magnetoresistance effect element 31, selector (switching element) 32, and sidewall insulating layer 33. The magnetoresistance effect element 31 and selector 32 are connected to each other in series. One end of the magnetoresistance effect element 31 is connected to the second wiring 20 and the other end of the magnetoresistance effect element 31 is connected to the selector 32. One end of the selector 32 is connected to the first wiring 10 and the other end of the selector 32 is connected to the magnetoresistance effect element 31.

In each of this embodiment and the other embodiments, a description will be given of a case where a magnetic tunnel junction (MTJ) element is used as the magnetoresistance effect element 31. The magnetoresistance effect element 31 includes a storage layer (first magnetic layer) 31a, reference layer (second magnetic layer) 31b, and tunnel barrier layer (nonmagnetic layer) 31c provided between the storage layer 31a and reference layer 31b. On the reference layer 31b, a hard mask layer 31d is provided. In the magnetoresistance effect element 31, a shift cancelling layer for cancelling a magnetic field to be applied from the reference layer 31b to the storage layer 31a may further be provided.

The storage layer 31a is a ferromagnetic layer having a variable magnetization direction, and is formed of a CoFeB layer containing therein, for example, cobalt (Co), iron (Fe), and boron (B). It should be noted that the variable magnetization direction implies the magnetization direction varying with respect to a predetermined write current.

The reference layer 31b is a ferromagnetic layer having a fixed magnetization direction, and is formed of a CoFeB layer containing therein cobalt (Co), iron (Fe), and boron (B), and superlattice layer of cobalt (Co) and a predetermined element selected from the group of platinum (Pt), nickel (Ni), and palladium (Pd). It should be noted that the fixed magnetization direction implies the magnetization direction unchangeable with respect to a predetermined write current.

The tunnel barrier layer 31c is an insulating layer interposed between the storage layer 31a and reference layer 31b, and is formed of a MgO layer containing therein, for example, magnesium (Mg) and oxygen (O).

When the magnetization direction of the storage layer 31a is parallel with the magnetization direction of the reference layer 31b, the magnetoresistance effect element 31 is in the low-resistance state. When the magnetization direction of the storage layer 31a is antiparallel with the magnetization direction of the reference layer 31b, the magnetoresistance effect element 31 is in the high-resistance state. Accordingly, it is possible to store binary data according to the resistance state of the magnetoresistance effect element 31. Further, it is possible to set the low-resistance state or high-resistance state to the magnetoresistance effect element 31 according to the direction of the current flowing through the magnetoresistance effect element 31.

The above-described magnetoresistance effect element 31 is a spin transfer torque (STT) type magnetoresistance effect element and has perpendicular magnetization. That is, the storage layer 31a has a magnetization direction perpendicular to the film surface thereof and reference layer 31b has a magnetization direction perpendicular to the film surface thereof.

The selector 32 includes a bottom electrode 32a provided on the first wiring 10 side, top electrode 32b provided on the magnetoresistance effect element 31 side, and selector material layer (switching material layer) 32c provided between the bottom electrode 32a and top electrode 32b. The bottom electrode 32a and top electrode 32b are formed of titanium nitride (TiN), tungsten nitride (WN), carbon (C) or the like. The selector material layer 32c is formed of a material constituted of an insulant and contains therein a group 15 element introduced thereinto by ion implantation. For example, arsenic (As) or germanium (Ge) is contained therein. The insulant contains therein nitride and/or oxide and contains therein, for example, silicon nitride (SiN), hafnium oxide (HfO$_x$), silicon oxide (SiO$_2$) or a material substantially formed of SiO$_2$.

The selector 32 is a two-terminal type switching element and, when a voltage applied between the two terminals is less than the threshold, the selector 32 is in the high-resistance state, e.g., an electrically non-conductive state and, when the voltage applied between the two terminals is higher than or equal to the threshold, the state changes to the low-resistance state, e.g., an electrically conductive state.

Figure 3:
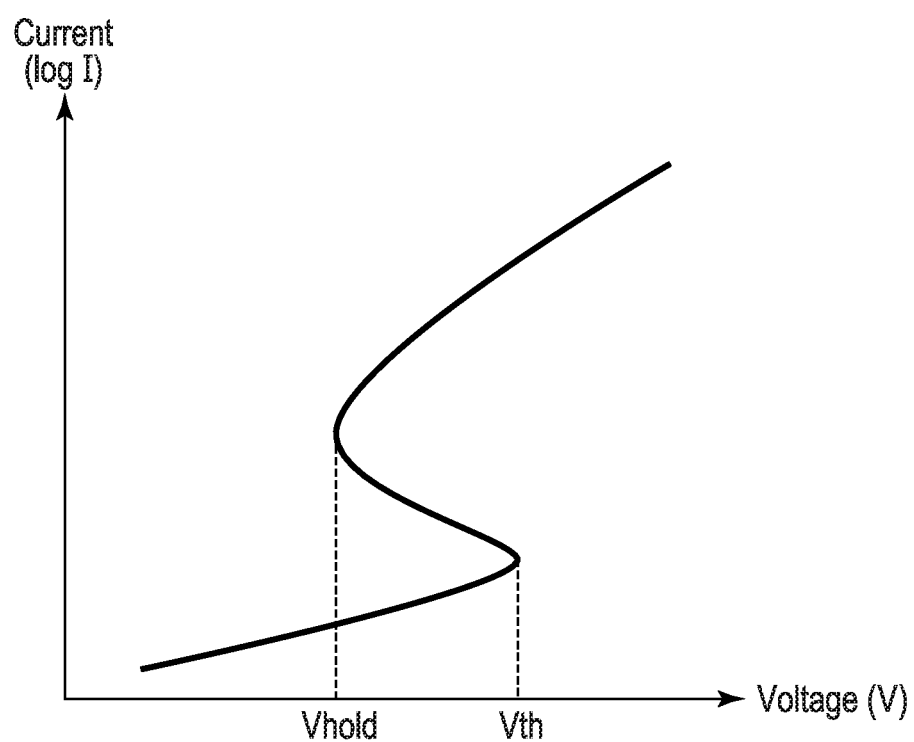
FIG. 3 is a view schematically showing the current-voltage characteristics of a selector according to the first embodiment.

FIG. 3 is a view schematically showing the current-voltage characteristics of the selector. The selector 32 has the characteristics in which when the voltage between the two terminals reaches the threshold voltage Vth, the voltage between the two terminals lowers to the hold voltage Vhold and the current abruptly increases.

By applying a voltage higher than or equal to a predetermined voltage between the first wiring 10 and second wiring 20, the selector enters the on-state (conductive state), whereby it becomes possible to carry out write (write of the resistance state) or read (read of the resistance state) to or from the magnetoresistance effect element 31 connected in series to the selector 32.

As shown in FIGS. 1, 2A and 2B, in this embodiment, the bottom electrode 32a of the selector 32 included in each of the memory cells 30 adjacent to each other in the X direction is continuously provided on the first wiring 10 connecting the memory cells 30 adjacent to each other in the X direction to each other. More specifically, when viewed from the Z direction, the pattern of the bottom electrode 32a continuously provided on the above-described first wiring 10 coincides with the pattern of the above-described first wiring 10.

Further, in this embodiment, the selector material layers 32c included in the memory cells 30 adjacent to each other in the X direction are separate from each other in the area between the memory cells 30 adjacent to each other in the X direction, and selector material layers 32c included in the memory cells 30 adjacent to each other in the Y direction are separate from each other in the area between the memory cells 30 adjacent to each other in the Y direction. On the sidewalls of the top electrode 32b and selector material layer 32c of the selector 32 and sidewall of the magnetoresistance effect element 31, a sidewall insulating layer 33 is provided.

The sidewall insulating layer 33 is formed of silicon nitride (SiN) and has a function of protecting the magnetoresistance effect element 31 at the time of reactive ion etching (RIE).

Next, a manufacturing method of the magnetic memory device according to this embodiment will be described below with reference to FIGS. 4A and 4B to 9A and 9B. FIGS. 4A to 9A are cross-sectional views in the Y direction, and FIGS. 4B to 9B are cross-sectional views in the X direction.

Figure 4A:
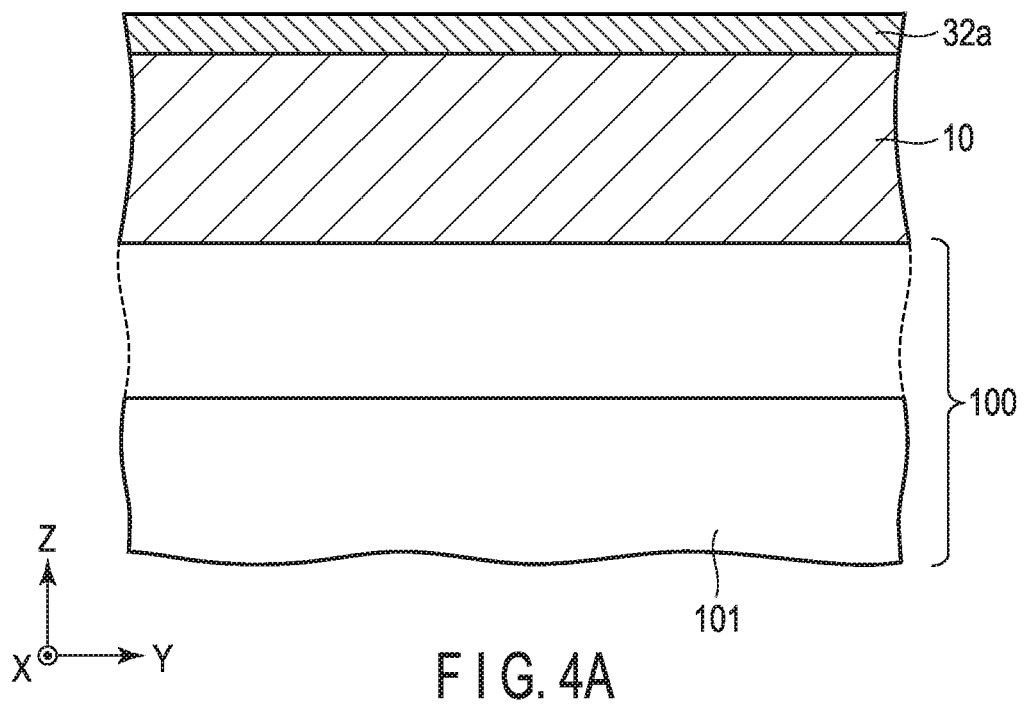
FIG. 4B is a cross-sectional view schematically showing part of a manufacturing method of the magnetic memory device according to the first embodiment.
Figure 4B:
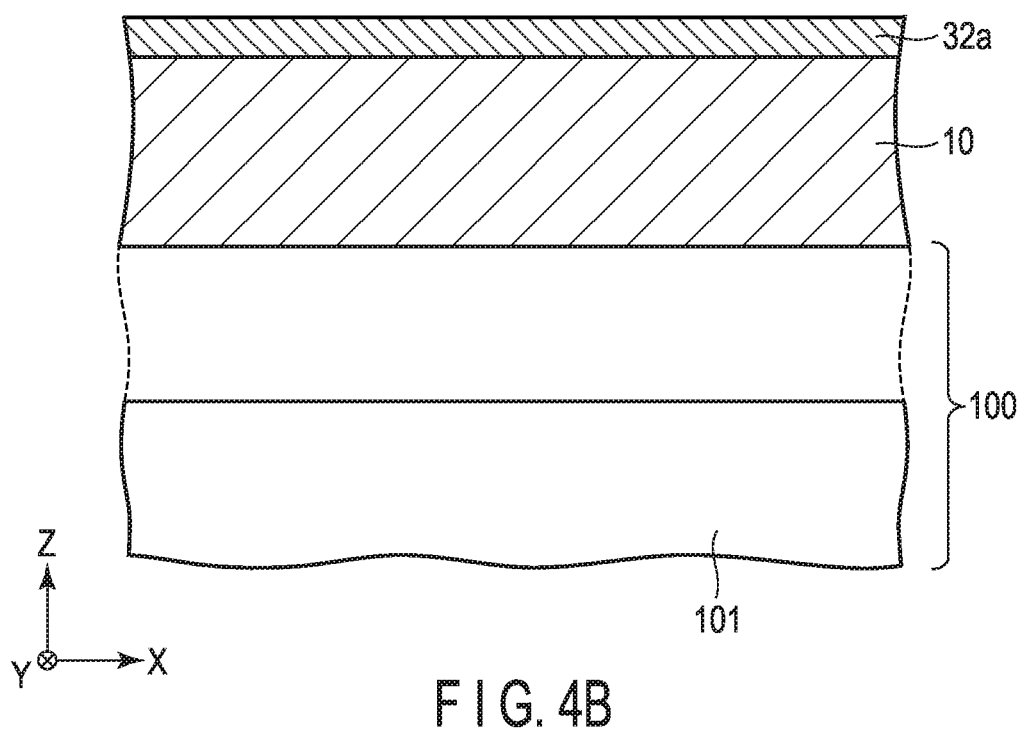

First, as shown in FIG. 4A and FIG. 4B, a layer for the first wirings 10 and layer for the bottom electrodes 32a of the selectors are formed on the foundation area 100 including the semiconductor substrate 101.

Figure 5A:
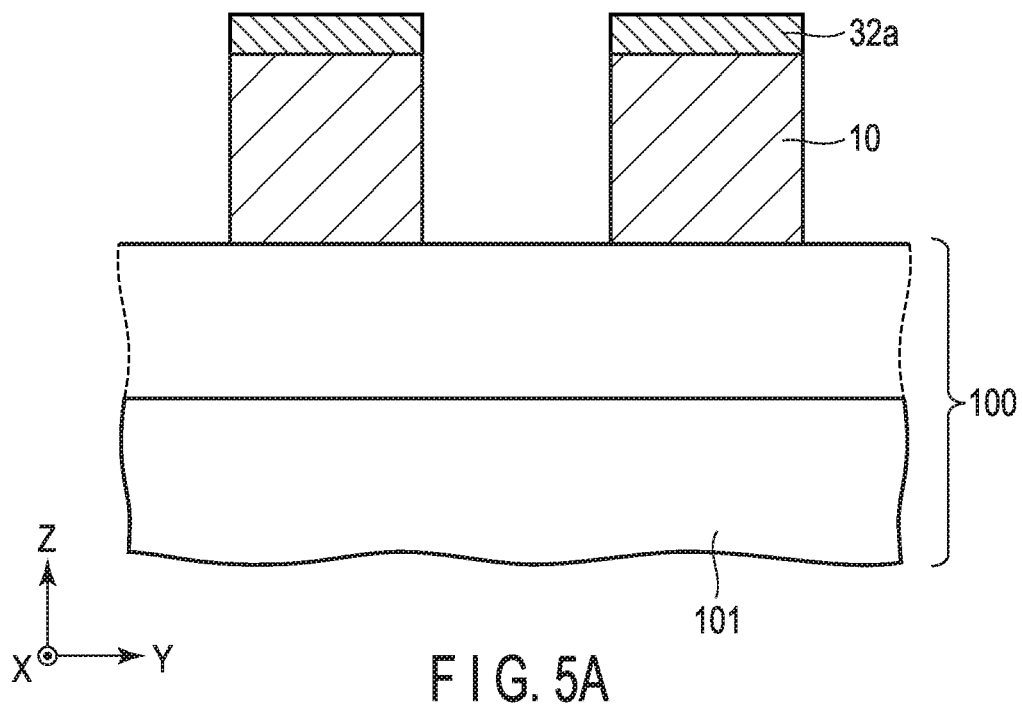
FIG. 5B is a cross-sectional view schematically showing part of the manufacturing method of the magnetic memory device according to the first embodiment.
Figure 5B:
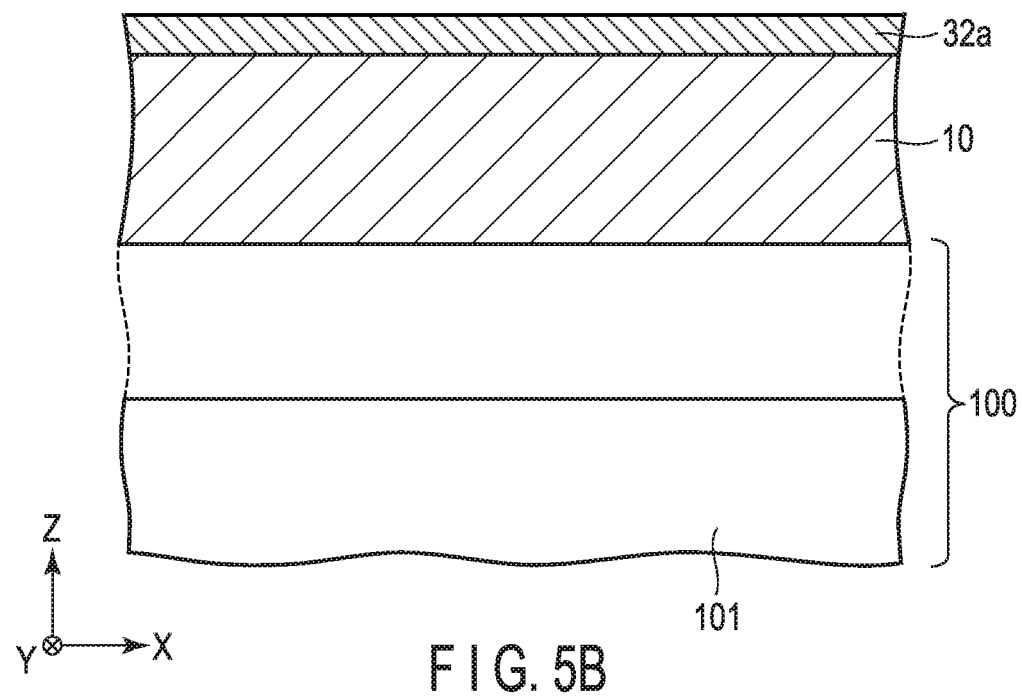

Next, as shown in FIG. 5A and FIG. 5B, the layer for the first wirings 10 and layer for the bottom electrodes 32a are linearly patterned by RIE by using a mask pattern (not shown) extending in the X direction as a mask. Furthermore, by removing the mask pattern, the pattern of the first wiring 10 and pattern of the bottom electrode 32a are obtained. In this manner, patterning of the layer for the first wirings 10 and layer for the bottom electrodes 32a is carried out by using the common mask pattern, and hence the pattern of the first wiring 10 and pattern of the bottom electrode 32a align with each other. That is, when viewed from the Z direction, the pattern of the first wiring 10 and pattern of the bottom electrode 32a coincide with each other.

Next, as shown in FIG. 6A and FIG. 6B, an interlayer insulating film 40a is formed over the entire surface and furthermore planarization is carried out by chemical mechanical polishing (CMP). Subsequently, on the planarized structure, the selector material layer 32c, layer for the top electrodes 32b, storage layer 31a, tunnel barrier layer 31c, and reference layer 31b are formed. Furthermore, a pattern of the hard mask layer 31d is formed on the reference layer 31b.

Next, as shown in FIG. 7A and FIG. 7B, the reference layer 31b, tunnel barrier layer 31c, storage layer 31a, layer for the top electrodes 32b, and selector material layer 32c are etched by damage less etching method such as ion beam etching (IBE), RIE or a combination thereof by using the pattern of the hard mask layer 31d as a mask.

Next, as shown in FIG. 8A and FIG. 8B, the sidewall insulating layer 33 is formed along the surface of the structure obtained in the step (process) of FIG. 7A and FIG. 7B. Thereby, the layers constituting the magnetoresistance effect element are protected by the sidewall insulating layer 33.

Next, as shown in FIG. 9A and FIG. 9B, the sidewall insulating layer 33 and selector material layer 32c are etched by RIE. At this time, the layers constituting the magnetoresistance effect element 31 are protected by the sidewall insulating layer 33. Further, regarding the selector, patterning of the bottom electrode 32a is already completed, and hence it is sufficient if only the selector material layer 32c is substantially etched. Accordingly, it is possible to prevent etching damage resulting from excessive etching of the sidewall insulating layer 33 to the magnetoresistance effect element 31 from occurring.

Thereafter, by forming an interlayer insulating film and the second wirings 20, the structure in which the memory cells 30 are surrounded with the interlayer insulating film 40 is obtained as shown in FIG. 2A and FIG. 2B.

As described above, according to this embodiment, in the step (process) of FIG. 5A and FIG. 5B, the layer for the first wirings 10 and layer for the bottom electrodes 32a of the selectors 32 are patterned by using the common mask pattern, and the pattern of the first wiring 10 and pattern of the bottom electrode 32a of the selector are obtained. If the layers for the selector 32 and layers for the magnetoresistance effect element 31 are formed after the pattern of the first wiring 10 is formed, in the step of FIG. 9A and FIG. 9B, it is necessary to further etch the layer for the bottom electrodes 32a of the selectors 32 in addition to the selector material layer 32c. Accordingly, the sidewall insulating layer 33 is excessively etched in the step of FIG. 9A and FIG. 9B and, there is a possibility that the magnetoresistance effect element 31 cannot securely be protected by the sidewall insulating layer 33. As a result, there is a possibility of the magnetoresistance effect element 31 being subjected to the etching damage, and the characteristics of the magnetoresistance effect element 31 being deteriorated.

In this embodiment, in the step of FIG. 5A and FIG. 5B, the pattern of the first wiring 10 and pattern of the bottom electrode 32a of the selector are formed. Accordingly, in the step of FIG. 9A and FIG. 9B, it is not necessary to etch the bottom electrode 32a of the selector 32 and, it is sufficient if only the selector material layer 32c is substantially etched. Accordingly, it is possible to securely protect the magnetoresistance effect element 31 by the sidewall insulating layer 33, and prevent the etching damage to the magnetoresistance effect element 31 from occurring. As a result, in this embodiment, it is possible to prevent deterioration in the characteristics of the magnetoresistance effect element 31 due to the etching damage from occurring, and obtain a magnetic memory device provided with magnetoresistance effect elements each having appropriate characteristics.

It should be noted that although in the examples shown in FIG. 2A and FIG. 2B, and FIGS. 4A and 4B to 9A and 9B, a case where no misalignment occurs is assumed, in the actual manufacturing steps, in general, misalignment occurs. In this embodiment, in the case of an occurrence of misalignment, as shown in FIG. 10, when viewed from the Z direction, the pattern of the magnetoresistance effect element 31 becomes misaligned in the Y direction relatively to the pattern of the first wiring 10 and pattern of the bottom electrode 32a of the selector 32. However, in this embodiment, even when misalignment occurs, the pattern of the first wiring 10 and pattern of the bottom electrode 32a align with each other and, when viewed from the Z direction, the pattern of the first wiring 10 and pattern of the bottom electrode 32a are coincident with each other.

Next, a modification example of this embodiment will be described below.

FIG. 11A and FIG. 11B, and FIG. 12A and FIG. 12B are cross-sectional views schematically showing a manufacturing method of a magnetic memory device according to this modification example. FIG. 11A and FIG. 12A are cross-sectional views in the Y direction, and FIG. 11B and FIG. 12B are cross-directional views in the X direction.

First, steps identical to the steps shown in FIGS. 4A and 4B to 6A and 6B are carried out.

Next, as shown in FIG. 11A and FIG. 11B, the reference layer 31b, tunnel barrier layer 31c, storage layer 31a, layer for the top electrodes 32b, and selector material layer 32c are etched by damage less etching method such as IBE, RIE or a combination thereof by using the pattern of the hard mask layer 31d as a mask. Although in the step of FIG. 7A and FIG. 7B of the above-described embodiment, etching of the selector material layer 32c is stopped midway, in this modification example, the selector material layer 32c is etched to the end.

Next, as shown in FIG. 12A and FIG. 12B, by forming the interlayer insulating film and second wiring 20, the structure in which memory cells 30 are surrounded with the interlayer insulating film 40 is obtained.

In this modification example, the sidewall insulating layer 33 is not formed, and hence although there is a possibility of the magnetoresistance effect element 31 being subjected to the etching damage, in this modification example too, as in the step of FIG. 5A and FIG. 5B of the above-described embodiment, the pattern of the bottom electrode 32a is formed in advance together with the pattern of the first wiring 10. Accordingly, in the step of FIG. 11A and FIG. 11B, it is not necessary to etch the bottom electrode 32a of the selector 32 as in the case of the above-described embodiment.

Accordingly, in this modification example too, it is possible to prevent the etching damage to the magnetoresistance effect element 31 from occurring. As a result, it is possible to prevent the characteristics of the magnetoresistance effect element 31 from being deteriorated by the etching damage, and obtain a magnetic memory device provided with magnetoresistance effect elements 31 each having due reliability.

Embodiment 2

Next, a second embodiment will be described below. It should be noted that the fundamental items are identical to the first embodiment, and descriptions of the items described in the first embodiment are omitted.

FIG. 13A is a cross-sectional view (cross-sectional view in the Y direction) schematically showing the configuration of a nonvolatile magnetic memory device according to the second embodiment. FIG. 13B is a cross-sectional view (cross-sectional view in the X direction) schematically showing the configuration of the nonvolatile magnetic memory device according to the second embodiment.

As shown in FIG. 13A and FIG. 13B, in this embodiment too, as in the case of the first embodiment, the bottom electrode 32a of the selector 32 included in each of the memory cells 30 adjacent to each other in the X direction is continuously provided on the first wiring 10 connecting the memory cells 30 adjacent to each other in the X direction to each other. Further, in this embodiment, the selector material layer 32c included in each of the memory cells 30 adjacent to each other in the X direction is continuously provided above and along the first wiring 10 connecting the memory cells 30 adjacent to each other in the X direction to each other. More specifically, when viewed from the Z direction, the pattern of the bottom electrode 32a continuously provided on the above-described first wiring 10 and pattern of the selector material layer 32c are both coincident with the pattern of the above-described first wiring 10.

Next, a manufacturing method of the magnetic memory device according to this embodiment will be described below with reference to FIGS. 14A and 14B to 17A and 17B. FIGS. 14A to 17A are cross-sectional views in the Y direction, and FIGS. 14B to 17B are cross-sectional views in the X direction.

First, as shown in FIG. 14A and FIG. 14B, a layer for the first wirings 10 is formed on the foundation area 100 including the semiconductor substrate 101 and, on the layer for the first wirings 10, a layer for the bottom electrodes 32a of the selectors, selector material layer 32c, and layer for the top electrodes 32b of the selectors are formed.

Next, as shown in FIG. 15A and FIG. 15B, the layer for the first wirings 10, layer for the bottom electrodes 32a, selector material layer 32c, and layer for the top electrodes 32b are linearly patterned by RIE by using a mask pattern (not shown) extending in the X direction as a mask. Furthermore, the mask pattern is then removed.

In this manner, patterning of the layer for the first wirings 10, layer for the bottom electrodes 32a, selector material layer 32c, and layer for the top electrodes 32b is carried out by using the common mask pattern, and hence the pattern of the first wiring 10, pattern of the bottom electrode 32a of the selector, pattern of the selector material layer 32c, and pattern of the top electrode 32b of the selector align with each other. That is, when viewed from the Z direction, the pattern of the first wiring 10, pattern of the bottom electrode 32a of the selector, pattern of the selector material layer 32c, and pattern of the top electrode 32b of the selector are coincident with each other.

Next, as shown in FIG. 16A and FIG. 16B, the interlayer insulating film 40a is formed over the entire surface, and furthermore, planarization is carried out by CMP. Subsequently, on the planarized structure, the storage layer 31a, tunnel barrier layer 31c, and reference layer 31b of the magnetoresistance effect element are formed. Furthermore, a pattern of the hard mask layer 31d is formed on the reference layer 31b.

Next, as shown in FIG. 17A and FIG. 17B, the reference layer 31b, tunnel barrier layer 31c, storage layer 31a, layer for the top electrodes 32b, and selector material layer 32c are etched by damage less etching method such as IBE, RIE or a combination thereof by using the pattern of the hard mask layer 31d as a mask. At this time, between the patterns adjacent to each other in the X direction, part of the selector material layer 32c remains unetched. Further, patterning of the bottom electrode 32a of the selector is already completed. Accordingly, it is possible to reduce the etching amount of the layers for the selector. Therefore, it is possible to prevent the etching damage to the magnetoresistance effect element 31 at the time of etching of the layers for the selector from occurring.

Thereafter, by forming the interlayer insulating film and second wirings 20, the structure in which the memory cells 30 are surrounded with the interlayer insulating film 40 is obtained as shown in FIG. 13A and FIG. 13B.

As described above, according to this embodiment, in the step of FIG. 15A and FIG. 15B, the layer for the first wirings 10, layer for the bottom electrodes 32a, selector material layer 32c, and layer for the top electrodes 32b are patterned by using the common mask pattern, and the pattern of the first wiring 10, pattern of the bottom electrode 32a of the selector, pattern of the selector material layer 32c, and pattern of the top electrode 32b of the selector are obtained. If the layers for the selector 32 and layers for the magnetoresistance effect element 31 are formed after the pattern of the first wiring 10 is formed, in the step of FIG. 17A and FIG. 17B, it is necessary to etch the layer for the bottom electrode 32a of the selector 32. Accordingly, the etching amount of the layers for the selector increases in FIG. 17A and FIG. 17B, and there is a possibility of the magnetoresistance effect element 31 being subjected to great etching damage, and the characteristics of the magnetoresistance effect element 31 being deteriorated.

In this embodiment, the pattern of the first wiring 10 and pattern of the bottom electrode 32a of the selector are formed in the step of FIG. 15A and FIG. 15B. Accordingly, it is possible to reduce the etching amount in FIG. 17A and FIG. 17B, and prevent the etching damage to the magnetoresistance effect element 31 from occurring. As a result, in this embodiment, it is possible to prevent deterioration in the characteristics of the magnetoresistance effect element 31 due to the etching damage from occurring, and obtain a magnetic memory device provided with magnetoresistance effect elements each having appropriate characteristics.

It should be noted that although in FIGS. 13A and 13B to 17A and 17B, a case where no misalignment occurs is assumed, in the actual manufacturing steps, in general, misalignment occurs. In this embodiment, in the case of an occurrence of misalignment, as shown in FIG. 18, when viewed from the Z direction, the pattern of the magnetoresistance effect element 31 becomes misaligned in the Y direction relatively to the pattern of the first wiring 10, and patterns of the bottom electrode 32a of the selector 32, selector material layer 32c, and top electrode 32b. However, in this embodiment, even when misalignment occurs, the pattern of the first wiring 10 and patterns of the bottom electrode 32a of the selector 32 and selector material layer 32c align with each other and, when viewed from the Z direction, the pattern of the first wiring 10 and patterns of the bottom electrode 32a of the selector 32 and selector material layer 32c are coincident with each other.

Next, a first modification example of this embodiment will be described below with reference to the cross-sectional view (cross-sectional view in the X direction) shown in FIG. 19.

Although in the above-described embodiment, the selector material layer 32c is continuously provided in the area between the memory cells 30 adjacent to each other in the X direction as shown in FIG. 13B, in this modification example, the selector material layer 32c is divided into sections in the area between the memory cells 30 adjacent to each other in the X direction. In the step of FIG. 17A and FIG. 17B, by carrying out etching until the selector material layer 32c is divided into sections, the configuration shown in FIG. 19 is obtained.

The selector material layer 32c is higher in the insulating properties to a certain degree, and hence even when the selector material layer 32c is continuously provided between the adjacent memory cells 30, basically a large problem does not arise, however, there is a possibility that slight mutual interference occurs between the selectors 32 of the adjacent memory cells 30. In this modification example, by virtue of the above-mentioned configuration, it is possible to securely prevent mutual interference between the selectors 32 of the memory cells adjacent to each other from occurring.

Next, a second modification example of this embodiment will be described below with reference to the cross-sectional view (cross-sectional, view in the X direction) shown in FIG. 20.

In this modification example, the selector material layer 32c is formed of a material constituted of an insulant, is formed of silicon oxide containing therein a group 15 element (at least one element selected from a group of, for example, arsenic (As), antimony (Sb), and phosphorus (P)) introduced by ion implantation and, at a part 32cx thereof between the memory cells 30 adjacent to each other in the X direction, further contains therein a group 13 element (at least one element selected from a group of, for example, boron (B) and gallium (Ga)). That is, at the part 32cx between the memory cells 30 adjacent to each other in the X direction, the selector material layer 32c is formed of silicon oxide containing therein a group 15 element and group 13 element.

After the step of FIG. 17A and FIG. 17B, by ion-implanting the group 13 element into the selector material layer 32c at the part between the adjacent memory cells 30, the configuration shown in FIG. 20 is obtained.

In the area into which the group 13 element is introduced, the action of the group 15 element is cancelled out by the group 13 element, and hence it is possible to enhance the insulating properties of the selector material layer 32c. Accordingly, in this modification example, by virtue of the above-described configuration, it is possible to securely prevent the mutual interference between the selectors 32 of the adjacent memory cells 30.

Next, a third modification example of this embodiment will be described below.

FIGS. 21A and 21B to 28A and 28B are cross-sectional views schematically showing a manufacturing method of a magnetic memory device according to the third modification example. FIGS. 21A to 28A are cross-sectional views in the Y direction, and FIGS. 21B to 28B are cross-sectional views in the X direction.

First, as shown in FIG. 21A and FIG. 21B, a layer for the first wirings 10 and layer for the selectors (layer for the bottom electrodes 32a, selector material layer 32c, and layer for the top electrodes 32b) are formed on the foundation area 100 including the semiconductor substrate 101.

Next, as shown in FIG. 22A and FIG. 22B, the layer for the selectors (layer for the bottom electrodes 32a, selector material layer 32c, and layer for the top electrodes 32b) are linearly patterned by RIE by using a mask pattern 35 extending in the X direction as a mask.

Next, as shown in FIG. 23A and FIG. 23B, a silicon nitride layer, etc., is formed over the entire surface as the sidewall insulating layer 36. Subsequently, part of the sidewall insulating layer 36 is removed by RIE and the sidewall insulating layer 36 is made to remain unremoved only on the sidewall of the pattern for the selector.

Next, as shown in FIG. 24A and FIG. 24B, the layer for the first wiring 10 is etched by RIE by using the pattern obtained by the step of FIGS. 23A and 23B as a mask, whereby the pattern of the first wiring 10 is formed.

Next, as shown in FIG. 25A and FIG. 25B, an interlayer insulating film 40a is formed over the entire surface and, by further carrying out planarization processing, the mask pattern 35 is removed.

Next, as shown in FIG. 26A and FIG. 26B, on the planarized structure obtained by the step of FIG. 25A and FIG. 25B, the storage layer 31a, tunnel barrier layer 31c, and reference layer 31b of the magnetoresistance effect element are formed. Furthermore, a pattern of a hard mask layer 31d is formed on the reference layer 31b.

Next, as shown in FIG. 27A and FIG. 27B, the reference layer 31b, tunnel barrier layer 31c, storage layer 31a, layer for the top electrodes 32b, and selector material layer 32c are etched by damage less etching method such as IBE, RIE or a combination thereof by using the pattern of the hard mask layer 31d as a mask. At this time, in the area between the patterns adjacent to each other in the X direction, part of the selector material layer 32c is left unetched (remains unetched). Further, patterning of the bottom electrode 32a of the selector is already completed. Accordingly, it is possible to reduce the etching amount of the layers for the selector. Therefore, it is possible to prevent the etching damage to the magnetoresistance effect element 31 from occurring at the time of etching of the layers for the selector.

Thereafter, by forming the interlayer insulating film and second wirings 20, the structure in which the memory cells 30 are surrounded with the interlayer insulating film 40 can be obtained as shown in FIG. 28A and FIG. 28B.

In this modification example too, as in the case of the above-described embodiment, it is possible to prevent the etching damage to the magnetoresistance effect element 31 from occurring, and prevent deterioration in the characteristics of the magnetoresistance effect element 31 due to the etching damage from occurring.

Embodiment 3

Next, a third embodiment will be described below. It should be noted that the fundamental items are identical to the first and second embodiments, and descriptions of the items described in the first and second embodiments are omitted.

FIG. 29A is a cross-sectional view (cross-sectional view in the Y direction) schematically showing the configuration of a nonvolatile magnetic memory device according to the third embodiment. FIG. 29B is a cross-sectional view (cross-sectional view in the X direction) schematically showing the configuration of the nonvolatile magnetic memory device according to the third embodiment.

The magnetic memory device of this embodiment has a structure in which a plurality of memory cells is provided in the Z direction. In the example shown in FIG. 29A and FIG. 29B, a structure in which two layers of memory cells are provided is shown. The fundamental configuration of each of the first layer and second layer is identical to the configuration shown in the first embodiment or second embodiment.

In this embodiment, in addition to the plurality of first wirings 10 extending in the X direction and plurality of second wirings 20 extending in the Y direction, furthermore a plurality of third wirings 50 extending in the X direction is provided. Between each of the plurality of second wirings 20 and each of the plurality of third wirings 50, each one of a plurality of memory cells 60 is provided. The memory cells 60 and the like are surrounded with an interlayer insulating film 70.

The memory cell 60 includes a magnetoresistance effect element 61 and selector (switching element) 62 connected to each other in series. One end of the magnetoresistance effect element 61 is connected to the third wiring 50, and the other end of the magnetoresistance effect element 61 is connected to the selector 62. One end of the selector 62 is connected to the second wiring 20, and the other end of the selector 62 is connected to the magnetoresistance effect element 61.

The fundamental configuration of the magnetoresistance effect element 61 is identical to the configuration of the magnetoresistance effect element 31 shown in the first and second embodiments, and includes a storage layer 61a, reference layer 61b, and tunnel barrier layer 61c provided between the storage layer 61a and reference layer 61b. On the reference layer 61b, a hard mash layer 61d is provided. In the magnetoresistance effect element 61, a shift cancelling layer for cancelling a magnetic field to be applied from the reference layer 61b to the storage layer 61a may further be provided.

Also the fundamental configuration of the selector 62 is identical to the configuration of the selector 32 shown in the first and second embodiments, and includes a bottom electrode 62a provided on the second wiring 20 side, top electrode 62b provided on the magnetoresistance effect element 61 side, and selector material layer (switching material layer) 62c provided between the bottom electrode 62a and top electrode 62b.

As shown in FIG. 29A and FIG. 29B, the bottom electrode 62a of the selector 62 included in each of the memory cells 60 adjacent to each other in the Y direction is continuously provided on the second wiring 20 connecting the memory cells adjacent to each other in the Y direction to each other. More specifically, when viewed from the Z direction, the pattern of the bottom electrode 62a continuously provided on the above-described second wiring 20 is coincident with the pattern of the above-described second wiring 20.

Next, a manufacturing method of the magnetic memory device according to this embodiment will be described below with reference to FIGS. 30A and 30B to 33A and 33B, and FIGS. 29A and 29B.

First, as shown in FIG. 30A and FIG. 30B, steps identical to the steps of FIGS. 14A and 14B to 17A and 17B are carried out, whereby a structure identical to the structure shown in FIG. 17A and FIG. 17B is formed. Subsequently, after the interlayer insulating film 40 is formed, a layer for the second wirings 20 is formed over the entire surface, and then a layer for the bottom electrodes 62a, selector material layer 62c, and layer for the top electrodes 62b of the selectors are formed on the layer for the second wirings 20.

Next, as shown in FIG. 31A and FIG. 31B, the layer for the second wirings 20, layer for the bottom electrodes 62a, selector material layer 62c, and layer for the top electrodes 62b are linearly patterned by RIE by using a mask pattern (not shown) extending in the Y direction as a mask. Furthermore, the mask pattern is removed.

As described above, patterning of the layer for the second wirings 20, layer for the bottom electrodes 62a, selector material layer 62c, and layer for the top electrodes 62b is carried out by using the common mask pattern, and hence the pattern of the second wiring 20, pattern of the bottom electrode 62a of the selector, pattern of the selector material layer 62c, and pattern of the top electrode 62b of the selector align with each other. That is, when viewed from the Z direction, the pattern of the second wiring 20, pattern of the bottom electrode 62a of the selector, pattern of the selector material layer 62c, and pattern of the top electrode 62b of the selector are coincident with each other.

Next, as shown in FIG. 32A and FIG. 32B, an interlayer insulating film 70a is formed over the entire surface, and planarization is further carried out by CMP. Subsequently, on the planarized structure, the storage layer 61a, tunnel barrier layer 61c, and reference layer 61b of the magnetoresistance effect element are formed. Furthermore, a pattern of a hard mask layer 61d is formed on the reference layer 61b.

Next, as shown in FIG. 33A and FIG. 33B, the reference layer 61b, tunnel barrier layer 61c, storage layer 61a, layer for the top electrodes 62b, and selector material layer 62c are etched by damage less etching method such as IBE, RIE or a combination thereof by using the pattern of the hard mask layer 61d as a mask. At this time, between the patterns adjacent to each other in the Y direction, part of the selector material layer 62c is left unetched (remains unetched). Further, patterning of the bottom electrode 62a of the selector is already completed. Accordingly, it is possible to reduce the etching amount of the layers for the selector. Therefore, it is possible to prevent the etching damage to the magnetoresistance effect element 61 from occurring at the time of etching of the layers for the selector.

Thereafter, by forming the interlayer insulating film and third wirings 50, the structure in which the memory cells 60 are surrounded with the interlayer insulating film 70 can be obtained as shown in FIG. 29A and FIG. 29B.

As described above, in this embodiment too, as in the cases of the first and second embodiments, it is possible to prevent the etching damage to the magnetoresistance effect element 61 from occurring. As a result, in this embodiment too, it is possible to prevent, deterioration in the characteristics of the magnetoresistance effect element 61 due to the etching damage from occurring, and obtain a magnetic memory device provided with magnetoresistance effect elements each having appropriate characteristics.

It should be noted that although in FIG. 29A and FIG. 29B, FIGS. 30A and 30B to 33A and 33B, a case where no misalignment occurs is assumed, in the actual manufacturing steps, in general, misalignment occurs.

In this embodiment, in the case of an occurrence of misalignment, as shown in FIG. 34A, when viewed from the Z direction, the pattern of the magnetoresistance effect element 31 becomes misaligned in the Y direction relatively to the pattern of the first wiring 10 and patterns of the bottom electrode 32a, selector material layer 32c, and top electrode 32b of the selector 32. However, in this embodiment, even when misalignment occurs, the pattern of the first wiring 10 and patterns of the bottom electrode 32a and selector material layer 32c of the selector 32 align with each other and, when viewed from the Z direction, the pattern of the first wiring 10 and patterns of the bottom electrode 32a and selector material layer 32c of the selector 32 are coincident with each other.

Further, in this embodiment, in the case of an occurrence of misalignment, as shown in FIG. 34B, when viewed from the Z direction, the pattern of the magnetoresistance effect element 61 becomes misaligned in the X direction relatively to the pattern of the second wiring 20 and patterns of the bottom electrode 62a, selector material layer 62c, and top electrode 62b of the selector 62. However, in this embodiment, even when misalignment occurs, the pattern of the second wiring 20 and patterns of the bottom electrode 62a and selector material layer 62c of the selector 62 align with each other and, when viewed from the Z direction, the pattern of the second wiring 20 and patterns of the bottom electrode 62a and selector material layer 62c of the selector 62 are coincident with each other.

It should be noted that although in the above-described embodiment, the structure having two layers of memory cells has been described, a structure having three or more layers of memory cells may also be formed by a method identical to the above-described embodiment.

By employing the structures described in the first and second embodiments or by employing the structure formed by combining the structures described in the first and second embodiments with each other, a magnetic memory device having a structure in which a plurality of memory cells is provided in the Z direction may also be formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetic memory device comprising:
a plurality of first wirings each extending in a first direction;
a plurality of second wirings each extending in a second direction intersecting the first direction;
a plurality of first memory cells provided between the plurality of first wirings and the plurality of second wirings, each of the plurality of first memory cells including a first switching element and a first magnetoresistance effect element connected in series to each other, the first switching element being connected to a corresponding first wiring of the plurality of first wirings, and the first magnetoresistance effect element being connected to a corresponding second wiring of the plurality of second wirings; and an interlayer insulating film, wherein:

the first switching element includes a first bottom electrode provided on a first wiring side, a first top electrode provided on a first magnetoresistance effect element side, and a first switching material layer provided between the first bottom electrode and the first top electrode, the first bottom electrode included in each of the first memory cells adjacent to each other in the first direction is continuously provided on the corresponding first wiring connecting the first memory cells adjacent to each other in the first direction, the first memory cell further includes a sidewall insulating layer provided on sidewalls of the first top electrode and the first switching material layer of the first switching element, the interlayer insulating film is provided directly on an entire side surface of the sidewall insulating layer, the sidewall insulating layer is further provided on a sidewall of the first magnetoresistance effect element, and the sidewall insulating layer is not provided on a sidewall of the first bottom electrode of the first switching element, and the interlayer insulating film is provided on the sidewall of the first bottom electrode of the first switching element.

2. The magnetic memory device of claim 1, wherein when viewed from a third direction intersecting the first and second directions, a pattern of the first bottom electrode continuously provided on the corresponding first wiring connecting the first memory cells adjacent to each other in the first direction is coincident with a pattern of the corresponding first wiring connecting the first memory cells adjacent to each other in the first direction.

3. The magnetic memory device of claim 1, wherein when viewed from a third direction intersecting the first and second directions, a pattern of the first magnetoresistance effect element included in an arbitrary first memory cell is misaligned in the second direction relative to a pattern of the first bottom electrode of the first switching element included in the arbitrary first memory cell.

4. The magnetic memory device of claim 1, wherein the first switching material layers included in the first memory cells adjacent to each other in the first direction are separate from each other in an area between the first memory cells adjacent to each other in the first direction.

5. The magnetic memory device of claim 1, wherein the first switching element exhibits a high-resistance state when a voltage applied between two terminals thereof is less than a threshold, and exhibits a low-resistance state when a voltage applied between the two terminals thereof is greater than or equal to the threshold.

6. The magnetic memory device of claim 1, wherein the first switching element comprises a two-terminal type switching element and includes no electrode other than the first bottom electrode and the first top electrode.

7. The magnetic memory device of claim 1, wherein the first switching material layer of the first switching element is formed of an insulating material.

8. A magnetic memory device comprising:

a plurality of first wirings each extending in a first direction;

a plurality of second wirings each extending in a second direction intersecting the first direction;

a plurality of first memory cells provided between the plurality of first wirings and the plurality of second wirings, each of the plurality of first memory cells including a first switching element and a first magnetoresistance effect element connected in series to each other, the first switching element being connected to a corresponding first wiring of the plurality of first wirings, and the first magnetoresistance effect element being connected to a corresponding second wiring of the plurality of second wirings; and an interlayer insulating film, wherein:

the first switching element includes a first bottom electrode provided on a first wiring side, a first top electrode provided on a first magnetoresistance effect element side, and a first switching material layer provided between the first bottom electrode and the first top electrode, the first bottom electrode included in each of the first memory cells adjacent to each other in the first direction is continuously provided on the corresponding first wiring connecting the first memory cells adjacent to each other in the first direction, the first memory cell further includes a sidewall insulating layer provided on sidewalls of the first top electrode and the first switching material layer of the first switching element, the interlayer insulating film is provided directly on an entire side surface of the sidewall insulating layer, the first switching material layer included in each of the first memory cells adjacent to each other in the first direction is continuously provided above the corresponding first wiring connecting the first memory cells adjacent to each other in the first direction, the sidewall insulating layer is further provided on a sidewall of the first bottom electrode of the first switching element, and the sidewall insulating layer is not provided on a sidewall of the first magnetoresistance effect element, and the interlayer insulating film is provided on the sidewall of the first magnetoresistance effect element.

9. The magnetic memory device of claim 8, wherein when viewed from a third direction intersecting the first and second directions, a pattern of the first bottom electrode continuously provided on the corresponding first wiring connecting the first memory cells adjacent to each other in the first direction is coincident with a pattern of the corresponding first wiring connecting the first memory cells adjacent to each other in the first direction.

10. The magnetic memory device of claim 8, wherein when viewed from a third direction intersecting the first and second directions, a pattern of the first switching material layer continuously provided above the corresponding first wiring connecting the first memory cells adjacent to each other in the first direction is coincident with a pattern of the corresponding first wiring connecting the first memory cells adjacent to each other in the first direction.

11. The magnetic memory device of claim 8, wherein the first switching material layer continuously provided above the corresponding first wiring connecting the first memory cells adjacent to each other in the first direction is formed of silicon oxide containing a group 15 element and further contains a group 13 element at a part between the first memory cells adjacent to each other in the first direction.

12. The magnetic memory device of claim 8, wherein the first switching element exhibits a high-resistance state when a voltage applied between two terminals thereof is less than a threshold, and exhibits a low-resistance state when a voltage applied between the two terminals thereof is greater than or equal to the threshold.

13. The magnetic memory device of claim 8, wherein the first switching element comprises a two-terminal type switching element and includes no electrode other than the first bottom electrode and the first top electrode.

14. The magnetic memory device of claim 8, wherein the first switching material layer of the first switching element is formed of an insulating material.

* * * * *